United States Patent
Kim et al.

(10) Patent No.: US 12,046,185 B2
(45) Date of Patent: Jul. 23, 2024

(54) DISPLAY APPARATUS

(71) Applicants: SAMSUNG ELECTRONICS CO., LTD., Suwon-si (KR); RESEARCH & BUSINESS FOUNDATION SUNGKYUNKWAN UNIVERSITY, Suwon-si (KR)

(72) Inventors: Jinho Kim, Suwon-si (KR); Yong-Sang Kim, Suwon-si (KR); Donggun Oh, Suwon-si (KR); Eun Kyo Jung, Suwon-si (KR); Jungwoo Lee, Suwon-si (KR)

(73) Assignees: SAMSUNG ELECTRONICS CO., LTD., Suwon-si (KR); RESEARCH & BUSINESS FOUNDATION UNIVERSITY, Suwon-si (KR)

( * ) Notice: Subject to any disclaimer, the term of this patent is extended or adjusted under 35 U.S.C. 154(b) by 0 days.

(21) Appl. No.: 18/120,267

(22) Filed: Mar. 10, 2023

(65) Prior Publication Data

US 2023/0206827 A1 Jun. 29, 2023

Related U.S. Application Data

(63) Continuation of application No. PCT/KR2021/013555, filed on Oct. 5, 2021.

(30) Foreign Application Priority Data

Oct. 20, 2020 (KR) .......... 10-2020-0136188
Aug. 27, 2021 (KR) .......... 10-2021-0114208

(51) Int. Cl.
*G09G 3/32* (2016.01)
*H03K 7/08* (2006.01)

(52) U.S. Cl.
CPC .......... *G09G 3/32* (2013.01); *G09G 2300/026* (2013.01); *G09G 2300/0861* (2013.01);
(Continued)

(58) Field of Classification Search
CPC ............... G09G 3/32; G09G 2300/026; G09G 2300/0861; G09G 2310/0267;
(Continued)

(56) References Cited

U.S. PATENT DOCUMENTS 7,965,272 B2  6/2011  Eom
9,064,592 B2  6/2015  Shang et al.
(Continued)

FOREIGN PATENT DOCUMENTS

JP  2008-46581 A   2/2008
JP  2013-142868 A  7/2013
(Continued)

OTHER PUBLICATIONS

International Search Report (PCT/ISA/210) issued by the International Searching Authority on Jan. 25, 2022 in International Application No. PCT/KR2021/013555.
(Continued)

*Primary Examiner* — Michael A Faragalla
(74) *Attorney, Agent, or Firm* — Sughrue Mion, PLLC

(57) ABSTRACT

A display apparatus includes: a modular display panel including a plurality of display modules; and a timing controller. Each of the plurality of display modules includes: a display panel including a pixel array and subpixel circuits; and a driving unit which drives the subpixel circuits such that inorganic light-emitting elements in the pixel array successively emit light in a first order of multiple row lines or in a second order opposite to the first order. The timing controller provides the driving unit of a first display module with first control signals for causing the inorganic light-
(Continued)

emitting elements of the first display module to emit light in the first order, and provides the driving unit of a second display module, which is positioned above or below the first display module, with second control signals for causing the inorganic light-emitting elements of the second display module to emit light in the second order.

20 Claims, 57 Drawing Sheets

(52) U.S. Cl.
CPC . *G09G 2310/0267* (2013.01); *G09G 2310/08* (2013.01); *G09G 2320/0209* (2013.01); *G09G 2320/0233* (2013.01); *G09G 2330/021* (2013.01); *H03K 7/08* (2013.01)

(58) Field of Classification Search
CPC ....... G09G 2310/08; G09G 2320/0209; G09G 2320/0233; G09G 2330/021; G09G 5/00; G09G 5/12; G09G 5/10; H03K 7/08; G06F 3/14; G06F 3/36; G06F 3/20
See application file for complete search history.

(56) References Cited

U.S. PATENT DOCUMENTS

| | | |
|---|---|---|
| 9,147,496 B2 | 9/2015 | Abe et al. |
| 9,484,111 B2 | 11/2016 | Xiao |
| 9,489,879 B2 | 11/2016 | Abe et al. |
| 9,514,690 B2 | 12/2016 | Kim et al. |
| 9,842,558 B2 | 12/2017 | Abe et al. |
| 10,147,377 B2 | 12/2018 | Abe et al. |
| 10,643,563 B2 | 5/2020 | Abe et al. |
| 10,832,615 B2 | 11/2020 | Kim et al. |
| 11,056,047 B2 | 7/2021 | Shigeta et al. |
| 11,398,181 B2 | 7/2022 | Kim et al. |
| 2006/0097966 A1 | 5/2006 | Choi |
| 2008/0170009 A1 | 7/2008 | Eom |
| 2011/0141003 A1 | 6/2011 | Kim et al. |
| 2012/0306844 A1 | 12/2012 | Abe et al. |
| 2013/0100181 A1* | 4/2013 | Choe .................. G09G 3/3666 345/691 |
| 2014/0072093 A1 | 3/2014 | Shang et al. |
| 2014/0176616 A1 | 6/2014 | Gu et al. |
| 2015/0346844 A1 | 12/2015 | Abe et al. |
| 2016/0180812 A1 | 6/2016 | Choi et al. |
| 2016/0189649 A1 | 6/2016 | Xiao |
| 2016/0372047 A1 | 12/2016 | Kim et al. |
| 2017/0053614 A1 | 2/2017 | Abe et al. |
| 2018/0060014 A1 | 3/2018 | Son et al. |
| 2018/0068631 A1 | 3/2018 | Abe et al. |
| 2018/0182278 A1 | 6/2018 | Kim et al. |
| 2019/0043916 A1* | 2/2019 | Shin .................. H01L 27/156 |
| 2019/0066618 A1 | 2/2019 | Abe et al. |
| 2019/0371232 A1 | 12/2019 | Kim et al. |
| 2020/0265777 A1 | 8/2020 | Shigeta et al. |
| 2021/0210003 A1 | 7/2021 | Kim et al. |
| 2021/0304670 A1 | 9/2021 | Shigeta et al. |

FOREIGN PATENT DOCUMENTS

| | | |
|---|---|---|
| JP | 5774911 B2 | 9/2015 |
| KR | 10-1325314 B1 | 11/2013 |
| KR | 10-1564818 B1 | 10/2015 |
| KR | 10-2016-0148790 A | 12/2016 |
| KR | 10-2018-0023402 A | 3/2018 |
| KR | 10-2019-0137658 A | 12/2019 |
| KR | 10-2080730 B1 | 4/2020 |
| KR | 10-2020-0101605 A | 8/2020 |
| KR | 10-2021-0087867 A | 7/2021 |

OTHER PUBLICATIONS

Written Opinion (PCT/ISA/237) issued by the International Searching Authority on Jan. 25, 2022 in International Application No. PCT/KR2021/013555.

Communication issued Nov. 15, 2023 by the European Patent Office in European Patent Application No. 21883060.2.

\* cited by examiner

1000

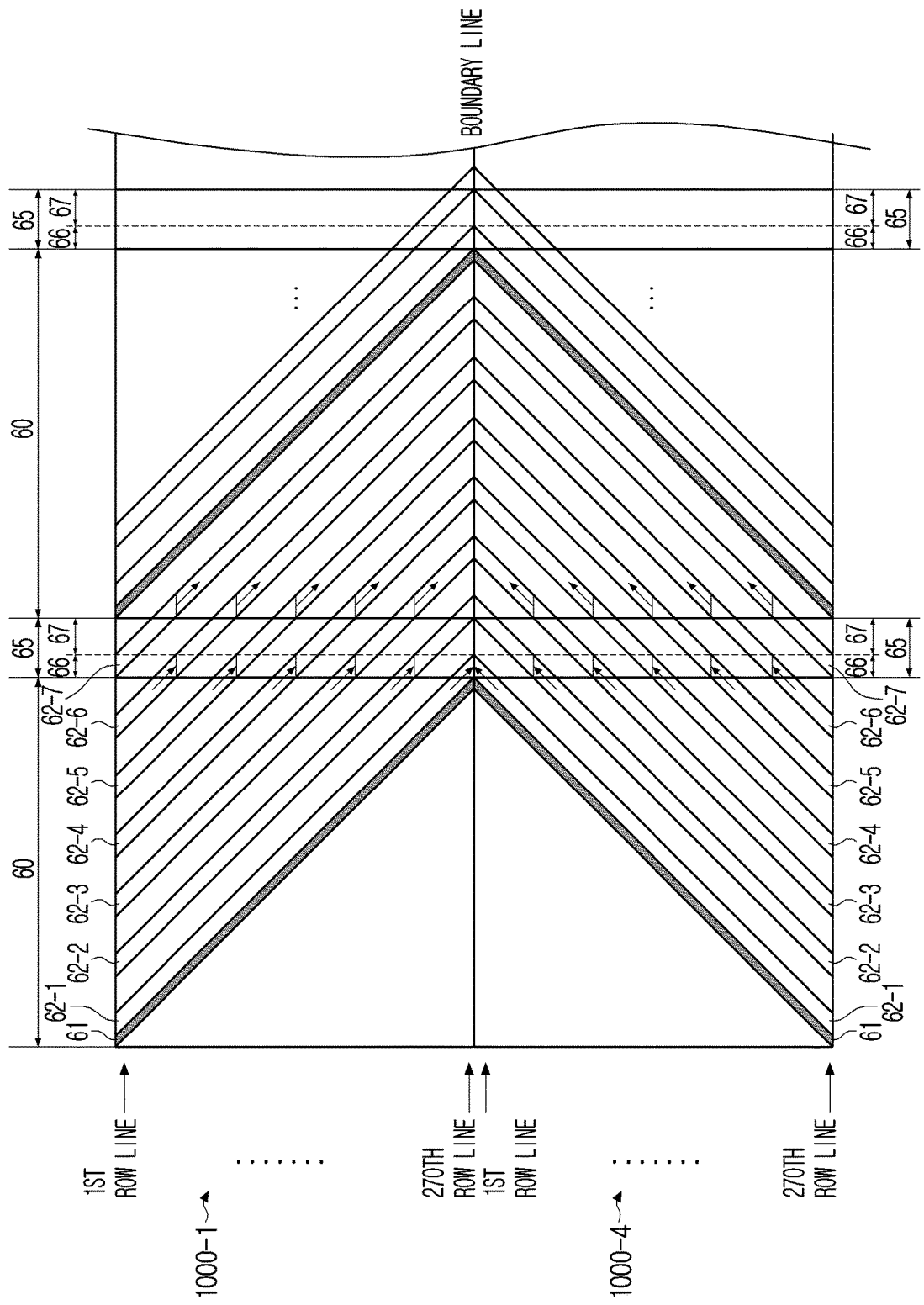

FIG. 17C
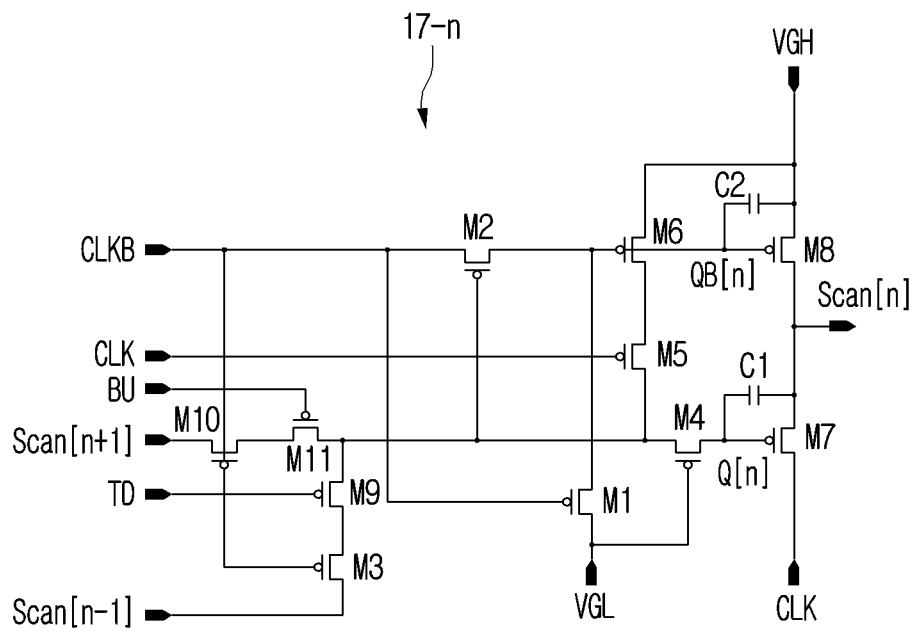
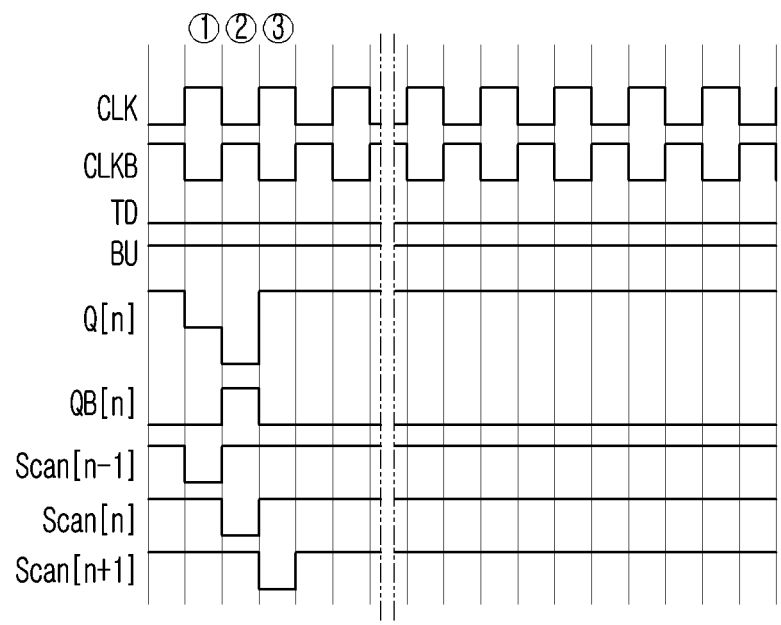

FIG. 17D
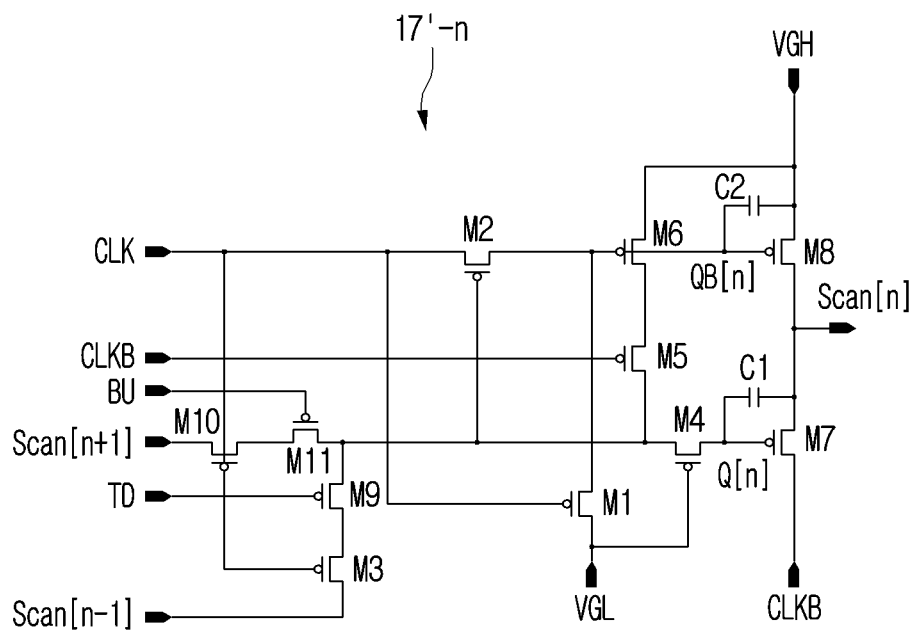
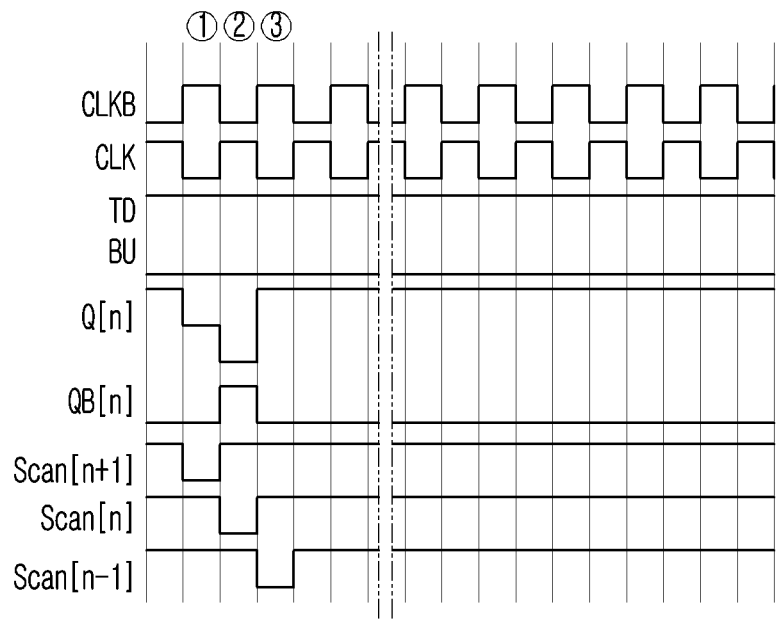

FIG. 18C
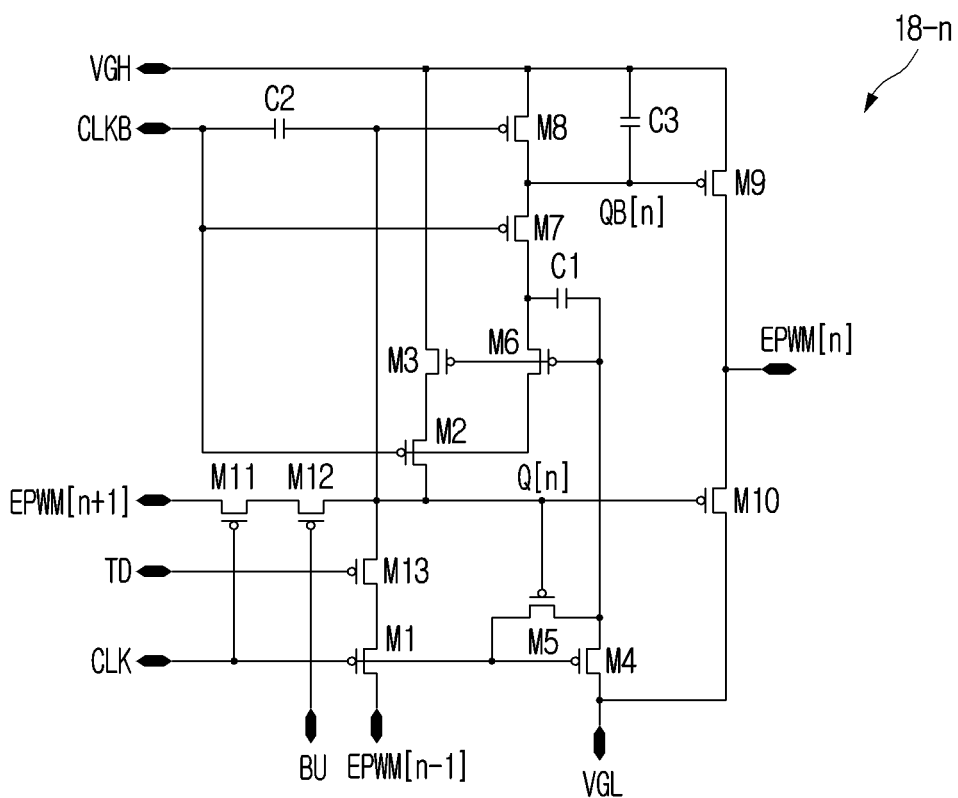
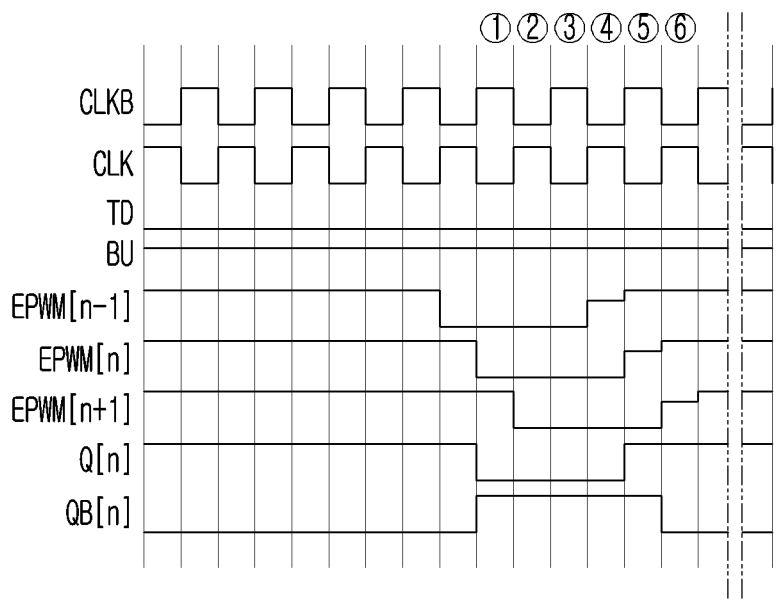

FIG. 18D
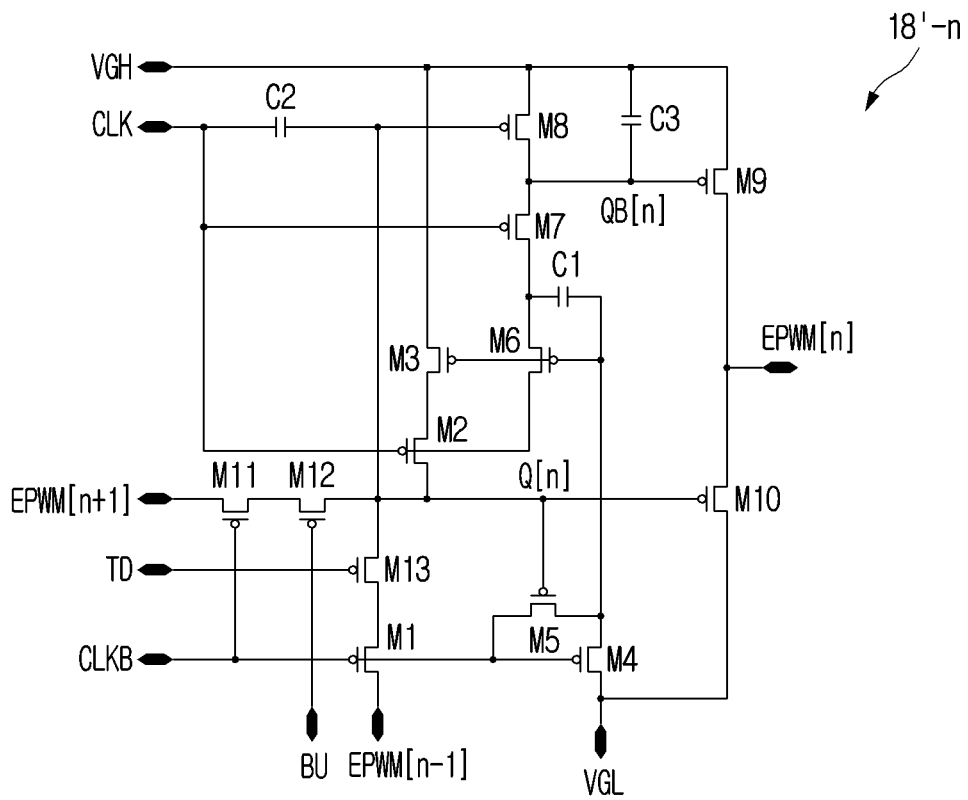
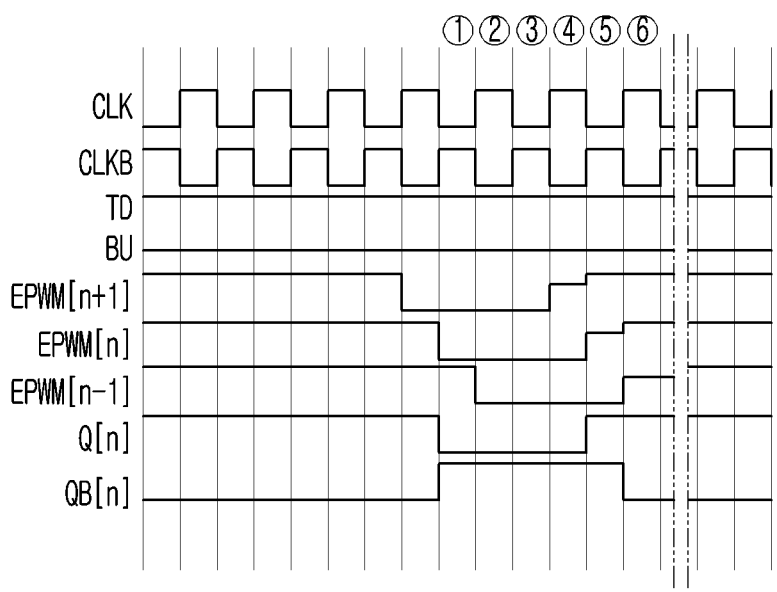

FIG. 19C
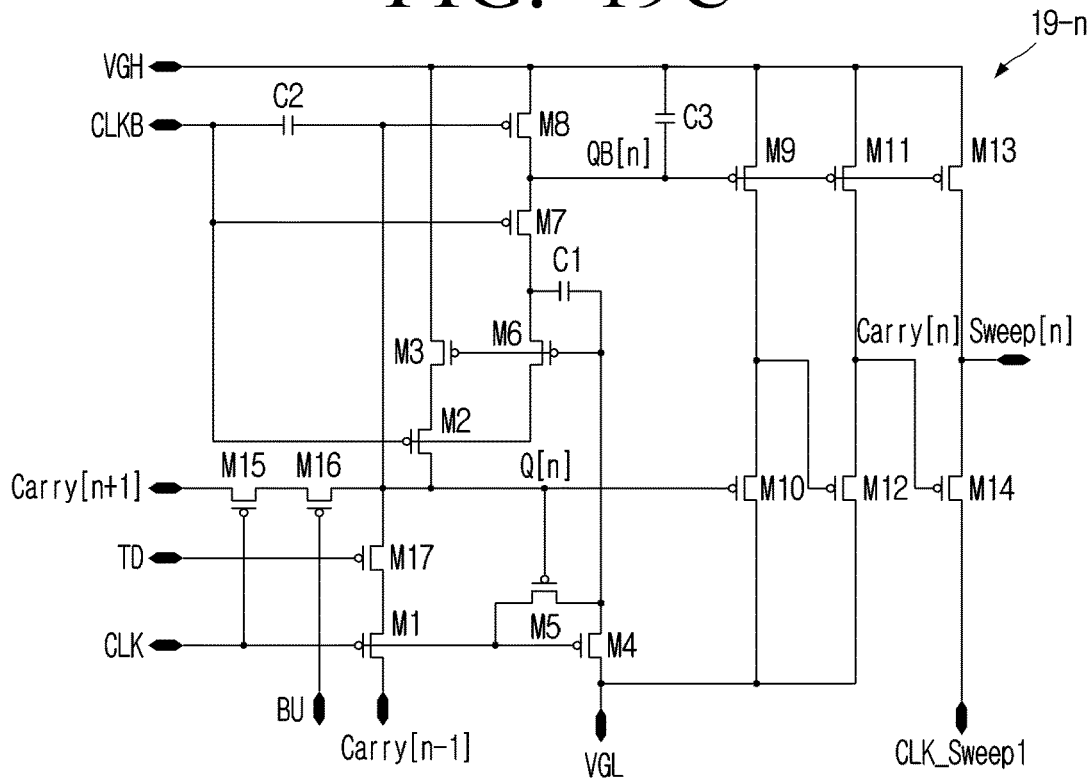
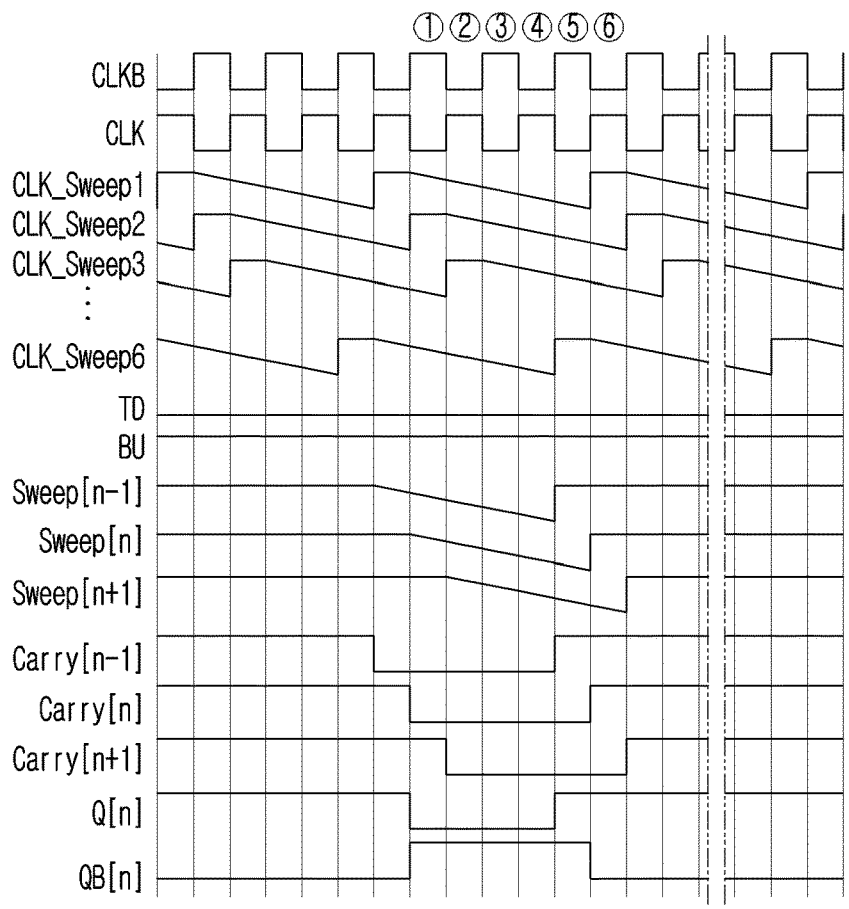

FIG. 19D
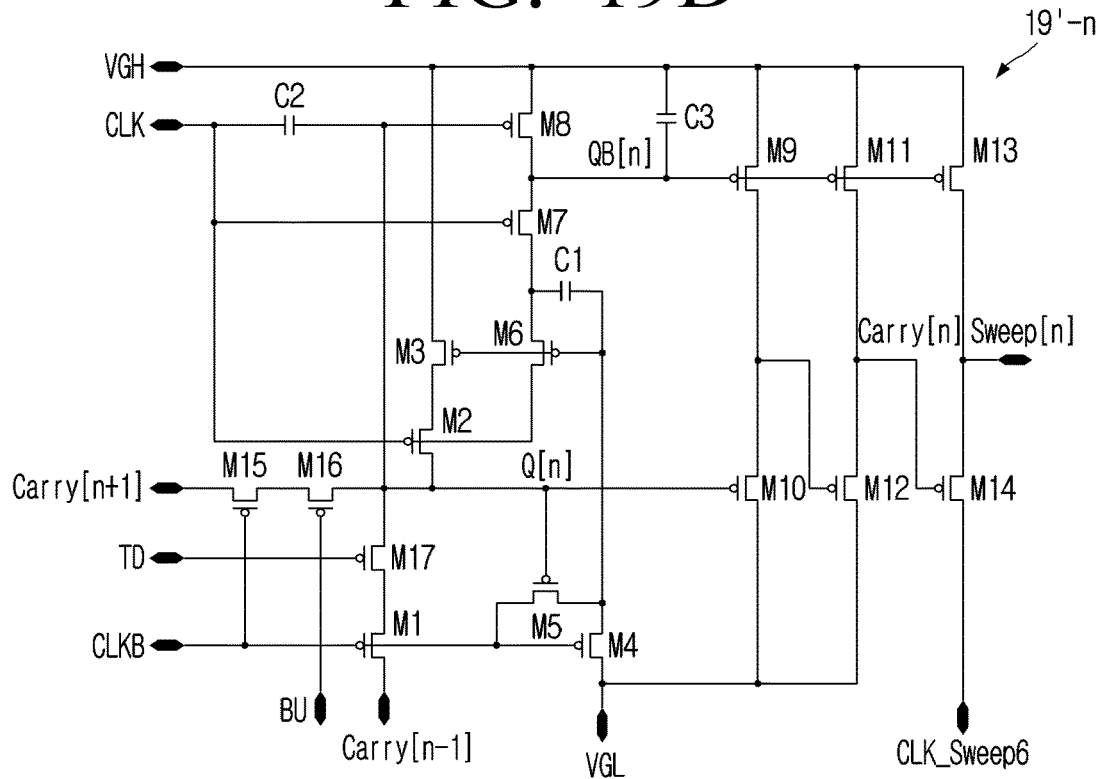
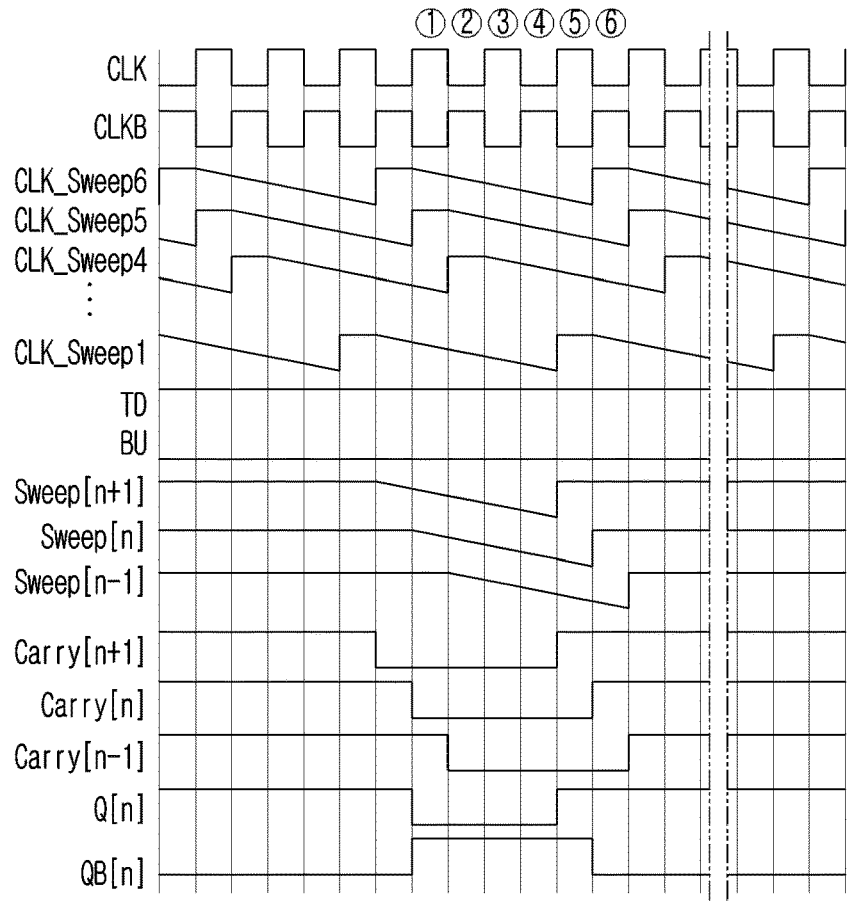

FIG. 20C
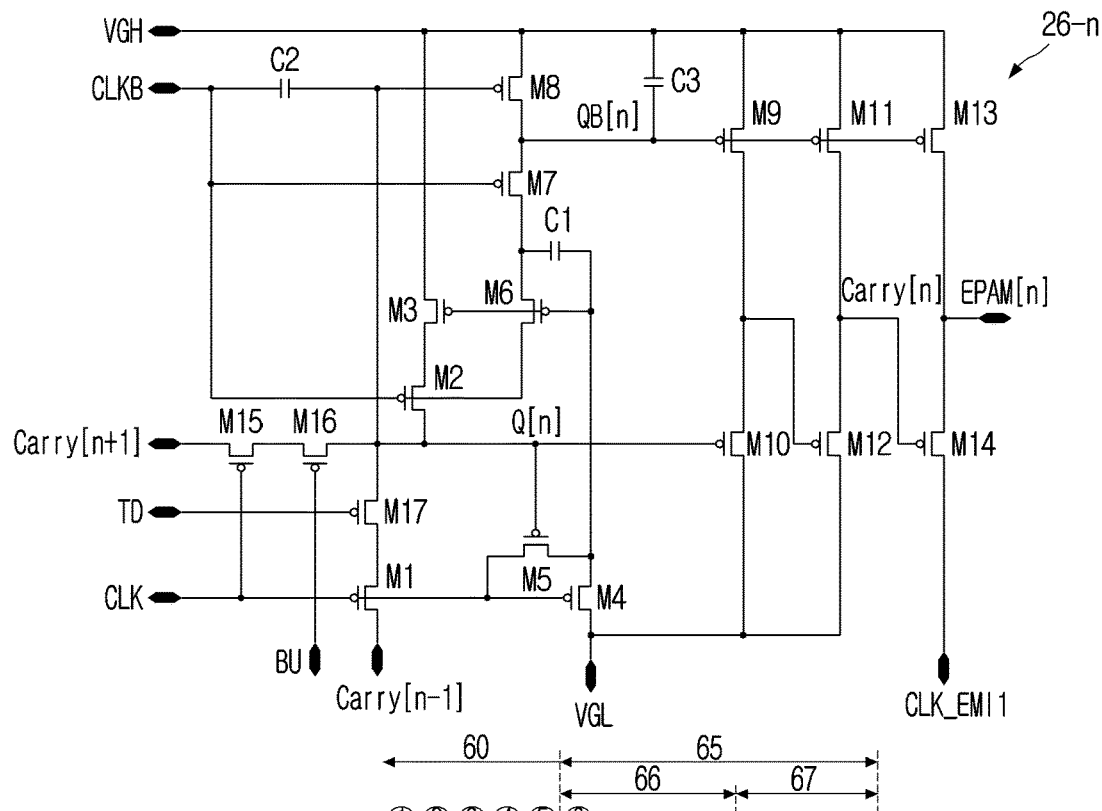
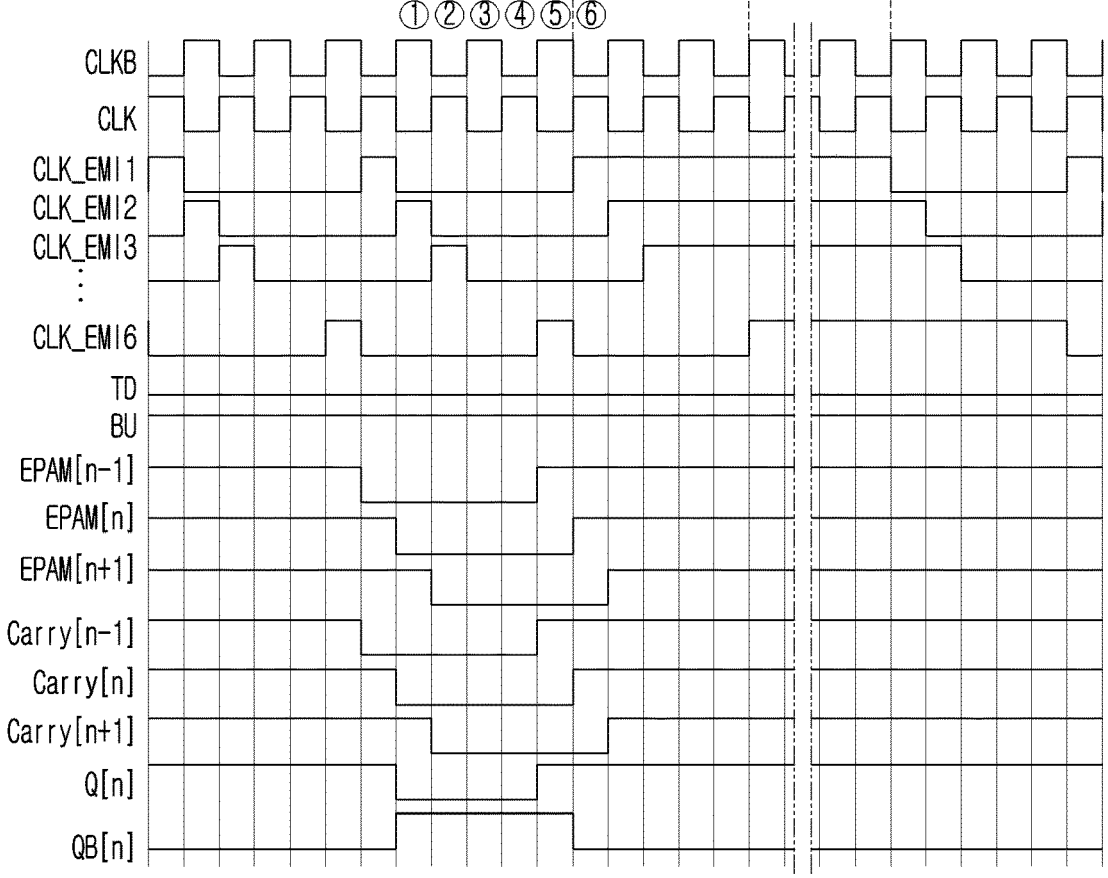

FIG. 20D
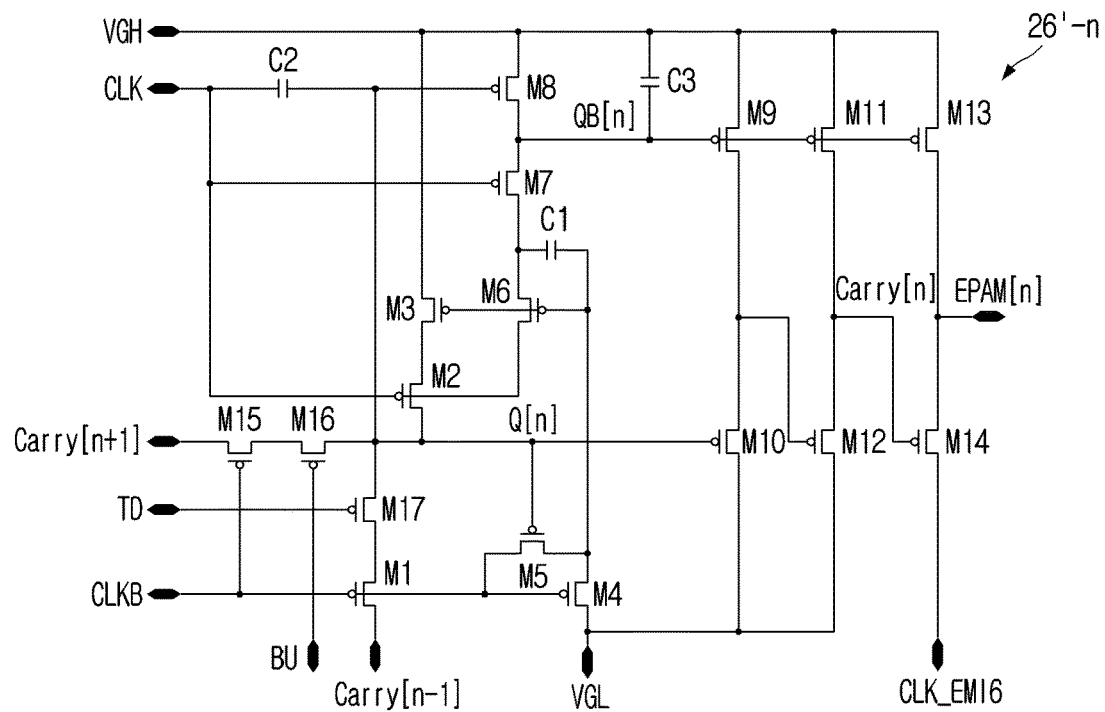
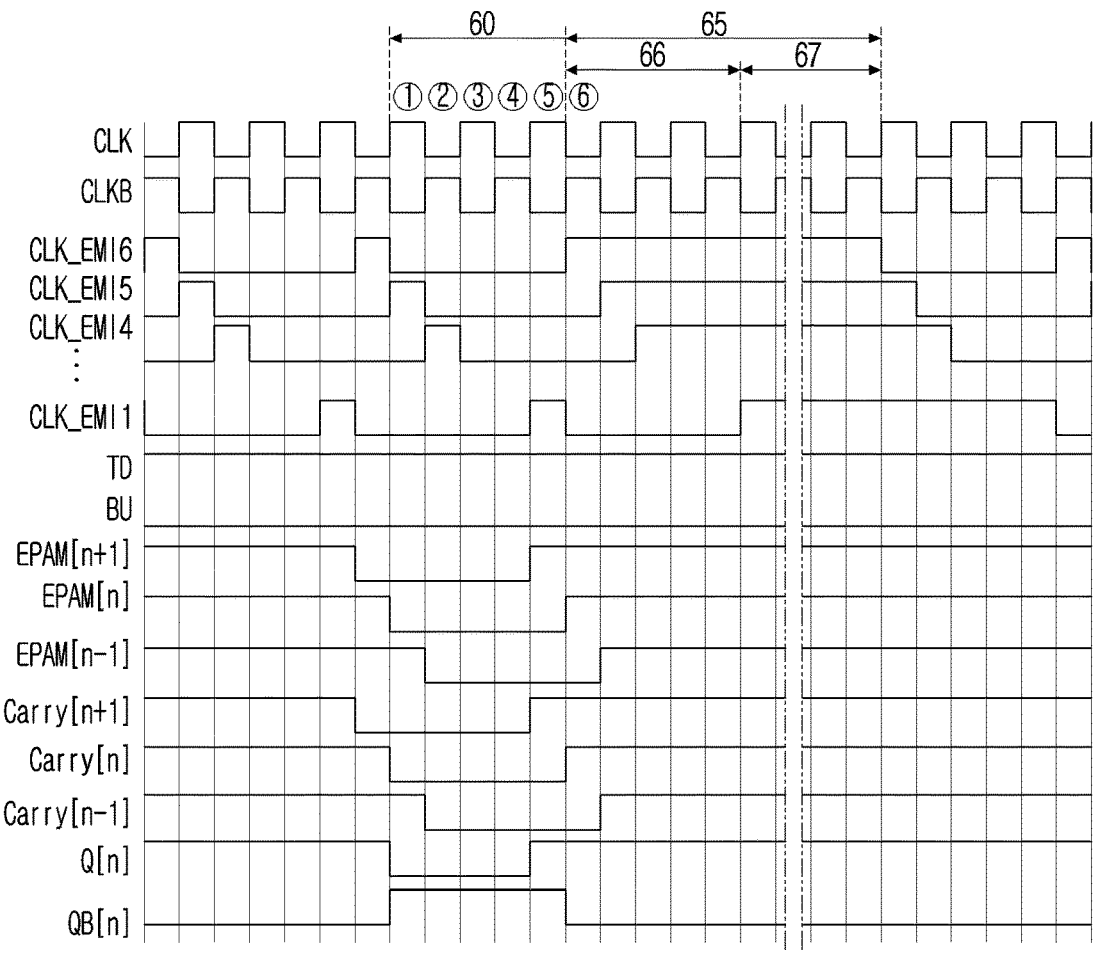

DISPLAY APPARATUS

CROSS-REFERENCE TO RELATED APPLICATIONS

This application is a continuation application of International Application No. PCT/KR2021/013555, filed on Oct. 5, 2021, which claims priority to Korean Patent Application No. 10-2020-0136188, filed on Oct. 20, 2021, and to Korean Patent Application No. 10-2021-0114208, filed on Aug. 27, 2021, in the Korean Intellectual Property Office, the disclosures of which are incorporated by reference herein in their entireties.

BACKGROUND

1. Field

The present disclosure relates generally to a display apparatus, and more particularly, to a display apparatus including a pixel array on which self-luminous elements are arranged.

2. Description of Related Art

A related display panel, which may drive an inorganic light-emitting element such as, but not limited to, a red light-emitting diode (LED), a green LED, or a blue LED as a subpixel, may express a grayscale of the subpixel by using a pulse amplitude modulation (PAM) driving mechanism. Hereinafter, an LED may refer to an inorganic light-emitting element.

In this case, not only a grayscale of the emitted light but also a wavelength thereof may be changed based on a magnitude of a driving current, thereby reducing color reproducibility of an image. FIG. 1 shows a change in the wavelength based on the magnitude of a driving current flowing through a blue LED, a green LED, or a red LED.

Accordingly, there is a need to develop a driving method of a self-luminous display panel which may provide improved color reproducibility. For example, it may be necessary to consider power consumption, luminance uniformity, horizontal crosstalk, and the like.

Further, it is necessary to consider image distortion which may occur at a boundary between upper and lower display modules when one display panel is configured by combining the plurality of display modules with each other.

SUMMARY

Provided are a display apparatus which may provide improved color reproducibility based on an input image signal, and a driving method thereof.

In addition, provided are a display apparatus including a subpixel circuit which may drive an inorganic light-emitting element more efficiently and stably, and a driving method thereof, when compared to related display panels.

In addition, provided are a display apparatus including a driving circuit suitable for high-density integration by optimizing designs of various circuits for driving the inorganic light-emitting elements, and a driving method thereof.

In addition, provided are a display apparatus which may provide lower luminance uniformity due to a deviation in the threshold voltage and/or mobility of driving transistors, and a driving method thereof.

In addition, provided are a display apparatus which may reduce power consumption when driving a display panel, and a driving method thereof.

In addition, provided are a display apparatus which may compensate for an influence of a different drop in a driving voltage that occurs for each position of a display panel on a process of setting a data voltage, and a driving method thereof.

In addition, provided are a display apparatus which may prevent and/or reduce luminance non-uniformity and horizontal crosstalk problems caused by a sweep rod, and a driving method thereof.

In addition, provided are a display apparatus which may reduce image distortion that may occur at a boundary between upper and lower display modules when the plurality of display modules are combined with each other to configure one display panel, and a driving method thereof.

According to an aspect of the disclosure, a display apparatus includes: a modular display panel including a plurality of display modules, each display module of the plurality of display modules including: a display panel including a pixel array including pixels arranged in a plurality of row lines, each of the pixels including a plurality of inorganic light-emitting elements and subpixel circuits corresponding to the plurality of inorganic light-emitting elements, and a driving unit configured to, based on control signals, drive the subpixel circuits corresponding to the plurality of inorganic light-emitting elements to successively emit light in a first order of the plurality of row lines or in a second order of the plurality of row lines opposite to the first order; and a processor communicatively configured to: provide, to a first driving unit of a first display module of the plurality of display modules, first control signals configured to cause the plurality of inorganic light-emitting elements of the first display module to emit light in the first order, and provide, to a second driving unit of a second display module of the plurality of display modules, second control signals configured to cause the plurality of inorganic light-emitting elements of the second display module to emit light in the second order, the second display module being positioned above or below the first display module.

The driving unit may include: a scan driver configured to provide a scan signal to the subpixel circuits in a row-line order for an image data voltage to be set to the subpixel circuits in the row-line order; and an emission driver configured to provide an emission signal to the subpixel circuits in the row-line order for the plurality of inorganic light-emitting elements of the pixels to emit light in the row-line order based on the image data voltage set based on the scan signal.

The first control signals may be provided from the processor to the first driving unit of the first display module through a first wiring, and the second control signals may be provided from the processor to the second driving unit of the second display module through a second wiring that is separate from the first wiring.

The scan driver may include a plurality of scan driver circuits having a same circuit structure, and each of the plurality of scan driver circuits may be provided for each row line, and is configured to output the scan signal to the subpixel circuits corresponding to each row line.

A first scan driver circuit corresponding to one row line of the plurality of scan driver circuits may include: a first scan signal input terminal configured to receive a first scan signal output from a second scan driver circuit corresponding to a previous row line of the one row line; and a second scan signal input terminal configured to receive a second scan signal output from a third scan driver circuit corresponding to a next row line of the one row line, and the first scan driver circuit is further configured to output the scan signal to the subpixel circuits corresponding to the one row line based on the first scan signal received through the first scan signal input terminal and the second scan signal received through the second scan signal input terminal.

The plurality of scan driver circuits of the first display module may be configured to successively provide the scan signal to the subpixel circuits from a first row line to a last row line of the first display module based on the first scan signal input through the first scan signal input terminal selected based on selection signals included in the first control signals, and the plurality of scan driver circuits of the second display module may be configured to successively provide the scan signal to the subpixel circuits from a last row line to a first row line of the second display module based on the second scan signal input through the second scan signal input terminal selected based on selection signals included in the second control signals.

Each of the plurality of scan driver circuits may include: a first clock input terminal configured to receive a first clock signal; a second clock input terminal configured to receive a second clock signal having a second phase that is opposite to a first phase of the first clock signal; and a first selection signal input terminal and a second selection signal input terminal configured to receive selection signals for selecting one scan signal input terminal from the first scan signal input terminal and the second scan signal input terminal, respectively.

The first control signals may include a third clock signal, a fourth clock signal having a fourth phase that is opposite to a third phase of the third clock signal, a first selection signal having a first level, and a second selection signal having a second level that is different from the first level, the second control signals may include a fifth clock signal having a fifth phase that is opposite to the first phase of the first clock signal, a sixth clock signal having a sixth phase that is opposite to the third phase of the third clock signal, a third selection signal having the second level, and a fourth selection signal having the first level, the third clock signal, the fourth clock signal, the first selection signal, and the second selection signal may be respectively input to the first clock input terminal, the second clock input terminal, the first selection signal input terminal, and the second selection signal input terminal of the scan driver circuit for one row line among the plurality of row lines of the first display module, and the fifth clock signal, the sixth clock signal, the third selection signal, and the fourth selection signal may be respectively input to the first clock input terminal, the second clock input terminal, the first selection signal input terminal, and the second selection signal input terminal of the scan driver circuit for a row line corresponding to the one row line among the plurality of row lines of the second display module.

The emission driver may include a plurality of emission driver circuits having a same circuit structure, and each of the plurality of emission driver circuits may be provided for each row line, and is configured to output the emission signal to the subpixel circuits corresponding to each row line.

The emission driver may be a first type emission driver, a first emission driver circuit corresponding to one row line among the plurality of emission driver circuits of the first type emission driver may include: a first emission signal input terminal configured to receive a first emission signal output from a second emission driver circuit corresponding to a previous row line of the one row line; and a second emission signal input terminal configured to receive a second emission signal output from a third emission driver circuit corresponding to a next row line of the one row line, and the first type emission driver may be configured to output the emission signal to the subpixel circuits corresponding to the one row line based on a selected emission signal input through a selected emission signal input terminal selected from the first emission signal input terminal and the second emission signal input terminal.

The plurality of emission driver circuits of the first display module is configured to successively provide the selected emission signal to the subpixel circuits for a first row line to a last row line of the first display module based on the first emission signal input through the first emission signal input terminal selected based on selection signals included in the first control signals, and the plurality of emission driver circuits of the second display module is configured to successively provide the selected emission signal to the subpixel circuits for a last row line to a first row line of the second display module based on the second emission signal input through the second emission signal input terminal selected based on selection signals included in the second control signals.

Each of the plurality of emission driver circuits included in the first type emission driver may include: a first clock input terminal configured to receive clock signals; a second clock input terminal configured to receive other clock signals having phases opposite to phases of the clock signals; and a first selection signal input terminal and a second selection signal input terminal configured to receive selection signals for selecting one emission signal input terminal from the first emission signal input terminal and the second emission signal input terminal, respectively.

The first control signals may include a first clock signal, a second clock signal having a phase opposite to a phase of the first clock signal, a first selection signal of a first level, and a second selection signal of a second level different from the first level, the second control signals may include a third clock signal having a phase opposite to the phase of the first clock signal, a fourth clock signal having a phase opposite to a phase of the third clock signal, a third selection signal of the second level, and a fourth selection signal of the first level, the first clock signal, the second clock signal, the first selection signal, and the second selection signal may be respectively input to the first clock input terminal, the second clock input terminal, the first selection signal input terminal, and the second selection signal input terminal for one row line among the plurality of row lines of the first display module, and the third clock signal, the fourth clock signal, the third selection signal, and the fourth selection signal may be respectively input to the first clock input terminal, the second clock input terminal, the first selection signal input terminal, and the second selection signal input terminal for a row line corresponding to the one row line among the plurality of row lines of the second display module.

The emission driver may be a second type emission driver configured to output the emission signal based on a carry signal and an input signal, a first emission driver circuit corresponding to one row line among the plurality of emission driver circuits of the second type emission driver may include: a first carry signal input terminal configured to receive a first carry signal output from a second emission driver circuit corresponding to a previous row line of the one row line; and a second carry signal input terminal configured to receive a second carry signal output from a third emission driver circuit corresponding to a next row line of the one row line, and the first emission driver circuit may be configured to: output a third carry signal corresponding to the one row line based on the carry signal input through one carry signal input terminal selected from the first and second carry signal input terminals, and select and output the emission signal to be provided to the subpixel circuits corresponding to the one row line from the input signal input to the first emission driver circuit based on the third carry signal.

Input signals input to the plurality of emission driver circuits may be same signals having different phases.

BRIEF DESCRIPTION OF THE DRAWINGS

The above and other aspects, features, and advantages of certain embodiments of the present disclosure will be more apparent from the following description taken in conjunction with the accompanying drawings, in which:

FIG. 15 is a conceptual diagram showing a method in which upper and lower display modules adjacent to each other are driven for two successive image frames, according to an embodiment of the present disclosure;

FIG. 17C shows the scan driver circuit, according to an embodiment of the present disclosure and a driving timing diagram thereof;

FIG. 17D shows the scan driver circuit, according to an embodiment of the present disclosure and the driving timing diagram thereof;

FIG. 18C shows the emission driver circuit, according to an embodiment of the present disclosure and a driving timing diagram thereof;

FIG. 18D shows the emission driver circuit, according to an embodiment of the present disclosure and the driving timing diagram thereof;

FIG. 19C shows the sweep driver circuit, according to an embodiment of the present disclosure and a driving timing diagram thereof;

FIG. 19D shows the sweep driver circuit, according to an embodiment of the present disclosure and the driving timing diagram thereof;

FIG. 20C shows the emission driver circuit, according to an embodiment of the present disclosure and a driving timing diagram thereof;

FIG. 20D shows the emission driver circuit, according to an embodiment of the present disclosure and the driving timing diagram thereof;

DETAILED DESCRIPTION

Figure 1:
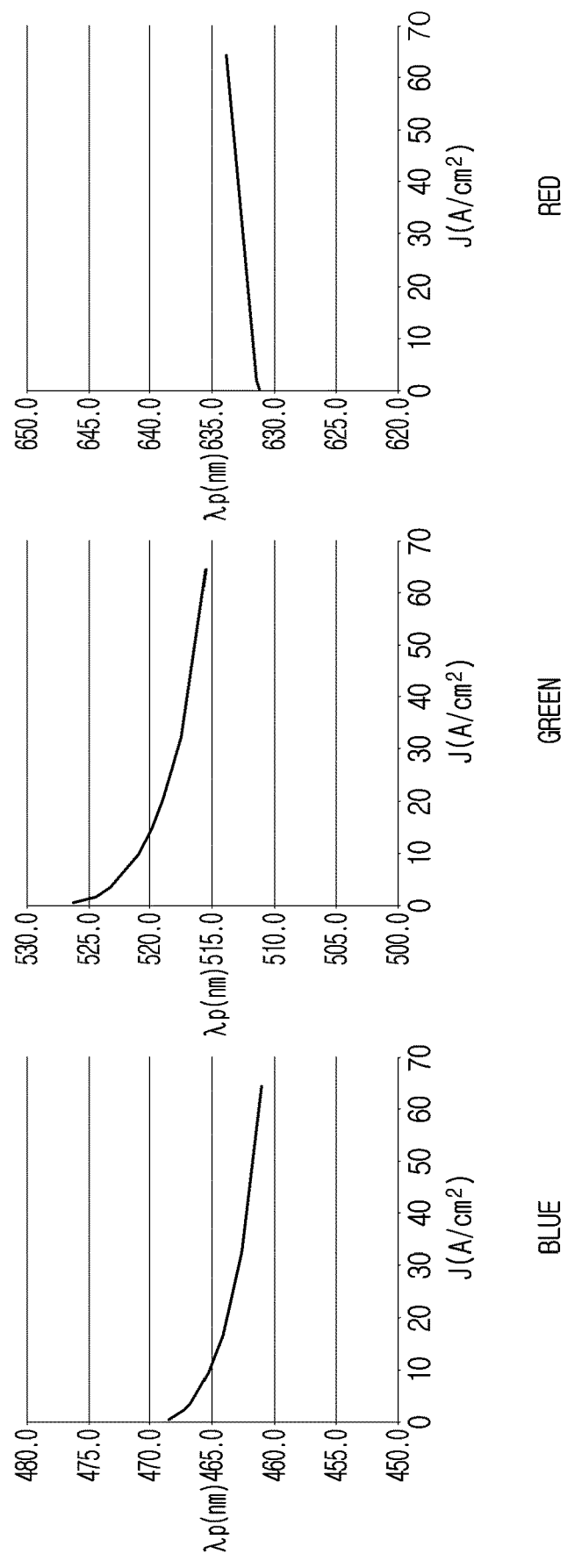
FIG. 1 is a graph showing a change in a wavelength based on a magnitude of a driving current flowing through a blue LED, a green LED, or a red LED.

The following description with reference to the accompanying drawings is provided to assist in a comprehensive understanding of embodiments of the present disclosure defined by the claims and their equivalents. Various specific details are included to assist in understanding, but these details are considered to be exemplary only. Therefore, those of ordinary skill in the art will recognize that various changes and modifications of the embodiments described herein can be made without departing from the scope and spirit of the disclosure. In addition, descriptions of well-known functions and structures are omitted for clarity and conciseness.

With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order).

Reference throughout the present disclosure to "one embodiment," "an embodiment," "an example embodiment," or similar language may indicate that a particular feature, structure, or characteristic described in connection with the indicated embodiment is included in at least one embodiment of the present solution. Thus, the phrases "in one embodiment", "in an embodiment," "in an example embodiment," and similar language throughout this disclosure may, but do not necessarily, all refer to the same embodiment.

In describing the present disclosure, when it is decided that the detailed description of the known art related to the present disclosure may obscure the gist of the present disclosure, the detailed description thereof will be omitted. In addition, a redundant description of the same configuration will be omitted as much as possible.

In addition, terms "er (or ~or)" for components used in the following description are used only to easily make the present disclosure. Therefore, these terms do not have meanings or roles distinguished from each other by themselves.

Terms used in the present disclosure are used to describe embodiments, and are not intended to restrict and/or limit the present disclosure. A term of a singular number may include its plural number unless explicitly represented otherwise in the context.

It is to be understood that terms "include" or "have" used in the present disclosure specify the presence of features, numerals, steps, operations, components, parts mentioned in the specification, or combinations thereof, and do not preclude the presence or addition of one or more other features, numerals, steps, operations, components, parts, or combinations thereof.

Expressions "first," "second" and the like, used in the present disclosure, may represent various components regardless of the order and/or importance of the components. These expressions are used only to distinguish one component from another component, and do not limit the corresponding component.

In case that any component (e.g., a first component) is mentioned to be "(operatively or communicatively) coupled with/to" or "connected to" another component (e.g., a second component), it is to be understood that any component is directly coupled to another component or coupled to another component through still another component (e.g., a third component).

On the other hand, in case that any component (e.g., the first component) is mentioned to be "directly coupled to" or "directly connected to" another component (e.g., the second component), it is to be understood that still other component (e.g., the third component) is not present between any component and another component.

Terms used in embodiments of the present disclosure may be interpreted as having the same meanings as meanings generally known to those skilled in the art unless defined otherwise.

Hereinafter, various embodiments of the present disclosure will be described in detail with reference to the accompanying drawings.

Figure 2:
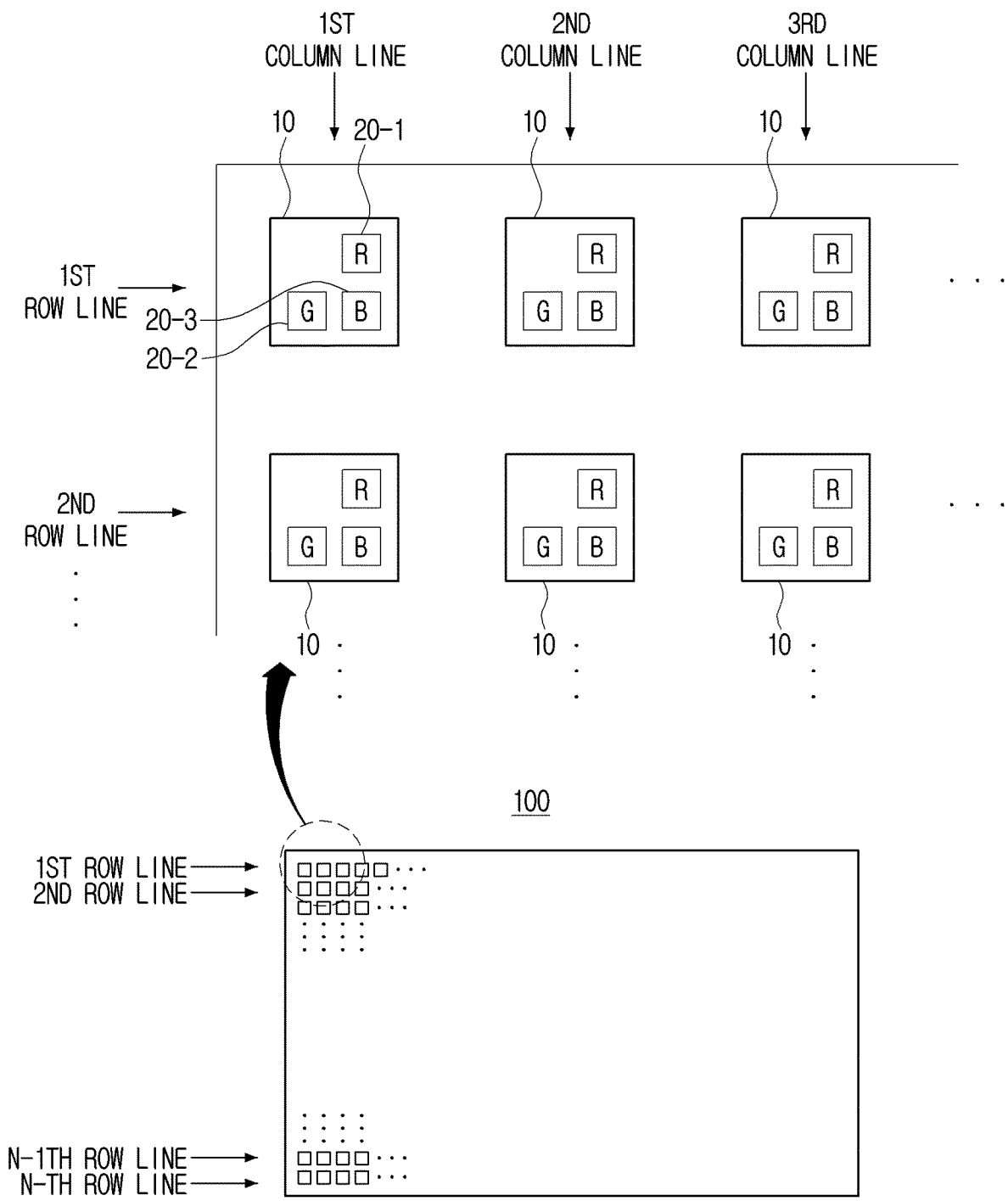
FIG. 2 is a view for explaining a pixel structure of a display apparatus, according to an embodiment of the present disclosure.

FIG. 2 is a view for explaining a structure of a pixel included in a display panel according to an embodiment of the present disclosure.

Referring to FIG. 2, a display panel 100 may include a plurality of pixels 10 positioned (and/or arranged) in a matrix type. That is, the plurality of pixels 10 may constitute a pixel array.

The pixel array may include a plurality of row lines and/or a plurality of column lines. In some embodiments, the row line may be referred to as a horizontal line, a scan line, and/or a gate line. Alternatively or additionally, the column line may be referred to as a vertical line and/or a data line.

Alternatively or additionally, the terms "row line," "column line," "horizontal line," and "vertical line" may be used as terms to refer to a line configured by the pixels on the pixel array. In some embodiments, the terms "scan line," "gate line," and "data line" may be used as terms to refer to an actual wiring on the display panel 100, through which data and/or signals may be transmitted.

As shown in FIG. 2, each pixel 10 of the pixel array may include three types of subpixels such as, but not limited to, a red (R) subpixel 20-1, a green (G) subpixel 20-2, and a blue (B) subpixel 20-3. That is, each pixel 10 may include a plurality of inorganic light-emitting elements included in the subpixels 20-1, 20-2, and 20-3. For example, each pixel 10 may include the three types of inorganic light-emitting elements, such as, an R inorganic light-emitting element included in the R subpixel 20-1, a G inorganic light-emitting element included in the G subpixel 20-2, and a B inorganic light-emitting element included in the B subpixel 20-3.

Alternatively or additionally, each pixel 10 may include three inorganic light-emitting elements of a same color (e.g., blue). In such embodiments, a color filter for realizing an R, G, or B color may be positioned on each inorganic light-emitting element. For example, the color filter may be a quantum dot (QD) color filter. The present disclosure is not limited thereto.

In some embodiments, a subpixel circuit for driving the inorganic light-emitting element (not shown) may be provided for each inorganic light-emitting element in the display panel 100. That is, each subpixel circuit may provide a driving current to the inorganic light-emitting element based on an image data voltage applied from the outside (e.g., a data driver). For example, the image data voltage may include a constant current generator data voltage and a pulse width modulation (PWM) data voltage. Each subpixel circuit may express a grayscale of an image by providing the inorganic light-emitting element with a driving current having a magnitude corresponding to that of the constant current generator data voltage for time corresponding to the PWM data voltage. A detailed description thereof is provided below.

In some embodiments, the subpixel circuits included in each row line of the display panel 100 may be driven in an order of "setting (or programming) the image data voltage" and "providing the driving current based on the set image data voltage."

That is, according to an embodiment of the present disclosure, the subpixel circuits included in each row line of the display panel 100 may be driven in a row-line order.

For example, the following operations may be successively performed in the row-line order: an operation of setting the image data voltage to the subpixel circuits included in one row line (e.g., a first row line), and an operation of setting the image data voltage to the subpixel circuits included in the next row line (e.g., a second row line). Alternatively or additionally, the following operations may be successively performed in the row-line order: an operation of providing the driving current to the subpixel circuits included in the one row line, and an operation of providing the driving current to the subpixel circuits included in the next row line.

FIG. 2 illustrates that the sub-pixels 20-1 to 20-3 are arranged in an L-shape having reversed left and right within one pixel region. However, the present disclosure is not limited thereto, and the R, G, and B subpixels 20-1 to 20-3 may be arranged in a line in the pixel region, and/or may be arranged in any of various shapes according to an embodiment.

FIG. 2 further illustrates that three types of subpixels are included in one pixel. However, the present disclosure is not limited thereto. For example, four types of subpixels such as R, G, B, and white (W) may be included in one pixel. In another example, any number of different sub-pixels may be included in one pixel.

Figure 3A:
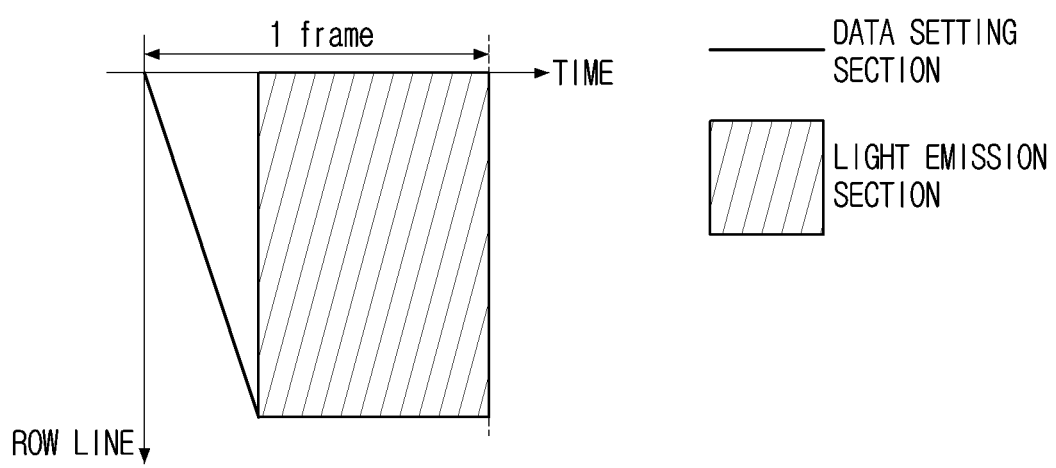
FIG. 3A is a conceptual diagram showing a driving method of a related display panel.
Figure 3B:
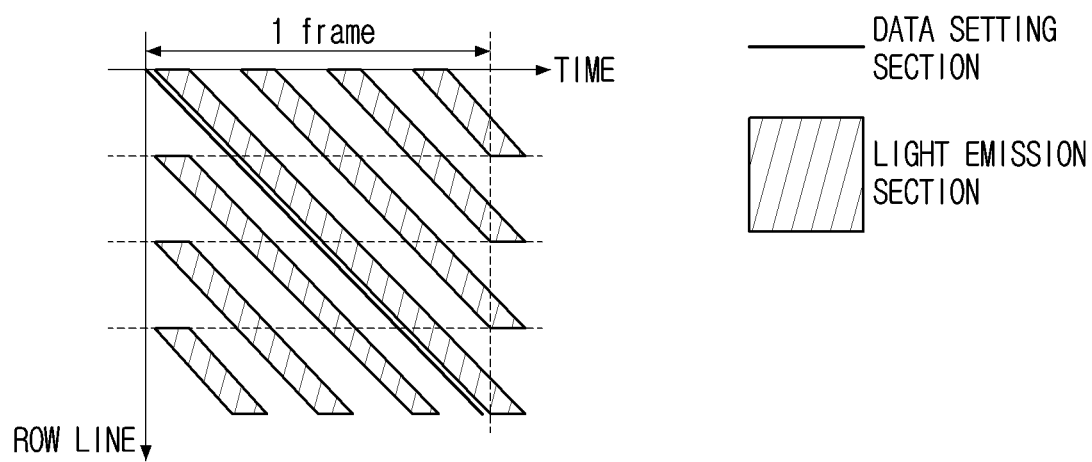
FIG. 3B is a conceptual diagram showing a driving method of a display panel, according to an embodiment of the present disclosure.

FIG. 3A is a conceptual diagram showing a driving method of a related display panel; and FIG. 3B is a conceptual diagram showing a driving method of the display panel according to an embodiment of the present disclosure.

FIGS. 3A and 3B show the driving method of a display panel for one image frame period. In addition, in FIGS. 3A and 3B, a vertical axis represents the row line, and a horizontal axis represents time. Furthermore, a data setting section may represent a driving section of the display panel 100 in which the image data voltages are set to the subpixel circuits included in each row line, and a light emission section may represent a driving section of the display panel 100 in which the subpixel circuits included in each row line provide the driving current to the inorganic light-emitting element based on the set image data voltage. The inorganic light-emitting elements may emit light based on the driving current in the light emitting section.

Referring to FIG. 3A, it may be seen that in related display panels, the light emission sections may be collectively performed after completing the setting of the image data voltages for all the row lines of the display panel.

That is, all the row lines of the related display panel may emit light simultaneously in the light emission section, thus requiring a high peak current, which may increase peak power consumption required for a product based on such related display panels. As the peak power consumption is increased, a power supply (e.g., a switched mode power supply (SMPS)) mounted on the product may require more capacity, which may result in an increased cost and a larger volume, thereby also causing a design restriction.

On the other hand, according to an embodiment of the present disclosure, as shown in FIG. 3B, it may be seen that the data setting section and the light emission section (e.g., the plurality of light emission sections) of each row line are successively performed in the row-line order. Hereinafter, the driving method shown in FIG. 3B may be referred to as a "progressive driving method" to be distinguished from the collective driving method shown in FIG. 3A.

In the case of the progressive driving method, the number of row lines simultaneously emitting light may be reduced compared to the prior art, thus lowering an amount of required peak current, which may reduce the peak power consumption.

As described above, according to various embodiments of the present disclosure, the inorganic light-emitting element may be driven in an active matrix (AM) type by using PWM driving, thereby preventing a wavelength of light emitted from the inorganic light-emitting element from being changed based on its grayscale. Alternatively or additionally, the display panel 100 may be driven so that the subpixels successively emit light in the row-line order, thereby potentially reducing instantaneous peak power consumption.

Figure 4:
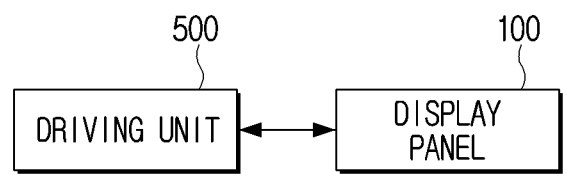
FIG. 4 is a block diagram showing a configuration of a display module, according to an embodiment of the present disclosure.

FIG. 4 is a block diagram showing a configuration of a display module according to an embodiment of the present disclosure. Referring to FIG. 4, a display module 1000 may include the display panel 100 and a driving unit 500.

The driving unit 500 may drive the display panel 100. That is, the driving unit 500 may drive the display panel 100 by providing the display panel 100 with various control signals, data signals, driving voltages, and the like.

As described above, according to an embodiment of the present disclosure, the display panel 100 may be driven in the row-line order. To this end, the driving unit 500 may include a gate driver (not shown) for driving the pixels on the pixel array for each row line. The gate driver may drive the pixels for each row line by providing a scan signal and an emission signal which are described below for each row line.

The driving unit 500 may further include a source driver (and/or data driver) (not shown) for providing the PWM data voltage to each pixel (or each subpixel) of the display panel 100.

The driving unit 500 may further include a DeMUX circuit (not shown) for selecting each of the plurality of subpixels 20-1 to 20-3 included in one pixel 10.

The driving unit 500 may further include various direct current (DC) voltages (e.g., first driving voltage VDD_PAM, second driving voltage VDD_PWM, ground voltage VSS, test voltage, or Vset voltage), and/or a power integrated circuit (IC) (or a driving voltage supply circuit) for providing the constant current generator data voltage, a high voltage SW_VGH of a sweep signal, a low voltage SW_VGL of the sweep signal, or the like (not shown) to each subpixel circuit included in the display panel 100.

The driving unit 500 may further include a clock signal supply circuit (not shown) for providing various clock signals to the gate driver or the data driver. For example, according to an embodiment of the present disclosure, the clock signal supply circuit may include a level shifter, and be configured to shift a level of the clock signal provided from a timing controller (TCON) to a level usable by the gate driver and/or data driver to provide the same to the gate driver and/or data driver.

In some embodiments, at least some of the above-described various circuits of the driving unit 500 may be implemented in separate chips and/or mounted on an external printed circuit board (PCB) together with the TCON, and connected with the subpixel circuits positioned in a thin film transistor (TFT) layer of the display panel 100 through a film on glass (FOG) wiring.

Alternatively or additionally, at least some of the above-described various circuits of the driving unit 500 may be implemented in separate chips, positioned on a film in the form of a chip on film (COF), and connected to the subpixel circuits positioned in the TFT layer of the display panel 100 through FOG wiring.

In other optional or additional embodiments, at least some of the above-described various circuits of the driving unit 500 may be implemented in separate chips, positioned in the form of a chip on glass (COG) of the glass substrate of the display panel 100. That is, in such embodiments, the separate chips may be positioned on a rear surface, or a surface of a glass substrate, opposite to its surface on which the TFT layer is positioned. The separate chips may be connected to the subpixel circuits positioned in the TFT layer of the display panel 100 through a connection wiring.

Alternatively or additionally, at least some of the above-described various circuits of the driving unit 500 may be positioned in the TFT layer together with the subpixel circuits positioned in the TFT layer in the display panel 100, and connected to the subpixel circuits.

For example, among the above-described various circuits of the driving unit 500, the gate driver and the DeMUX circuit may be positioned in the TFT layer of the display panel 100, the data driver may be positioned on the rear surface of the glass substrate of the display panel 100, the clock signal supply circuit may be positioned on the film in the form of the COF, and the power IC and the TCON may be positioned on the external PCB. However, the present disclosure is not limited thereto.

In some embodiments, the driving unit 500 may drive the display panel 100 by using the progressive driving method. The driving unit 500 may be configured to set the image data voltage to the subpixel circuits of the display panel 100 in the row-line order during the data setting section, and drive the subpixel circuits so that the pixels on the pixel array emit light in the row-line order based on a set image data voltage during the light emission section.

The display panel 100 may include the pixel array as described above with reference to FIG. 2, and may be configured to display an image corresponding to an applied image data voltage.

Each subpixel circuit included in the display panel 100 may provide the corresponding inorganic light-emitting element with a driving current whose magnitude and driving time (and/or pulse width) are controlled based on the applied image data voltage.

The inorganic light-emitting elements included in the pixel array may emit light based on the driving current provided from the corresponding subpixel circuit, thereby displaying the image on the display panel 100.

Figure 5:
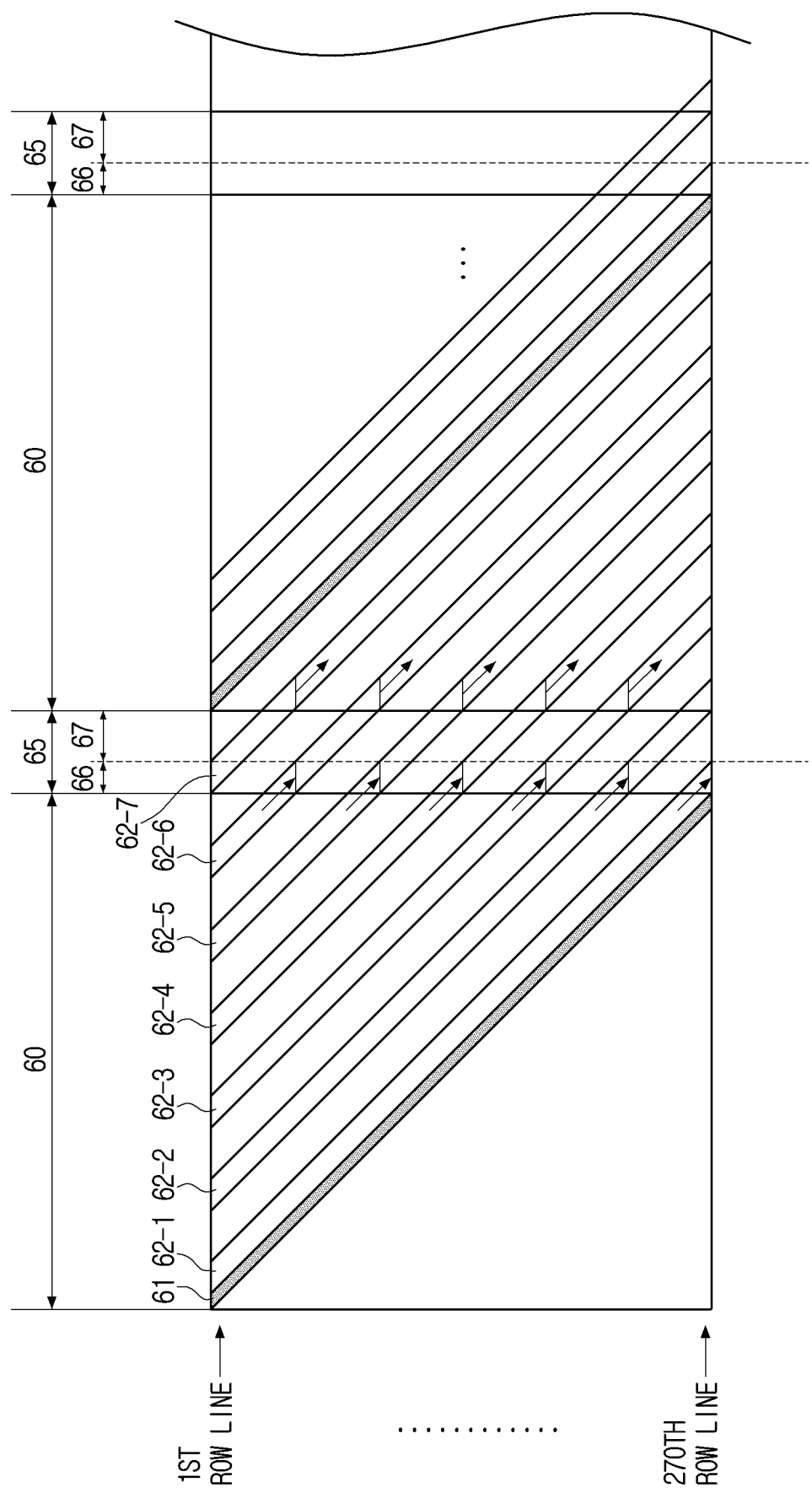
FIG. 5 is a view for explaining a progressive driving method of the display panel, according to an embodiment of the present disclosure.

FIG. 5 is a view for explaining the progressive driving method of the display panel 100 according to an embodiment of the present disclosure.

FIG. 5 shows a concept of the driving method of the display panel 100 for two successive image frames. In FIG. 5, a vertical axis represents the row line, a horizontal axis represents the time, reference numeral 60 represents the image frame period, and reference number 65 represents a blanking period.

FIG. 5 illustrates that the display panel 100 includes 270 row lines, and seven light emission sections 62-1 to 62-7 are performed based on the image data voltage set in a data setting section 61. However, the number of row lines and/or the number of light emission sections is not limited thereto.

Referring to FIG. 5, it may be seen that, for one image frame, one data setting section 61 and the plurality of light emission sections 62-1 to 62-7 are performed for each row line.

During the data setting section 61, the image data voltage may be set to the subpixel circuits included in each row line. Alternatively or additionally, in each of the plurality of light emission sections 62-1 to 62-7, the subpixel circuits included in each row line may provide the driving current to the inorganic light-emitting element based on the set image data voltage.

For example, the driving unit 500 may apply, to the subpixel circuits in each row line, a control signal for setting the image data voltage during the data setting section 61. Hereinafter, the control signal may be referred to as a scan signal, and may include, for example, signals VST(n) and/or SP(n) as described in reference to FIG. 8A.

The driving unit 500 may also apply, to the subpixel circuits in each row line, a control signal for controlling the operation of providing the driving current during the plurality of light emission sections 62-1 to 62-7. Hereinafter, the control signal may be referred to as an emission signal, and may include, for example, signals Emi_PWM(n), Emi_PAM(n), and Sweep(n) as described in reference to FIG. 8A

Continuing to refer to FIG. 5, it may be seen that the data setting section 61 and the plurality of light emission sections 62-1 to 62-7 are successively performed respectively for all the row lines of the display panel 100 in the row-line order.

That is, the driving unit 500 may apply the scan signal to the subpixel circuits in the row-line order from the first to last row lines of the display panel 100. Alternatively or additionally, the driving unit 500 may apply the emission signal to the subpixel circuits in the row-line order from the first to last row lines of the display panel 100.

As shown in FIG. 5, it may be seen that the first light emission section 62-1 of each row line is temporally continuous with the data setting section 61, and the plurality of light emission sections 62-1 to 62-7 have a predetermined time interval therebetween.

For example, the number of light emission sections in each row line for one image frame and the predetermined time interval between the light emission sections may be set based on a size of the display panel 100 and/or a shutter speed of a camera. However, the present disclosure is not limited thereto.

In general, the shutter speed of a camera may be several times faster than the one image frame period. Therefore, the image displayed on the display panel 100 that is taken by the camera may be distorted when the display panel 100 is driven so that one light emission section from the first to last row lines is performed in the row-line order during the one image frame period.

Therefore, according to an embodiment of the present disclosure, it may be possible to prevent the image displayed on the display panel 100 that is taken by the camera from being distorted even when the display panel 100 is captured at any moment by setting the predetermined time interval based on the speed of the camera while the display panel 100 is driven so that the plurality of light emission sections are performed at the predetermined time interval during one image frame period.

Meanwhile, the blanking period (or blanking interval) 65 in FIG. 5 may represent a period between the successive image frame periods 60 in which valid image data is not applied. Referring to FIG. 5, it may be seen that the data setting section 61 is not included in the blanking period 65. Therefore, no image data voltage may be applied to the display panel 100 in the blanking period 65.

As such, no image data voltage may be applied in the blanking period 65, as well as the inorganic light-emitting elements may emit light in some sections of the blanking period 65 according to an embodiment. Referring to arrows included in the period and represented by reference numeral 66 in FIG. 5, it may be seen that the light emission sections of some row lines are performed even during the blanking period 65.

Alternatively or additionally, the blanking section 65 may include a non-light emission section 67 in which none of the inorganic light-emitting elements of the display panel 100 emits light. No current may flow in the display panel 100 during the non-light emission section 67, and an operation, such as, but not limited to, a malfunction detection of the display panel 100, may thus be performed during the non-light emission section 67.

For example, whether the display panel 100 malfunctions may be determined based on whether the current flows in the display panel 100 during the non-light emission section 67. No subpixel of the display panel 100 may emit light during the non-light emission section 67, and no current may thus flow in the display panel 100. However, the current may flow in the display panel 100 during the non-light emission section 67 when the display panel 100 malfunctions, such as a short circuit occurring in the subpixel circuit. Accordingly, a processor and/or the timing controller that is included in a display apparatus may determine that the display panel 100 malfunctions when the current flows in the display panel 100 during the non-light emission section 67.

Figure 8A:
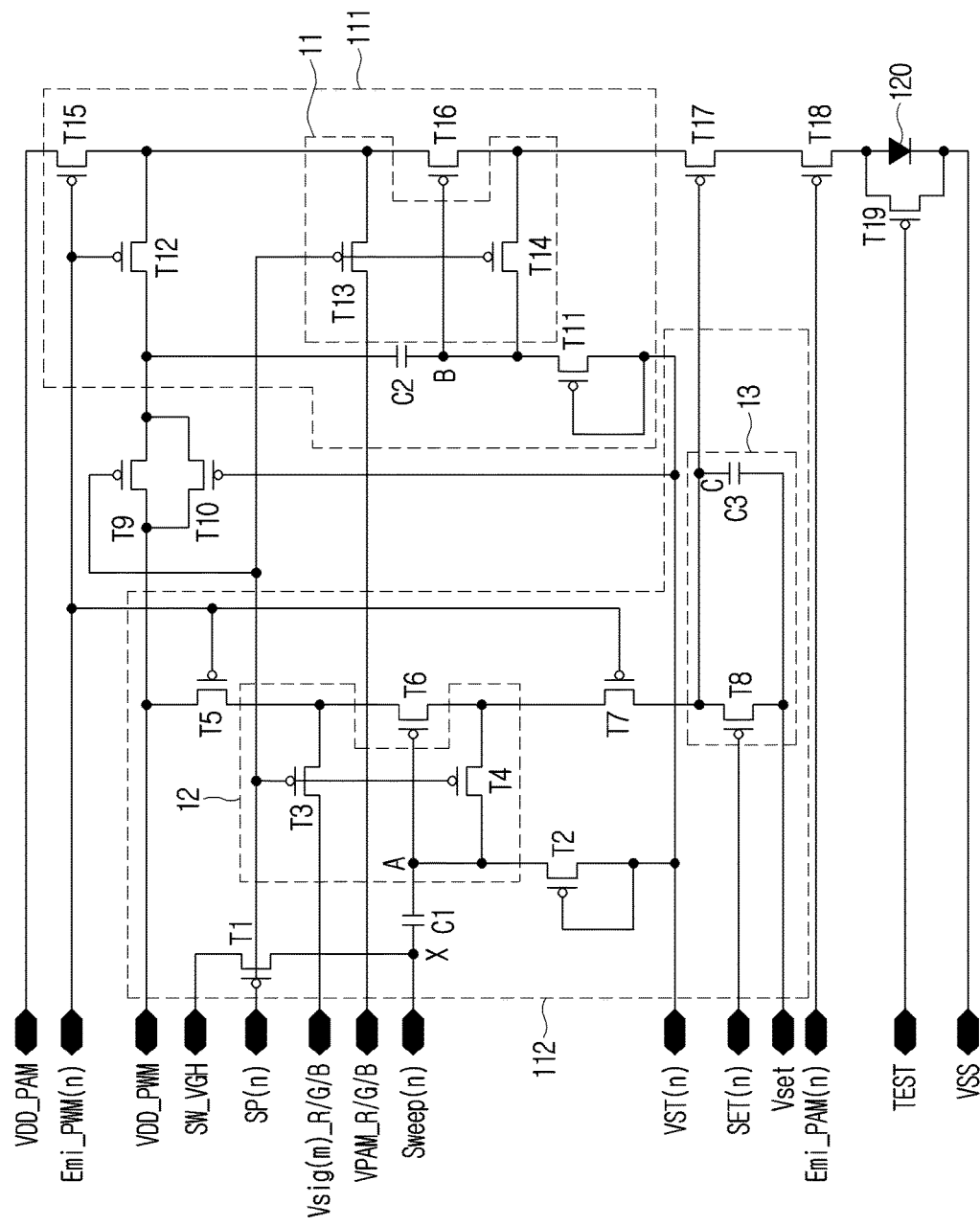
FIG. 8A is a detailed circuit diagram of the subpixel circuit, according to an embodiment of the present disclosure.

In some embodiments, the non-light emission section 67 may be implemented by a high level-emission signal Emi_PAM(n) applied for predetermined time during the blanking period 65, as described in reference to FIG. 8A.

Figure 6:
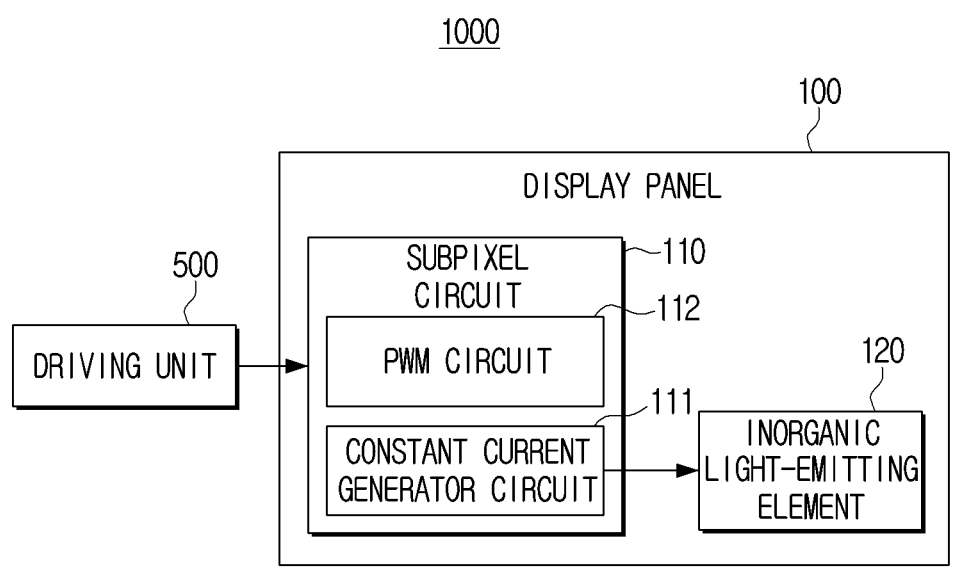
FIG. 6 is a detailed block diagram of a module, according to an embodiment of the present disclosure.

FIG. 6 is a detailed block diagram of the module 1000 according to an embodiment of the present disclosure. The description with reference to FIG. 6 omits a description of a content overlapping described above with reference to FIG. 4.

Referring to FIG. 6, the display module 1000 may include the display panel 100 including a subpixel circuit 110 and an inorganic light-emitting element 120, and the driving unit 500.

The display panel 100 may include the subpixel circuit 110 positioned on the glass substrate and the inorganic light-emitting element 120 positioned on the subpixel circuit 110 as described below, and is not limited thereto. FIG. 6 illustrates a configuration of one subpixel included in the display panel 100 for convenience of explanation. However, the subpixel circuit 110 and the inorganic light-emitting element 120 may be provided for each subpixel of the display panel 100.

The inorganic light-emitting element 120 may be mounted on the subpixel circuit 110 to be electrically connected to the subpixel circuit 110, and may be configured to emit light based on the driving current provided from the subpixel circuit 110.

The inorganic light-emitting element 120 may be included in the subpixels 20-1 to 20-3 of the display panel 100, and may have a plurality of types each based on a color of emitted light. For example, the inorganic light-emitting element 120 may include, but not be limited to, the red (R) inorganic light-emitting element that emits light of a red color, the green (G) inorganic light-emitting element that emits light of a green color, and the blue (B) inorganic light-emitting element that emits light of a blue color.

Accordingly, the above-mentioned type of the subpixel may depend on a type of the inorganic light-emitting element 120. That is, the R inorganic light-emitting element may correspond to the R sub-pixel 20-1, the G inorganic light-emitting element may correspond to the G sub-pixel 20-2, and the B inorganic light-emitting element may correspond to the B sub-pixel 20-3.

In some embodiments, the inorganic light-emitting element 120 may refer to a light-emitting element manufactured using an inorganic material, which may be different to an organic light emitting diode (OLED) manufactured using an organic material. For example, according to an embodiment of the present disclosure, the inorganic light-emitting element 120 may be a micro light emitting diode (micro LED or μLED) having a size of 100 micrometers (μm) or less.

A display panel in which each subpixel is implemented as a micro LED may be referred to as a micro LED display panel. The micro LED display panel may be one of flat panel display panels, and may include a plurality of inorganic light emitting diodes (inorganic LEDs) each having a size of 100 μm or less. The micro LED display panel may provide better contrast, response time and energy efficiency when compared to a related liquid crystal display (LCD) panel that may require a backlight. In some cases, the organic light emitting diode (OLED) and the micro LED may both have a comparably good energy efficiency. However, the micro LED may provide better performance than the OLED in terms of brightness, luminous efficiency, and lifespan.

The inorganic light-emitting element 120 may express a grayscale value of different brightness based on a magnitude of the driving current provided from the subpixel circuit 110 or a pulse width of the driving current. In the present disclosure, the pulse width of the driving current may be referred to as a duty ratio of the driving current or driving time (or duration) of the driving current.

For example, the inorganic light-emitting element 120 may express a brighter grayscale value as the driving current has a greater magnitude. Alternatively or additionally, the inorganic light-emitting element 120 may express a brighter grayscale value as the driving current has a larger pulse width (e.g., a higher duty ratio and/or longer driving time).

In some embodiments, the subpixel circuit 110 may provide the driving current to the inorganic light-emitting element 120. For example, the subpixel circuit 110 may provide the driving current whose magnitude and driving time are controlled to the inorganic light-emitting element 120, based on the image data voltage (e.g., a constant current generator data voltage and/or a PWM data voltage), the driving voltage (e.g., a first driving voltage, a second driving voltage, and/or a ground voltage), and the various control signals (e.g., a scan signal and/or a emission signal), or the like, applied from the driving unit 500.

That is, the subpixel circuit 110 may drive the inorganic light-emitting element 120 by using a pulse amplified modulation (PAM) driving and/or the PWM driving.

For example, the subpixel circuit 110 may include a constant current generator circuit 111 for providing the inorganic light-emitting element 120 with a constant current having a magnitude based on the constant current generator data voltage, and a PWM circuit 112 for controlling time when the constant current is provided to the inorganic light-emitting element 120 based on the PWM data voltage. Here, the above-mentioned driving current may be the constant current provided to the inorganic light-emitting element 120.

According to an embodiment of the present disclosure, the same constant current generator data voltage may be applied to all the constant current generator circuits 111 of the display panel 100. Accordingly, the driving current (e.g., a constant current) having the same magnitude may be provided to all the inorganic light-emitting elements 120 of the display panel 100, thereby possibly reducing a change in the wavelength of the LED that occurs due to a change in the magnitude of the driving current.

According to an embodiment, the same constant current generator data voltage may be applied to the constant current generator circuits 111 of the display panel 100 for each type of subpixel. That is, the inorganic light-emitting element 120 may have different characteristics based on its type, and the constant current generator data voltage having a different magnitude may be applied to a different type of subpixel circuits. Alternatively or additionally, the same constant current generator data voltage may be applied to the same type of subpixel circuits.

The PWM data voltage corresponding to the grayscale value of each subpixel may be applied to each PWM circuit 112 of the display panel 100. Accordingly, it may be possible to control the driving time of the driving current (e.g., a constant current) provided to the inorganic light-emitting element 120 of each subpixel through the PWM circuit 112. Accordingly, the grayscale of an image may be expressed.

The display module 1000 according to an embodiment of the present disclosure may be applied to a wearable device, a portable device, a handheld device, or any of various electronic or electrical products that requires a display, as a single unit.

According to another optional or additional embodiment of the present disclosure, one display panel may be configured by combining or assembling the plurality of display modules with each other. As described above, one display panel in which the plurality of display modules are combined with each other may be referred to as a modular display panel. However, the name is not limited thereto. In this case, each display module 1000 may be a component included in the modular display panel. The modular display panel may be applied to a small display product such as a monitor or a television (TV), and a large display product such as a digital signage or an electronic display.

In the modular display panel, the same constant current generator data voltage may be applied to the subpixel circuits included in one display module 1000, and the constant current generator data voltage having a different magnitude may be applied to the subpixel circuits included in another display module 1000. Therefore, the brightness deviation or color deviation of the display modules that may occur when the plurality of display modules may be combined with each other to configure one display panel may be compensated for by adjusting the constant current generator data voltage.

Figure 7:
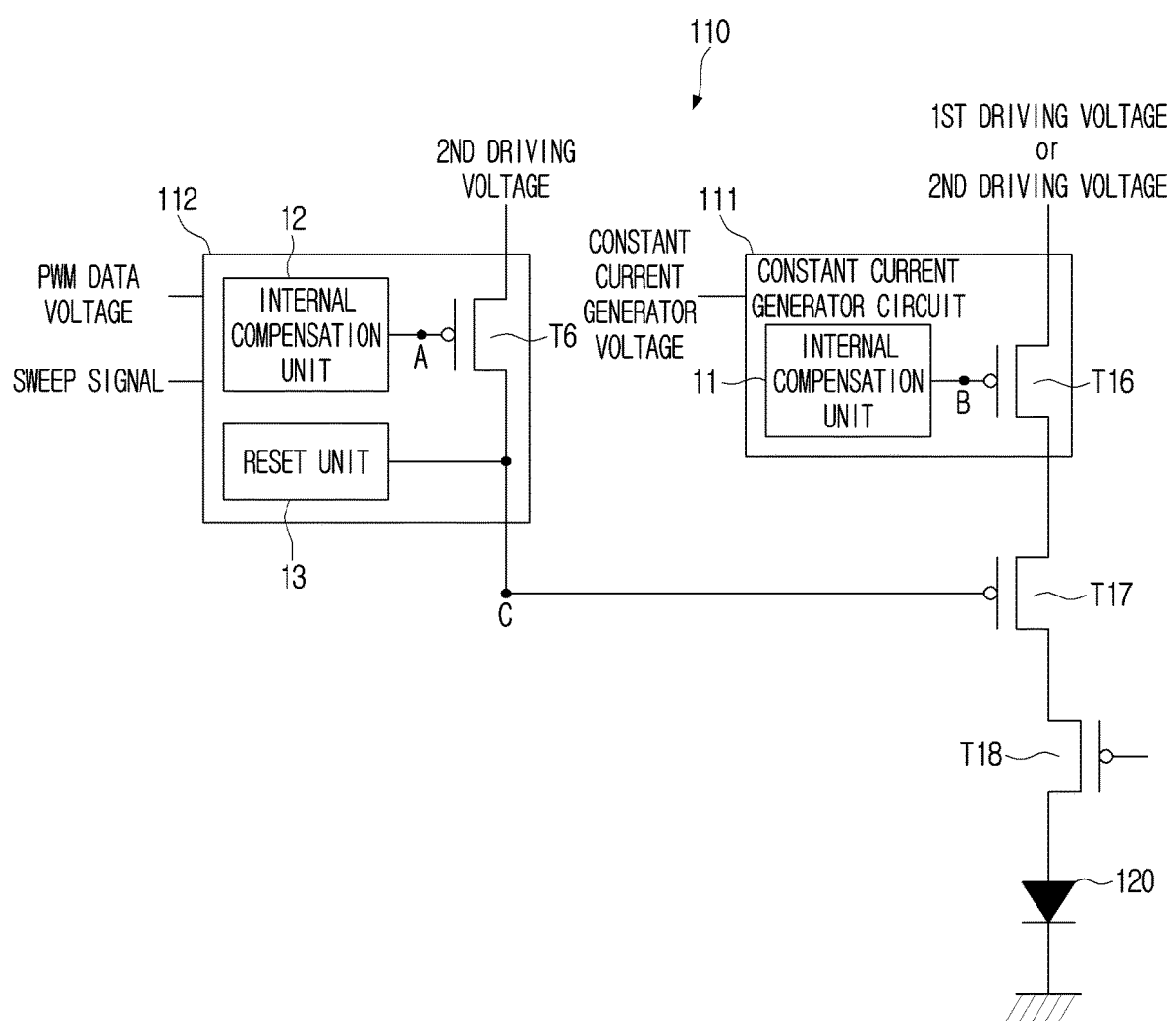
FIG. 7 is a block diagram of a subpixel circuit, according to an embodiment of the present disclosure.

FIG. 7 is a block diagram of the subpixel circuit 110 according to an embodiment of the present disclosure. Referring to FIG. 7, the subpixel circuit 110 may include the constant current generator circuit 111, the PWM circuit 112, a first switching transistor T17, and a second switching transistor T18.

The constant current generator circuit 111 may include a first driving transistor T16, and provide the inorganic light-emitting element 120 with the constant current having a constant magnitude based on a voltage applied between a source terminal and gate terminal of the first driving transistor T16.

That is, the constant current generator data voltage may be applied from the driving unit 500 in the data setting section, and in this case, the constant current generator circuit 111 may correct the constant current generator data voltage by a threshold voltage of the first driving transistor T16 and apply the same to a gate terminal "B" of the first driving transistor T16.

A deviation may occur in the threshold voltage (Vth) of the first driving transistors included in the subpixel circuits of the display panel 100. In some embodiments, the threshold voltages (Vths) of the first driving transistors may be required to be the same as each other. In other embodiments, the deviation may occur therein due to various factors such as a process deviation or a change over time. This deviation may cause a lower image quality and thus need to be compensated for. For example, the inorganic light-emitting element 120 may be provided with the driving current having a different magnitude by the deviation in the threshold voltage of the first driving transistor T16 even when the same constant current generator data voltage is applied to the constant current generator circuit 111 of each subpixel, which may appear as a spot or the like on the image.

The constant current generator circuit 111 may include an internal compensation unit 11 to compensate for the deviation in the threshold voltage of the first driving transistors T16. For example, the constant current generator data voltage may be applied, and in this case, the constant current generator circuit 111 may apply a first voltage corresponding to the sum of the constant current generator data voltage and the threshold voltage of the first driving transistor T16 to the gate terminal "B" of the first driving transistor T16 through the internal compensation unit 11.

In the light emission section, the constant current generator circuit 111 may then provide the inorganic light-emitting element 120 with the constant current having a magnitude based on the square of a voltage obtained by subtracting the threshold voltage of the first driving transistor T16 from a voltage between the gate terminal and source terminal of the first driving transistor T16. For example, the first voltage (e.g., the sum of the constant current generator data voltage and the threshold voltage of the first driving transistor T16) may be applied to the gate terminal of the first driving transistor T16, and it may thus be seen that the magnitude of the constant current provided by the constant current generator circuit 111 may be independent of the threshold voltage of the first driving transistor T16. In this way, the deviation in the threshold voltage of the first driving transistors T16 may be compensated for.

As shown in FIG. 7, a source terminal of the first switching transistor T17 may be connected to a drain terminal of the first driving transistor T16, and a drain terminal thereof may be connected to a source terminal of the second switching transistor T18. Alternatively or additionally, the source terminal of the second switching transistor T18 may be connected to the drain terminal of the first switching transistor T17, and the drain terminal thereof may be connected to an anode terminal of the inorganic light-emitting element 120. As shown in FIG. 7, the constant current may be provided to the inorganic light-emitting element 120 in a state where the first switching transistor T17 and the second switching transistor T18 are turned on.

The PWM circuit 112 may include a second driving transistor T6, and control the on/off operation of the first switching transistor T17 to thus control time when the constant current flows through the inorganic light-emitting element 120.

For example, the PWM data voltage may be applied from the driving unit 500 in the data setting section, and in this case, the PWM circuit 112 may correct the PWM data voltage by a threshold voltage of the second driving transistor T17 and apply the same to a gate terminal "A" of the second driving transistor T6.

The above-described problem occurring due to the deviation in the threshold voltage of the first driving transistors T16 may similarly occur in the second driving transistors T6. For example, the inorganic light-emitting element 120 may be provided with the driving current for different time (or a different pulse width) by the deviation in the threshold voltage of the second driving transistor T6 even when the same PWM data voltage is applied to the PWM circuit 112 of each subpixel, which may appear as the spot or the like on the image.

The PWM circuit 112 may also include an internal compensation unit 12 to compensate for the deviation in the threshold voltage of the second driving transistors T6.

For example, the PWM data voltage may be applied, and in this case, the PWM circuit 112 may apply a second voltage corresponding to the sum of the PWM data voltage and the threshold voltage of the second driving transistor T6 to the gate terminal "A" of the second driving transistor T6 through the internal compensation unit 12.

The second driving transistor T6 may then be turned based on the sweep signal applied in the light emission section, and in this case, the PWM circuit 112 may apply the second driving voltage to a gate terminal of the first switching transistor T17 to thus turn off the first switching transistor T17, thereby controlling the time when the constant current flows through the inorganic light-emitting element 120. Here, in the second driving transistor T6 may be turned on when the second voltage set at the gate terminal based on the sweep signal applied to the PWM circuit 112 is changed, and a voltage between the gate terminal and source terminal of the second driving transistor T6 reaches the threshold voltage of the second driving transistor T6.

In this case, the second voltage (e.g., the sum of the PWM data voltage and the threshold voltage of the second driving transistor T6) may be applied to the gate terminal of the second driving transistor T6, and it may thus be seen that the turn-on time of the second driving transistor T6 (e.g., the time when the constant current flows through the inorganic light-emitting element 120) is independent of the threshold voltage of the second driving transistor T6. In this way, the deviation in the threshold voltage of the second driving transistors T6 may be compensated for.

The above-described sweep signal may be a signal applied from the driving unit 500 to the subpixel circuit 110 to change the voltage of the gate terminal of the second driving transistor T6 during the light emission section, and may be a voltage signal sweeping between two different voltages. For example, the sweep signal may be a signal that is linearly changed between two voltages such as a triangular wave, and is not limited thereto.

In some embodiments, the PWM circuit 112 may include a reset unit 13. The reset unit 13 may forcibly turn on the first switching transistor T17. As described above, the first switching transistor T17 may need to be turned on for the constant current to flow through the inorganic light-emitting element 120 and for the inorganic light-emitting element 120 to emit light. To this end, the first switching transistor T17 may be turned on at a start timing of each of the plurality of light emission sections through an operation of the reset unit 13.

The second switching transistor T18 may be turned on/off based on the emission signal Emi_PAM(n), as described below. The on/off timing of the second switching transistor T18 may be related to implementation of a black grayscale, and a detailed description thereof is provided below.

In some embodiments, a resistance component may exist in the display panel 100. Therefore, an IR drop may occur when the driving current flows in the light emission section, which may cause a drop in the driving voltage. As described below, the driving voltage may also serve as a reference when setting the constant current generator data voltage, the drop in the driving voltage may interfere with the accurate setting of the constant current generator data voltage.

In various embodiments of the present disclosure, the data setting section and the light emission section may be performed in the row-line order. Therefore, the subpixel circuits for the other row lines of the display panel 100 may be operated in the data setting section while the subpixel circuits for some row lines of the display panel are operated in the light emission section.

Therefore, the same driving voltage applied through one wiring may be applied to the constant current generator circuits 111 of the display panel 100 regardless of the driving section of the display panel 100, and in this case, the drop in the driving voltage may affect an operation of setting the constant current generator data voltage of the subpixel circuits operated in the data setting section.

In order to overcome such a problem, in various embodiments of the present disclosure, separate driving voltages applied through separate wirings may each be applied to the constant current generator circuit 111 in the data setting section or the light emission section.

As shown in FIG. 7, the second driving voltage VDD_PWM may be applied to the constant current generator circuit 111 in the data setting section, and the first driving voltage VDD_PAM may be applied to the constant current generator circuit 111 in the light emission section. Therefore, the separate second driving voltage independent of the driving current may be applied to the subpixel circuits operated in the data setting section even when the voltage drop occurs in the first driving voltage due to the subpixel circuits operated in the light emission section, and it may thus be possible to stably set the constant current generator data voltage.

As shown in FIG. 7, the second driving voltage may be applied to the PWM circuit 112 during the light emission section to be also used as a voltage to turn off the first switching transistor T17.

FIG. 8A is a detailed circuit diagram of the subpixel circuit 110 according to an embodiment of the present disclosure. Referring to FIG. 8A, the subpixel circuit 110 may include the constant current generator circuit 111, the PWM circuit 112, the first switching transistor T17, the second switching transistor T18, a transistor T9, a transistor T10, and a transistor T19. The PWM circuit 112 may include the internal compensation unit 12 and the reset unit 13, and the constant current generator circuit 111 may include the internal compensation unit 11.

The transistor T9 and the transistor T10 may be circuit components for applying the second driving voltage VDD_PWM to the constant current generator circuit 112 during the data setting section.

The transistor T19 may be connected between the anode terminal and cathode terminal of the inorganic light-emitting element 120. The transistor T19 may be used for different purposes before and after the inorganic light-emitting element 120 is mounted on the TFT layer and may be electrically connected with the subpixel circuit 110.

For example, the transistor T19 may be turned based on the control signal (TEST) to check whether the subpixel circuit 110 is abnormal before the inorganic light-emitting element 120 and the subpixel circuit 110 are electrically connected with each other. As shown in FIG. 8, the transistor T19 may be turned on based on the control signal (TEST) after the inorganic light-emitting element 120 and the subpixel circuit 110 are connected with each other to discharge a charge remaining in a junction capacitance of the inorganic light-emitting element 120.

In FIG. 8A, VDD_PAM may represent the first driving voltage (e.g., +10 Volts (V)), VDD_PWM may represent the second driving voltage (e.g., +10 V), VSS may represent the ground voltage (e.g., 0 V), and Vset may represent a low voltage (e.g., −3 V) for turning on the first switching transistor T17. The VDD_PAM, VDD_PWM, VSS, Vset, and test voltages may be provided from the above-mentioned power IC, and are not limited thereto.

VST(n) may represent the scan signal applied to the subpixel circuit 110 to initialize voltages of a node A (or the gate terminal of the second driving transistor T6) and a node B (or the gate terminal of the first driving transistor T16). The second driving transistor T6 and the first driving transistor T16 may be turned on when the voltages of the node A and the node B are initialized based on the VST(n) signal.

SP(n) may represent the scan signal applied to the subpixel circuit 110 to set (or program) the image data voltage (e.g., the PWM data voltage or the constant current generator data voltage).

SET(n) may represent the emission signal applied to the reset unit 13 of the PWM circuit 112 to turn on the first switching transistor T17.

Emi_PWM(n) may represent the emission signal for applying the second driving voltage VDD_PWM to the PWM circuit 112 by turning on a transistor T5, and applying the first driving voltage VDD_PAM to the constant current generator circuit 111 by turning on a transistor T15 and a transistor T12.

Sweep(n) may represent the sweep signal. The sweep signal may be one of the emission signals. According to an embodiment of the present disclosure, the sweep signal may be a voltage signal linearly changed between two different voltages, and is not limited thereto. Alternatively or additionally, the sweep signal may be applied repeatedly in the same form for each light emission section.

Emi_PAM(n) may represent an emission signal for turning on the second switching transistor T18.

Figure 8B:
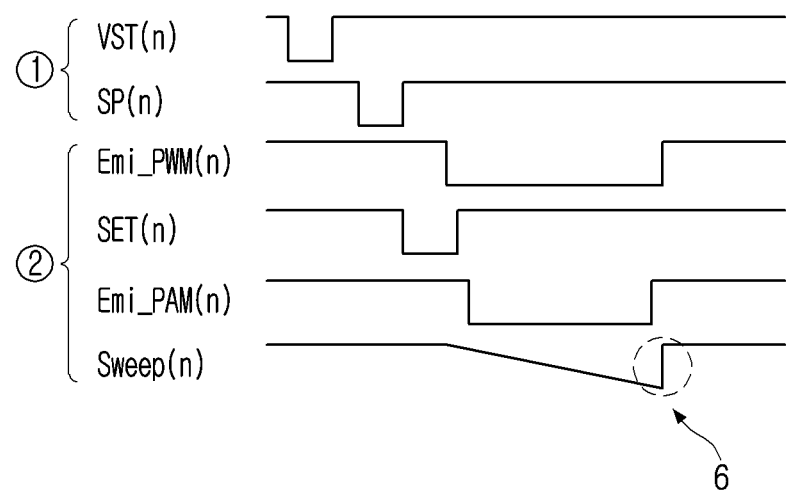
FIG. 8B is a timing diagram for gate signals described above with reference to FIG. 8A, according to an embodiment of the present disclosure.

In the above signals, (n) may represent an n-th row line. As described above, the driving unit 500 may drive the display panel 110 for each row line (e.g., each scan line or each gate line), and the above-mentioned control signals VST(n), SP(n), SET(n), Emi_PWM(n), Sweep(n), and Emi_PAM(n) may be applied to all the subpixel circuits 110 included in the n-th row line in the same order described below as shown in FIG. 8B.

In some embodiments, the above-mentioned control signals (e.g., scan signals, emission signals) may be applied from the gate driver, and referred to as gate signals.

Vsig(m) R/G/B may represent the PWM data voltage for each of R, G, and B subpixels of a pixel included in an m-th column line. The above-mentioned gate signals may be signals for the n-th row line, and Vsig(m) R/G/B shown in FIG. 8A may thus represent the PWM data voltages (e.g., the PWM data voltage for each of the time division multiplexed R, G, and B subpixels) applied to the pixel positioned at an intersection of the n-th row line and the m-th column line.

In some embodiments, Vsig(m) R/G/B may be applied from the data driver. Alternatively or additionally, Vsig(m)

R/G/B may use, for example, a voltage between +10 V (e.g., black) and +15 V (e.g., full white), and is not limited thereto.

In some embodiments, the subpixel circuit 110 shown in FIG. 8A shows the subpixel circuit 110 corresponding to any one of the R, G, and B subpixels (e.g., R subpixel), and only the PWM data voltage for the R subpixel among the time division multiplexed PWM data voltages may thus be selected through the DeMUX circuit (not shown) and applied to the subpixel circuit 110.

VPAM_R/G/B may represent the constant current generator voltage for each of R, G, and B subpixels included in the display panel 100. As described above, the same constant current generator data voltage may be applied to the display panel 100.

However, the same constant current generator data voltage may represent that the same constant current generator data voltage is applied to the same type of subpixels included in the display panel 100, and does not represent that the same constant current generator data voltage needs to be applied to all subpixels of different types such as R, G, and B. The R, G, and B subpixels may have different characteristics based on the type of the subpixel, and the constant current generator data voltage may thus be changed based on the type of the subpixel. Even in this case, the same constant current generator data voltage may be applied to the same type of subpixels regardless of the column line or the row line.

According to an embodiment of the present disclosure, the constant current generator data voltage may be directly applied for each type of subpixel from the power IC, rather than being applied from the data driver like the PWM data voltage.

That is, the same constant current generator data voltage may be applied to the same type of subpixels regardless of the column line or the row line, and the DC voltage may thus be used as the constant current generator data voltage. Therefore, for example, three types of DC voltages (e.g., +5.1 V, +4.8 V, and +5.0 V) respectively corresponding to the R, G, and B subpixels may be individually and directly applied from a driving voltage circuit to each of the R, G, and B subpixel circuits of the display panel 100. In this case, there may be no need for a separate data driver or DeMUX circuit to apply the constant current generator data voltage to the subpixel circuit 110.

According to an embodiment, it may be preferred to use the same constant current generator voltage for different types of subpixels. In this case, the same constant current generator data voltage may be applied to the different types of subpixels.

FIG. 8B is a timing diagram for the gate signals described above with reference to FIG. 8A.

VST(n) and SP(n) (0) among the gate signals shown in FIG. 8B may be related to the operation of setting the data to the subpixel circuit 110, and may be referred to as the scan signal by being distinguished from the emission signal. Alternatively or additionally, Emi_PWM(n), SET(n), Emi_PAM(n) and Sweep(n) (0) among the gate signals shown in FIG. 7C may be related to a light emission operation of the sub-pixel circuit 110, and may be referred to as the emission signal.

According to an embodiment of the present disclosure, for one image frame, the data setting section may be performed once, and the light emission section may be performed several times. Accordingly, for one image frame, the driving unit 500 may apply the scan signal ① to each row line of the display panel 100 once in the row-line order, and apply the emission signal ② to each row line of the display panel 100 several times in the row-line order.

Figure 8C:
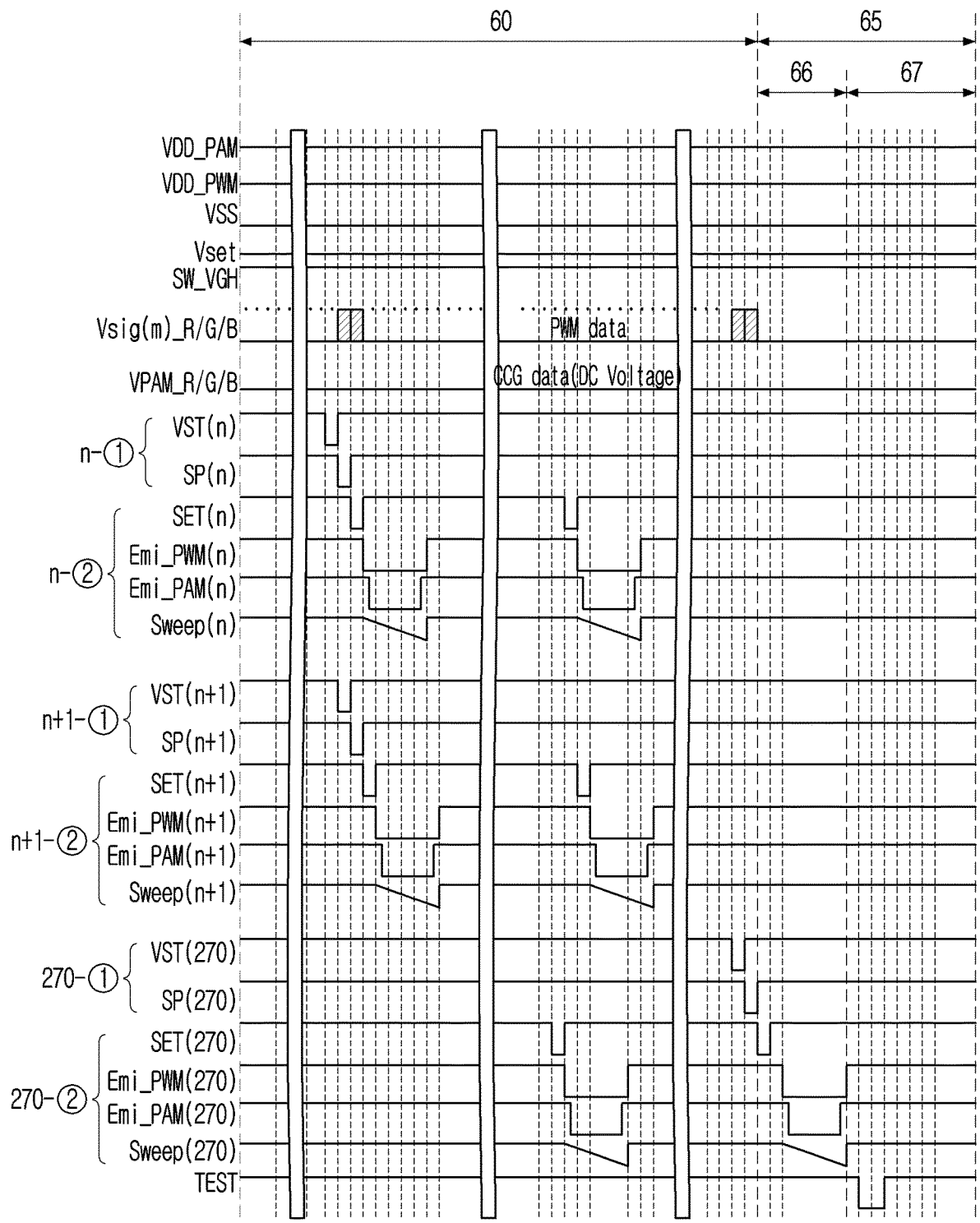
FIG. 8C is a timing diagram of various signals for driving a display panel including the subpixel circuit of FIG. 8A during one image frame period, according to an embodiment of the present disclosure.

FIG. 8C is a timing diagram of various signals for driving the display panel 100 including the subpixel circuit 110 of FIG. 8A during one image frame period. FIG. 8C exemplifies a case where the display panel 100 includes 270 row lines.

As shown in reference numbers n-①, n+1-① to 270-②, the scan signals VST(n) and SP(n) for the data setting operation may be applied once to each row line in the row-line order during one frame time.

Alternatively or additionally, as shown in reference numbers n-②, n+1-② to 270-②, the emission signals Emi_PWM(n), SET(n), Emi_PAM(n), and Sweep(n) for the light emission operation may be applied to each row line several times.

Hereinafter, a detailed operation of the subpixel circuit 110 is described with reference to FIGS. 8A and 8C together.

The data setting section may start at each row line. Here, the driving unit 500 may first turn on the first driving transistor T16 included in the constant current generator circuit 111 and the second driving transistor T6 included in the PWM circuit 112. To this end, the driving unit 500 may apply the low voltage (e.g., −3 V) to the subpixel circuit 110 through the VST(n) signal.

Referring to FIG. 8A, the second driving transistor T6 may be turned on when the low voltage is applied to the gate terminal (hereinafter, referred to as the node A) of the second driving transistor T6 through a turned-on transistor T2 based on the VST(n) signal. Alternatively or additionally, the first driving transistor T16 may be turned on when the low voltage is applied to the gate terminal (hereinafter, referred to as the node B) of the first driving transistor T16 through a turned-on transistor T11 based on the VST(n) signal.

In some embodiments, the transistor T10 may also be turned on when the low voltage (e.g., −3 V) is applied to the subpixel circuit 110 through the VST(n) signal, and the voltage VDD_PWM (hereinafter, referred to as the second driving voltage (e.g., +10 V)) may be applied to the other end of a capacitor C2 whose one end is connected to the node B through the turned-on transistor T10. Here, the second driving voltage may become a reference potential for setting the constant current generator data voltage to be performed based on the SP(n) signal.

The driving unit 500 may input the data voltage to each of the nodes "A" and "B" when the first and second driving transistors T16 and T6 are turned on through the VST(n) signal in the data setting section. To this end, the driving unit 500 may apply the low voltage to the subpixel circuit 110 through the SP(n) signal.

Transistors T3 and T4 of the PWM circuit 112 may be turned on when the low voltage is applied to the subpixel circuit 110 through the SP(n) signal. Accordingly, the PWM data voltage may be applied to the node A from a data signal line Vsig(m) R/G/B through the turned-on transistor T3, the turned-on second driving transistor T6, and the turned-on transistor T4.

Here, the PWM data voltage applied from the driving unit 500 (e.g., the data driver) is not set to the node A as it is, and the PWM data voltage (e.g., the sum of the PWM data voltage and the threshold voltage of the second driving transistor T6) for which the threshold voltage of the second driving transistor T6 is compensated may be set to the node A.

For example, the PWM data voltage applied to a source terminal of the transistor T3 may be input to the internal compensation unit 12 when the transistors T3 and T4 are turned on based on the SP(n) signal. Here, the second driving transistor T6 may be fully turned on through the VST(n) signal, and in this state, the input PWM data voltage may start to be input to the node A while sequentially passing through the transistor T3, the second driving transistor T6, and the transistor T4. That is, the voltage at the node A may start to rise from the low voltage.

However, the voltage at the node A may not rise to the input PWM data voltage, but rise only to the voltage corresponding to the sum of the PWM data voltage and the threshold voltage of the second driving transistor T6. The reason may be that the voltage at the node A may be sufficiently low (e.g., −3 V) at a timing when the PWM data voltage starts to be input to the internal compensation circuit 12, the second driving transistor T6 may thus be fully turned-on in this state, a sufficient current may thus flow, and the voltage at the node A may thus smoothly rise. However, a deviation in the voltage of the gate terminal (or the node A) and source terminal of the second driving transistor T6 may be decreased as the voltage at the node A rises, and the flow of the current may be decreased. As a result, the second driving transistor T6 may be turned off to stop the flow of current when the deviation in the voltage of the gate terminal and source terminal of the second driving transistor T6 reaches the threshold voltage of the second driving transistor T6.

That is, the PWM data voltage may be applied to the source terminal of the second driving transistor T6 through the turned-on transistor T3, and the voltage at the node A may rise only to the voltage that is the sum of the PWM data voltage and the threshold voltage of the second driving transistor T6.

In some embodiments, the transistors T13 and T14 of the constant current generator circuit 111 may also be turned on when the low voltage is applied to the subpixel circuit 110 through a SP(n) signal line. Accordingly, the constant current generator data voltage may be applied to the node B from the data signal line VPAM_R/G/B through a turned-on transistor T13, the turned-on first driving transistor T16, and the turned-on transistor T4.

Here, for at least a similar reason as described above in the description of the node A, the constant current generator data voltage applied from the driving unit 500 (e.g., the power IC) is not set to the node B as it is, and the constant current generator data voltage (e.g., the sum of the constant current generator data voltage and the threshold voltage of the first driving transistor T16) for which the threshold voltage of the first driving transistor T16 is compensated may be set to the node B.

In some embodiments, the transistor T9 may also be turned on when the low voltage is applied to the subpixel circuit 110 through the SP(n) signal line. Here, the second driving voltage VDD_PWM may be applied to the other end of the capacitor C2 through the turned-on transistor T9, and it may thus be possible to maintain the reference potential for the constant current generator data voltage (e.g., the sum of the constant current generator data voltage and the threshold voltage of the first driving transistor T16) set at the B node as it is.

In some embodiments, the PWM data voltage may have a value of the second driving voltage VDD_PWM or more. Accordingly, the second driving transistor T6 may maintain to be turned off while the PWM data voltage is set at the node A as long as the PWM data voltage does not correspond to the black grayscale. In addition, the constant current generator voltage may be lower than the second driving voltage VDD_PWM. Accordingly, the first driving transistor T16 may be maintained to be turned on while the constant current generator data voltage is set at the node B.

The driving unit 500 may first turn on the first switching transistor T17 to emit the inorganic light-emitting element when the data voltage is completely set to each of the constant current generator circuit 111 and the PWM circuit 112. To this end, the driving unit 500 may apply the low voltage to the reset unit 13 (in detail, a transistor T8 of the reset unit 13) through the SET(n) signal.

The Vset voltage may be charged in a capacitor C3 through the turned-on transistor T8 when the low voltage is applied to the transistor T8 along a SET(n) signal line. As described above, Vset may represent the low voltage (e.g., −3 V), and the low voltage may be applied to a gate terminal (hereinafter, referred to as a node C) of the first switching transistor T17 to turn on the first switching transistor T17 when the Vset voltage is charged in the capacitor C3.

In some embodiments, the reset unit 13 may be operated independently of the rest of the circuit components until the low voltage is applied through an Emi_PWM(n) signal line, and the low voltage applied through the SET(n) signal line may thus be applied before the timing shown in FIG. 8B or FIG. 8C, according to an embodiment.

When the first switching transistor T17 is turned on, the driving unit 500 may emit light of the inorganic light-emitting element 120 based on the voltage set to the node A or the node B. To this end, the driving unit 500 may apply the low voltage to the subpixel circuit 110 through the Emi_PWM(n) and Emi_PAM(n) signal lines, and apply the sweep voltage to the subpixel circuit 110 through a Sweep (n) signal line.

The following description describes an operation of the constant current generator circuit 111 based on the signals applied from the driving unit 500 during the light emission section.

The constant current generator circuit 111 may provide the constant current to the inorganic light-emitting element 120 based on the voltage set to the node B.

For example, the low voltage may be applied to their gate terminals through Emi_PWM(n) and Emi_PAM(n) signal lines during the light emission section, the transistor T15 and the second switching transistor T18 may thus be turned on.

In some embodiments, the first switching transistor T17 may be turned based on the SET(n) signal.

Alternatively or additionally, the voltage that is the sum of the constant current generator data voltage (e.g., +5 V) and the threshold voltage of the first driving transistor T16 may be applied to the node B, and in this state, VDD_PAM (hereinafter, referred to as the first driving voltage (e.g., +10 V)) may be applied to the source terminal of the first driving transistor T16 through the turned-on transistor T15 based on the Emi_PWM(n) signal. Here, a voltage less than the threshold voltage of the first driving transistor T16 may be applied between the gate terminal and source terminal of the first driving transistor T16, and the first driving transistor T16 may thus be maintained to be turned on. For example, a p-type metal oxide semiconductor field-effect transistor (PMOSFET) may have a threshold voltage having a negative value, and may be turned on when a voltage less than the threshold voltage is applied between the gate terminal and source terminal thereof, and turned off when a voltage more than the threshold voltage is applied therebetween.

Accordingly, the first driving voltage may be applied to the anode terminal of the inorganic light-emitting element 120 through the turned-on transistor T15, the turned-on first driving transistor T16, the turned-on first switching transistor T17, and the turned-on second switching transistor T18, and a potential difference more than a forward voltage Vf may occur in both ends of the inorganic light-emitting element 120. Accordingly, the driving current (e.g., constant current) may flow through the inorganic light-emitting element 120 and the inorganic light-emitting element 120 may start to emit light. Here, the magnitude of the driving current (e.g., constant current) that makes the inorganic light-emitting element 120 emit light may correspond to that of the constant current generator data voltage, and may have a value independent of the threshold voltage of the first driving transistor T16.

In some embodiments, the driving current may need to be provided to the inorganic light-emitting element 120 in the light emission section, and the driving voltage applied to the constant current generator circuit 111 may thus be changed from the second driving voltage VDD_PWM to the first driving voltage VDD_PAM. Referring to FIG. 8A, it may be seen that the first driving voltage VDD_PAM is applied to the other end of the capacitor C2 through the turned-on transistors T12 and T15 when the low voltage is applied to the transistors T12 and T15 based on the Emi_PWM(n) signal.

As described above, the voltage drop may occur in the first driving voltage due to the IR drop occurring while the driving current flows to the inorganic light-emitting element 120. However, the voltage between the gate terminal and source terminal of the first driving transistor T16 may be maintained the same as the voltage set in the data setting section regardless of a voltage drop amount (e.g., IR drop amount) of the first driving voltage even when the voltage drop occurs in the first driving voltage. The reason may be that the voltage at the node B may also be changed by being coupled through the capacitor C2 by a change amount of any voltage even when the voltage applied to the other end of the capacitor C2 is changed to the any voltage.

Therefore, according to embodiments of the present disclosure, the second driving voltage without the voltage drop may be applied to the constant current generator circuit 111 in the data setting section, and the accurate constant current generator data voltage may be set to the constant current generator circuit 111 regardless of the voltage drop in the first driving voltage. In some embodiments, the first driving voltage at which the voltage drop occurs may be applied to the constant current generator circuit 111 in the light emission section. However, as described above, the voltage between the gate terminal and source terminal of the first driving transistor T16 may be maintained regardless of the voltage drop in the first driving voltage, and the constant current generator circuit 111 may thus be accurately operated based on the voltage set in the data setting section.

The following description describes an operation of the PWM circuit 112 based on the signals applied from the driving unit 500 during the light emission section.

The PWM circuit 112 may control light emission time of the inorganic light-emitting element 120 based on the voltage set to the node A. For example, the PWM circuit 112 may control the off operation of the first switching transistor T17 based on the voltage set to the node A, and the constant current generator circuit 111 may thus control time when the constant current provided to the inorganic light-emitting element 120 flows through the inorganic light-emitting element 120.

In some embodiments, the inorganic light-emitting element 120 may start to emit light when the constant current generator circuit 111 provides the constant current to the inorganic light-emitting element 120. For example, the second driving voltage VDD_PWM may not be applied to the node C even when the transistors T5 and T7 are turned on based on the Emi_PWM(n) signal. The reason may be that, as described above, the second driving transistor T6 is maintained to be turned off while the PWM data voltage is set unless the PWM data voltage is set to correspond to the black grayscale. Accordingly, the first switching transistor T17 may be continuously turned on based on the SET(n) signal as described above, and the constant current provided by the constant current generator circuit 111 may continuously flow through the inorganic light-emitting element 120.

That is, the transistor T5 may be turned on based on the Emi_PWM(n) signal, and in this case, the second driving voltage VDD_PWM may be applied to the source terminal of the second driving transistor T6 through the turned-on transistor T5.

For example, as described above, the voltage between +10 V (e.g., black) and +15 V (e.g., full white) may be used as the PWM data voltage, and in this case, a voltage between +9 V (e.g., black) and +14 V (e.g., full white) may be set to the node A during the data setting section assuming that the threshold voltage of the second driving transistor T6 is −1 V. The second driving voltage (e.g., +10 V) may then be applied to the source terminal of the second driving transistor T6 based on the Emi_PWM(n) signal, and in this case, the voltage between the gate terminal and source terminal of the second driving transistor T6 may be the threshold voltage (−1 V) of the second driving transistor T6 or more (−1 V to +4 V). Accordingly, the second driving voltage may be applied to the source terminal of the second driving transistor T6 (e.g., the low voltage is applied to the subpixel circuit 110 based on the Emi_PWM(n) signal). In this case, the second driving transistor T6 may be maintained to be turned off unless the PWM data voltage corresponding to the black grayscale is set to the node A, the first switching transistor T17 may be maintained to be turned on as long as the second driving transistor T6 is maintained to be turned off, and the inorganic light-emitting element 120 may thus maintain the light emission. In some embodiments, the PWM data voltage corresponding to the black grayscale may be set to the node A. In this case, the second driving transistor T6 may be immediately turned on when the second driving voltage is applied to the source terminal of the second driving transistor T6.

However, the voltage at the node A may be changed based on the sweep signal Sweep(n), and the voltage between the gate terminal and source terminal of the second driving transistor T6 may be decreased to the threshold voltage (−1 V) of the second driving transistor T6 or less. In this case, the second driving transistor T6 may be turned on, the second driving voltage VDD_PWM, for example, +10 V may be applied to the node C, and the first switching transistor T17 may thus be turned off. Accordingly, the constant current may no longer flow through the inorganic light-emitting element 120, and the inorganic light-emitting element 120 may stop the light emission.

Referring to FIG. 8B or 8C, it may be seen that a linearly changed sweep signal Sweep(n) (e.g., sweep voltage linearly decreased from the high voltage (e.g., +15 V) to the low voltage (e.g., +10 V)) is applied to the subpixel circuit 110 while the low voltage is applied to the subpixel circuit 110 based on the Emi_PWM(n) signal.

A change in the voltage of the sweep signal may be coupled to the node A through a capacitor C1, and the voltage at the node A may thus be changed based on the sweep signal.

The second driving transistor T6 may be turned on when the voltage at the node A is decreased based on the sweep signal and becomes the voltage corresponding to the sum of the second driving voltage and the threshold voltage of the second driving transistor T6 (e.g., the voltage between the gate terminal and source terminal of the second driving transistor T6 becomes less than the threshold voltage of the second driving transistor T6).

Accordingly, the second driving voltage which is the high voltage may be applied to the node C. That is, the gate terminal of the first switching transistor T17, through the turned-on transistor T5, the turned-on second driving transistor T6, and the turned-on transistor T7, and the first switching transistor T17 may thus be turned off.

The same slope of the sweep signal may be applied to each subpixel circuit 110, and time taken for the turned-off second driving transistor T16 to be turned on in the light emission section may depend on the PWM data voltage set to the node A.

In this way, the PWM circuit 112 may control the light emission time of the inorganic light-emitting element 120 based on the voltage set to the node A.

In some embodiments, the corresponding light emission section may end when the application of the low voltage to the subpixel circuit 110 through the Emi_PWM(n) and Emi_PAM(n) signals is completed, and the application of the sweep voltage based on the Sweep(n) signal may be completed.

Here, as indicated by reference numeral 6 of FIG. 8B, it may be seen that the voltage of the sweep signal may be restored to the voltage before its linear change when the light emission section ends (e.g., when the application of the low voltage through the Emi_PWM(n) signal is completed).

As described above, the change in the voltage of the sweep signal may be coupled to the node A through the capacitor C1, and the voltage of the node A may also be restored when the voltage of the sweep signal is restored.

Therefore, according to an embodiment of the present disclosure, the voltage at the node A, which is linearly changed based on the sweep signal during the first light emission section among the plurality of light emission sections may be restored as the voltage of the sweep signal is restored before the second light emission section, which is the next light emission section, begins.

That is, the voltage at the node A may become the voltage corresponding to the sum of the PWM data voltage and the threshold voltage of the second driving transistor T6 during the data setting section, may be linearly changed based on the change in the voltage of the sweep signal during the light emission section, and may be restored to the voltage corresponding to the sum of the PWM data voltage and the threshold voltage of the second driving transistor T6 as the sweep voltage is restored when the light emission section ends. Accordingly, the same light emission operation may be performed in the next light emission section.

Alternatively or additionally, the first switching transistor T17 may need to first be turned on for the inorganic light-emitting element 120 to emit light during the light emission section. However, as described above, the second driving voltage may be applied to the node C to turn off the first switching transistor T17 while one light emission section among the plurality of light emission sections is performed. Therefore, in order to perform the next light emission section, the voltage at the node C may need to be reset to the low voltage to turn on the first switching transistor T17.

To this end, the next light emission section may start, and in this case, the driving unit 500 may apply the low voltage again to a gate terminal of the transistor T8 through the SET(n) signal. Accordingly, the Vset voltage which is the low voltage may be applied to the node C, and the first switching transistor T17 may thus be turned on again.

The first switching transistor T17 may be turned on through the SET(n) signal, and the driving unit 500 may then apply the low voltage to the subpixel circuit 110 through the Emi_PWM(n) and Emi_PAM(n) signals, and apply the sweep voltage to the subpixel circuit 110 through the Sweep (n) signal, thereby controlling the light emission operation of the inorganic light-emitting element 120 in the next light emission section by using the same way as described above.

Referring to the timing diagrams of FIGS. 8B and 8C, it may be seen that there are deviations in the timing when the low voltage starts to be applied to the Emi_PWM(n) signal and the timing when the low voltage is applied to the Emi_PAM(n) signal. This deviation may occur to implement the black grayscale.

For example, the PWM data voltage corresponding to the black grayscale may be set at the node A, and in this case, the first switching transistor T17 may need to be turned off as soon as the light emission section starts. That is, the second driving voltage may be applied to the node C through the turned-on transistor T5, the turned-on second driving transistor T6, and the turned-on transistor T7, and the first switching transistor T17 may thus need to be turned off immediately at the timing when the low voltage is applied thereto through the Emi_PWM(n) signal. For example, no driving current may flow through the inorganic light-emitting element 120 to thus express the black grayscale when the first switching transistor T17 is immediately turned off.

However, it may take time for the second driving voltage VDD_PWM to be charged at the node C, and the first switching transistor T17 may not be immediately turned off That is, the transistor T17 may be maintained to be turned on until the voltage capable of turning off the first switching transistor T17 is charged to the node C after the second driving voltage VDD_PWM is applied to the node C to start charging the capacitor C3. Accordingly, the driving current may leak from the first switching transistor T17 to the inorganic light-emitting element 120.

As a result, the driving current leaked from the first switching transistor T17 may flow through the inorganic light-emitting element 120 for certain time, and thus making it unlikely to implement an accurate black grayscale even though the PWM data voltage corresponding to the black grayscale is set to the node A when the first switching transistor T17 and the inorganic light-emitting element 120 are directly connected with each other without the second switching transistor T18.

According to an embodiment of the present disclosure, the second switching transistor T18 may be positioned between the first switching transistor T17 and the inorganic light-emitting element 120. Alternatively or additionally, the driving unit 500 may apply the Emi_PAM(n) signal so that the second switching transistor T18 is turned on after a certain time elapses from the timing when the low voltage is applied to the Emi_PWM(n) signal. Here, the predetermined time may be time or more when the voltage at the node C is charged from the Vset voltage to the voltage capable of turning off the first switching transistor T17.

In this case, the second switching transistor T18 may block the leakage current occurring because the first switching transistor T17 is not turned off immediately even though the PWM data voltage corresponding to the black grayscale is set to the node A. Accordingly, the black grayscale may be implemented.

Referring to FIG. 8C, it may be seen that the emission signal Emi_PAM(n) for each row line has the high-level voltage in the non-light emission section 67. When the high level Emi_PAM(n) signal is applied thereto, the second switching transistor T18 may be turned off, and no driving current may flow through the inorganic light-emitting element 120. In this way, the non-light emission section 67 may be implemented by making the emission signal Emi_PAM (n) for each row line have a high level in a predetermined section in the blanking period 65.

Referring to FIG. 8A, it may be seen that when the low voltage is applied through the SP(n) signal line, a transistor T1 is turned on and a high voltage SW_VGH of the sweep signal is applied to a node X. Through this operation, it may be possible to minimize luminance non-uniformity and horizontal crosstalk phenomenons that may occur by a sweep rod.

Figure 9A:
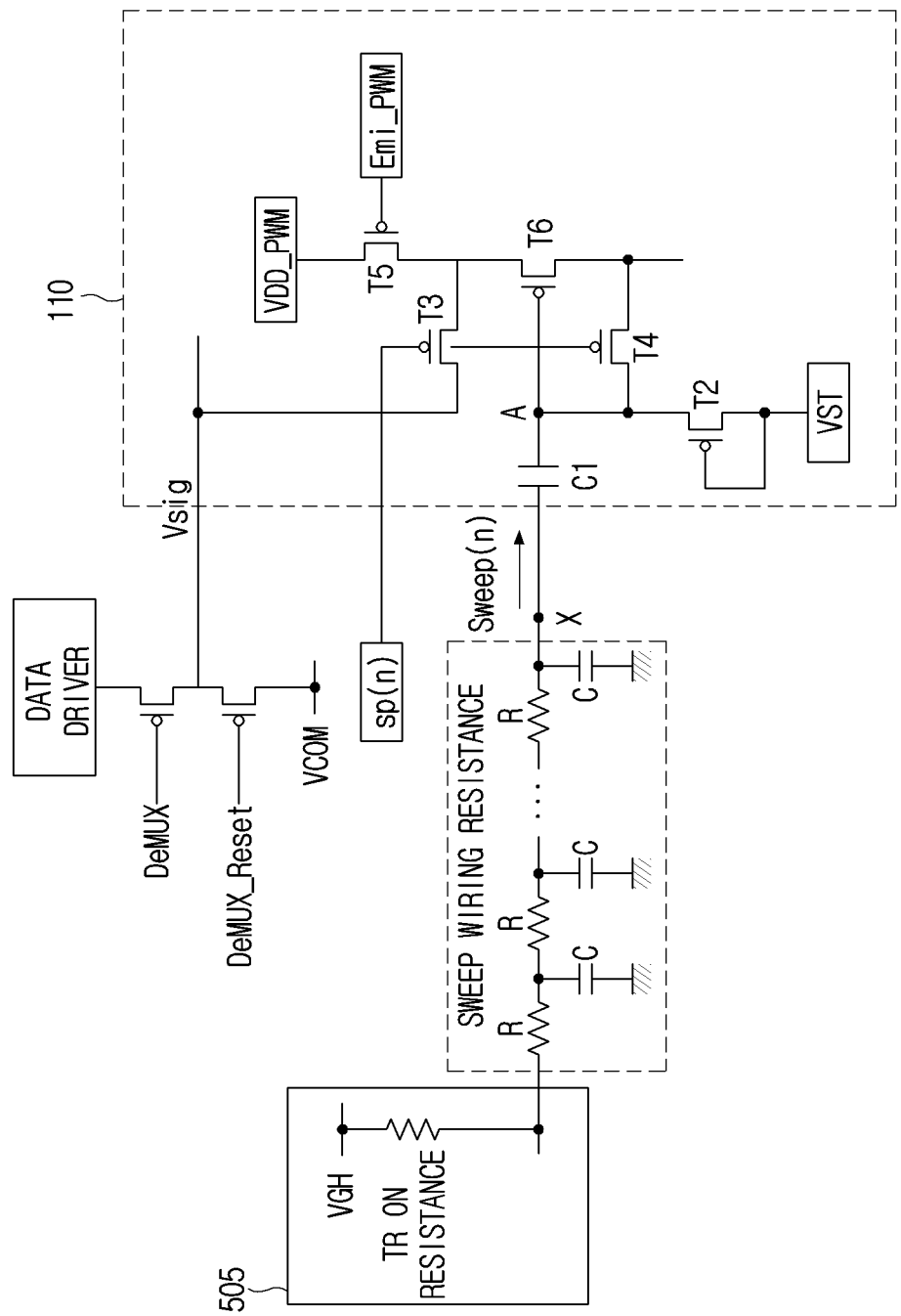
FIG. 9A is a view for explaining luminance non-uniformity and horizontal crosstalk phenomenons that may occur by a sweep rod, according to an embodiment of the present disclosure.
Figure 9B:
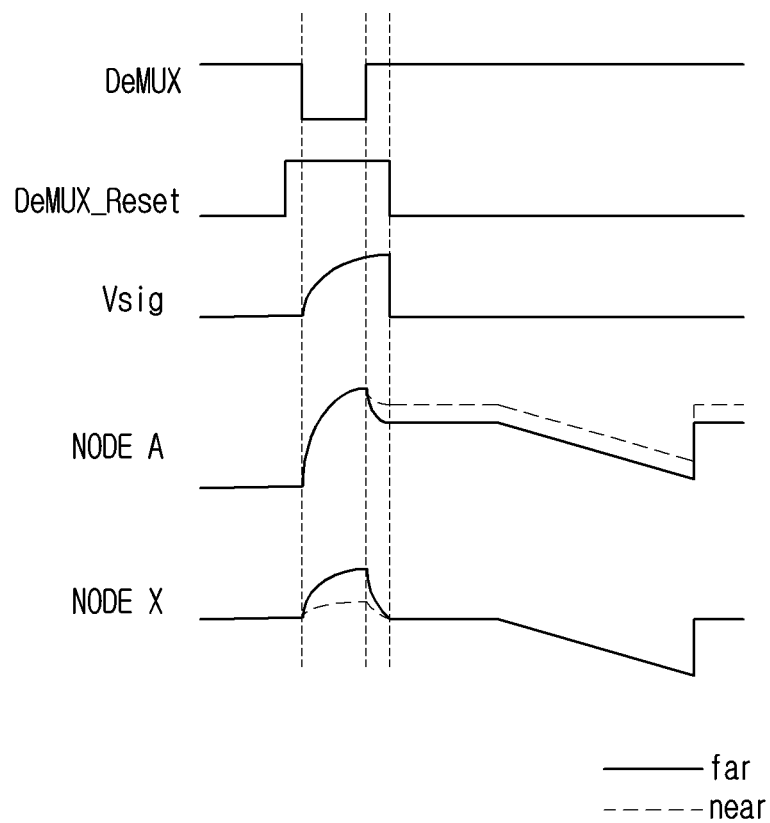
FIG. 9B is a view for explaining the luminance non-uniformity and horizontal crosstalk phenomenons that may occur by the sweep rod, according to an embodiment of the present disclosure.

FIGS. 9A and 9B are views for explaining the luminance non-uniformity and horizontal crosstalk phenomenons that may occur by the sweep rod.

In various embodiments of the present disclosure, the light emission sections may be successively performed in the row-line order of the display panel 100. It is thus difficult to apply the emission signal through a global signal, and each row line may require an emission driver circuit for providing the emission signal corresponding to each row line.

For example, the sweep signals Sweep(n) for the PWM driving of the display panel 100 may also be successively provided to the display panel 100 in the row-line order through the emission driver circuits corresponding to the respective row lines. Hereinafter, the emission driver circuit for providing the sweep signal sweep(n) may be referred to as a sweep driver circuit.

In this case, the change in the voltage at the node A is coupled through the capacitor C1 while the PWM data voltage is set to the gate terminal of the second driving transistor T6 (e.g., the node A) thereby changing a voltage of a Sweep(n) signal line.

The change in the voltage that is generated in the Sweep (n) signal line may then be restored, and accordingly, the voltage set at the node A may be changed conversely. Here, a change amount of the voltage at the node A may depend on the sweep rod as described below, which may cause the luminance non-uniformity and the horizontal crosstalk.

FIG. 9A shows that a sweep driver circuit 505 corresponding to one row line is connected with the subpixel circuit 110 through a wiring. Here, FIG. 9A shows a case where the transistor T1 is removed from the subpixel circuit 110 of FIG. 8A.

As shown in FIG. 9A, the sweep signal Sweep(n) may be transmitted to the subpixel circuit 110 through the sweep driver circuit 505. Here, a sweep wiring resistance (e.g., RC rod) may exist between the sweep driver circuit 505 and the subpixel circuit 110, and a size of the RC rod may be smaller as being closer to the sweep driver circuit 505, and may be larger as being farther away from the sweep driver circuit 505.

FIG. 9B shows waveforms of various signals shown in FIG. 9A. In addition, a term "far" shown in FIG. 9B may represent a change in the voltage at the node A or X of the subpixel circuit 110 positioned farther away from the sweep driver circuit 505, and a term "near" may represent a change in the voltage at the node A or X of the subpixel circuit 110 positioned closer to the sweep driver circuit 505.

The low-level scan signal SP(n) may be applied to the subpixel circuit 110 in the data setting section. For example, the PWM data voltage applied from the data driver applied to the node A through a Vsig wiring, the transistor T3, the second driving transistor T6, and the transistor T4. Here, the PWM data voltage may be the PWM data voltage corresponding to any one of the R, G, and B subpixels that is selected by the DeMUX circuit.

In this process, as shown in FIG. 9B, the voltage at the node A may be changed, and this change may thus be coupled to the node X through the capacitor C1, thereby causing a change in the voltage at the node X, that is, the voltage of the Sweep(n) signal line.

The voltage of the Sweep(n) signal line (or the voltage of the node X) may then be restored to have an original voltage level by the operation of the sweep driver circuit 505, and the change in the voltage at the node X that is generated in this process may be coupled through the capacitor C1, and inversely cause the change in the voltage at the node A.

In particular, it may be seen that due to an effect of the sweep rod, the change in the voltage at the node A may be increased as the node X is positioned farther away from the sweep driver circuit 505 in the subpixel circuit 110.

Therefore, different voltages may be set to the subpixel circuit 110 by the sweep rod even when the same PWM data voltage is applied thereto, which may cause the luminance non-uniformity. Alternatively or additionally, the luminance non-uniformity problem occurring by the sweep rod may cause the horizontal crosstalk from an overall view of the display panel 100.

The above luminance non-uniformity and horizontal crosstalk problems may be caused because the voltage at the node X is changed together when the PWM data voltage is applied to the node A. Therefore, it may be possible to prevent and/or reduce these problems by preventing the voltage at the node X from being changed even when the PWM data voltage is applied to the node A during the data setting section.

Figure 9C:
FIG. 9C is a view showing a high voltage SW_VGH of a sweep signal, according to an embodiment of the present disclosure.

According to an embodiment of the present disclosure, the high voltage SW_VGH of the sweep signal as shown in FIG. 9C may be applied to the node X while the PWM data voltage is set to the node A. Here, the high voltage SW_VGH of the sweep signal may be the global signal equally applied from the power IC to all the subpixel circuits 110 of the display panel 100.

Referring to FIG. 8A, the PWM circuit 112 may include the transistor T1 having a source terminal connected to the SW_VGH signal line, a gate terminal connected to the SP(n) signal line, and a drain terminal connected to the node X. For example, the source terminal of the transistor T1 may be directly connected to a wiring to which the high voltage SW_VGH of the sweep signal from the power IC is applied.

Therefore, the high voltage SW_VGH of the sweep signal applied through the turned-on transistor T1 may be forcibly applied to the node X while the low voltage is applied through the SP(n) signal line and the PWM data voltage is set to the node A, and the voltage at the node X may be maintained as the high voltage SW_VGH of the sweep signal regardless of the change in the voltage of the node A.

In this way, it may be possible to prevent and/or minimize the luminance non-uniformity and horizontal crosstalk phenomenons that may occur by the sweep rod.

Figure 10A:
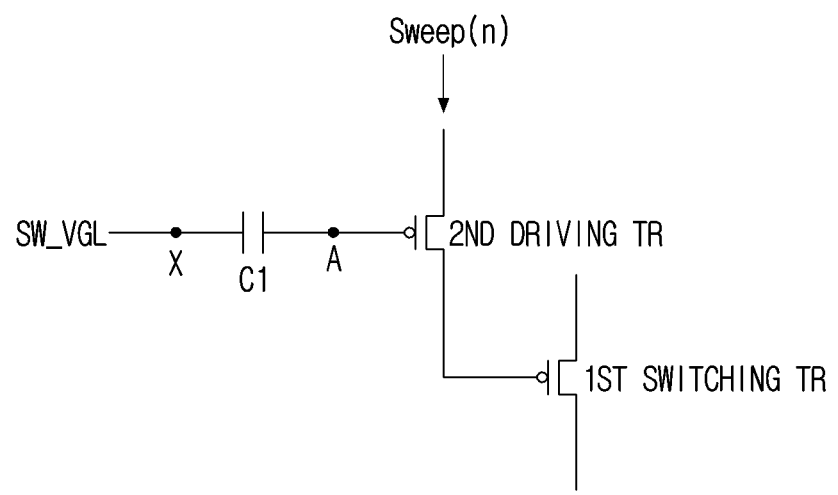
FIG. 10A is a view for explaining that input of a low voltage SW_VGL of the sweep signal is connected to a node X, according to an embodiment of the present disclosure.
Figure 10B:
FIG. 10B is a view showing a low voltage SW_VGL of the sweep signal, according to an embodiment of the present disclosure.

In another optional or additional embodiment to prevent and/or minimize the above-mentioned luminance non-uniformity and horizontal crosstalk problems, it may be possible to consider a method of connecting input of the low voltage SW_VGL of the sweep signal to the node X. FIGS. 10A and 10B are views for explaining that the input of the low voltage SW_VGL of the sweep signal is connected to the node X according to an embodiment of the present disclosure.

As shown in FIG. 10A, the low voltage SW_VGL of the sweep signal may be applied to the node X. Here, the low voltage SW_VGL of the sweep signal may be the global signal that is equally applied from the power IC to all the subpixel circuits 110 of the display panel 100.

For example, the node X may be directly connected to the power IC through a wiring to which the low voltage SW_VGL of the sweep signal is applied. Accordingly, the voltage at the node X may be maintained as the low voltage SW_VGL of the sweep signal without being affected by the coupling through the capacitor C1 even when the voltage at the node A is changed by the application of the PWM data voltage.

As shown in FIG. 10A, the sweep signal Sweep(n) for the PWM driving may be applied to the source terminal of the second driving transistor. Here, the sweep signal Sweep(n) may be a voltage signal linearly increased from the low voltage to the high voltage as shown in FIG. 10B.

As described above, the PWM circuit may control the on/off operation of the first switching transistor through the on/off operation of the second driving transistor, thereby controlling time when the driving current flows through the inorganic light-emitting element 120, which may be also the same in an embodiment of FIG. 10A.

For example, the voltage of the source terminal of the second driving transistor may be increased based on the sweep signal Sweep(n) in a state where the PWM data voltage is set at the node A, and in this case, the deviation in the voltage of the gate terminal and source terminal of the second driving transistor may be decreased.

The decreased deviation in the voltage of the gate terminal and source terminal of the second driving transistor may reach the threshold voltage of the second driving transistor, and in this case, the second driving transistor may be turned on and the first switching transistor may be turned off.

It may be seen that this PWM driving mechanism is the same as that of the above-described embodiment (e.g., an embodiment in which the sweep signal is applied to the node X).

According to an embodiment described with reference to FIGS. 10A and 10B, it may be seen that the above-described luminance non-uniformity and horizontal crosstalk problems by the sweep rod may be prevented and/or minimized. Here, it may be seen that the display panel 100 may be PWM driven without any problem even when the sweep signal is applied to the source terminal of the second driving transistor.

Figure 11A:
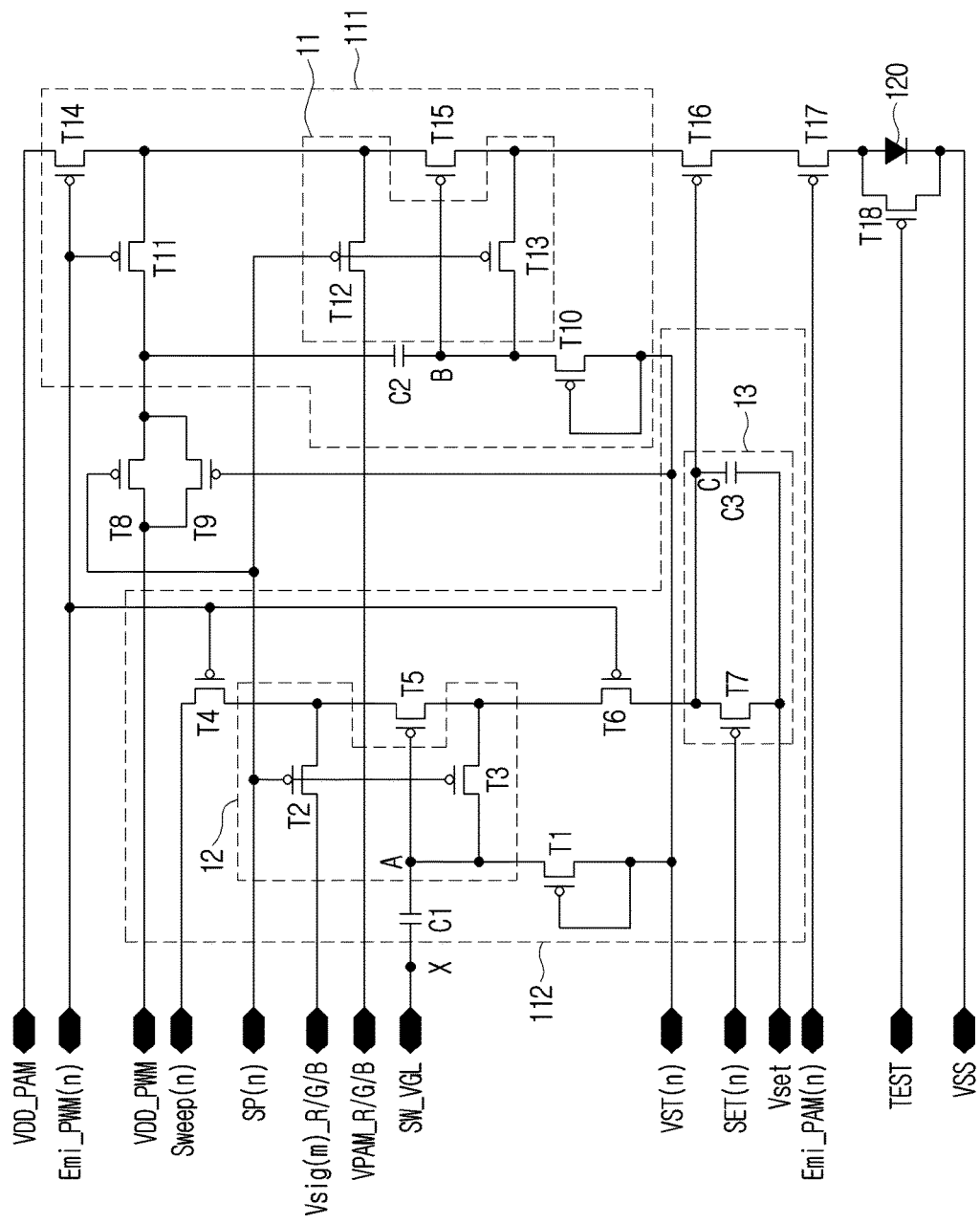
FIG. 11A is a detailed circuit diagram of the subpixel circuit to which the embodiment described above with reference to FIGS. 10A and 10B is applied, according to an embodiment of the present disclosure.
Figure 11B:
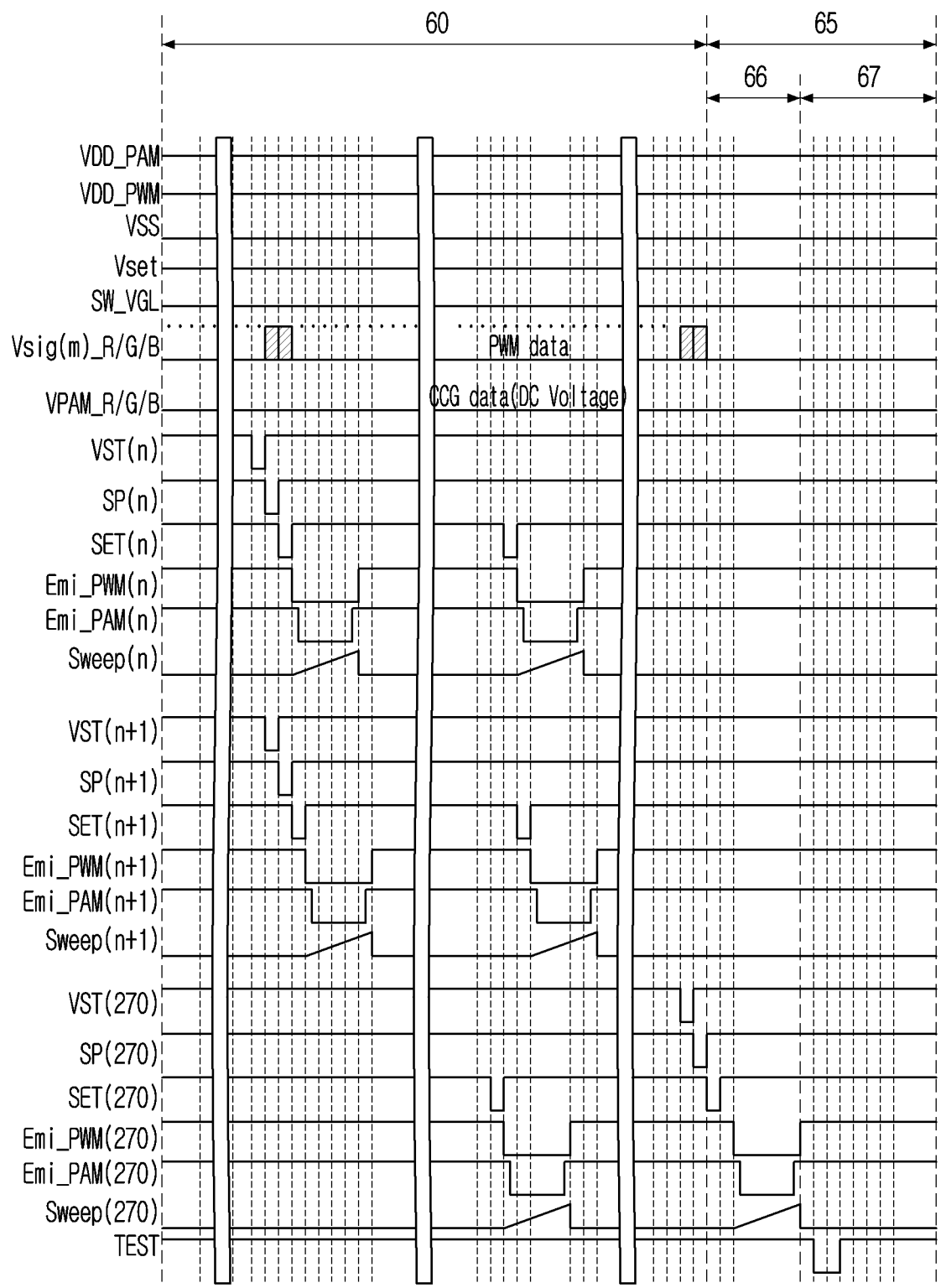
FIG. 11B is a timing diagram of various signals for driving a display panel including the subpixel circuit of FIG. 11A during one image frame period, according to an embodiment of the present disclosure.

FIG. 11A is a detailed circuit diagram of the subpixel circuit 110, according to an embodiment of the present disclosure, to which the embodiment described above with reference to FIGS. 10A and 10B is applied. FIG. 11B is a timing diagram of various signals for driving the display panel 100 including the subpixel circuit of FIG. 11A during one image frame period.

An embodiment shown in FIGS. 11A and 11B has a configuration and an operation principle, which are similar to those described above with reference to FIGS. 8A to 8C, and the following description focuses on its difference by omitting the redundant description.

In the subpixel circuit 110 of FIG. 11A, a SW_VGL signal line may be directly connected to the node X. Therefore, unlike the subpixel circuit of FIG. 8A, there is no need for the transistor T1 for applying the SW_VGH signal to the node X during the data setting section. Referring to FIG. 11A, it may be seen that the transistor does not exist in location corresponding to that of the transistor T1 of FIG. 8A. Accordingly, when comparing the reference numerals of the transistors of FIG. 11A and FIG. 8A with each other, it may be seen that the reference numeral for the transistor in the same location in FIG. 11A is indicated to precede that in FIG. 8A by one.

Meanwhile, the second driving voltage VDD_PWM may be applied to the source terminal of the second driving transistor T6 through the turned-on transistor T5 when the low-level Emi_PWM(n) signal is applied to the subpixel circuit 110 of FIG. 8A in the light emission section, and the sweep signal Sweep(n) may be applied to the node X. However, it may be seen that the sweep signal Sweep(n) (e.g., the sweep voltage linearly changed from the low voltage to the high voltage) is applied to the source terminal of the second driving transistor T5 through the turned-on transistor T4 when the low-level Emi_PWM(n) signal is applied to the subpixel circuit 110 of FIG. 11A in the light emission section, and the low voltage SW_VGL of the sweep signal is applied to the node X.

Here, it may be seen that the sweep signal Sweep(n) applied to the subpixel circuit 110 of FIG. 8A is linearly decreased as shown in FIG. 8B or 8C, the sweep signal Sweep(n) applied to the subpixel circuit 110 of FIG. 11A is linearly increased as shown in FIG. 11B, and there is a deviation from each other.

The following description exemplifies in detail the operation of the PWM circuit 112 based on the sweep signal in an embodiment of FIG. 11A.

For example, a voltage of +13 V (e.g., the PWM data voltage (+14 V)+the threshold voltage (−1 V) of the second driving transistor T5) may be set to the node A during the data setting section. In this state, the sweep signal (e.g., voltage linearly increased from +10 V to +15 V) may be applied to the source terminal of the second driving transistor T5. In this case, the deviation in the voltage of the gate terminal and source terminal of the transistor T5 may be decreased from +3 V to −2 V.

Here, the deviation in the voltage of the gate terminal and source terminal of the second driving transistor T5, which is decreased from +3 V, may reach the threshold voltage (−1 V) of the second driving transistor T5. In this case, the second driving transistor T5 may be turned on, +14 V which is the sweep voltage when the second driving transistor T5 is turned on may be applied to the first switching transistor T16, and the first switching transistor T16 may thus be turned off.

It may be seen that an operation mechanism of the PWM circuit 112 of FIG. 11A is the same as that of the PWM circuit 112 described with reference to FIGS. 8A to 8C except that there is a difference only in the terminal for receiving the sweep signal.

Meanwhile, the rest contents related to the subpixel circuit 110 of FIGS. 11A and 11B and its driving overlap the contents described above in FIGS. 8A to 8C, and a description thereof is thus be omitted.

Hereinafter, the description describes an image distortion phenomenon that may occur at boundary parts of upper and lower modules among the plurality of display modules included in the above-mentioned modular display panel and a driving method of the modular display panel for preventing and/or reducing this phenomenon.

Figure 12:
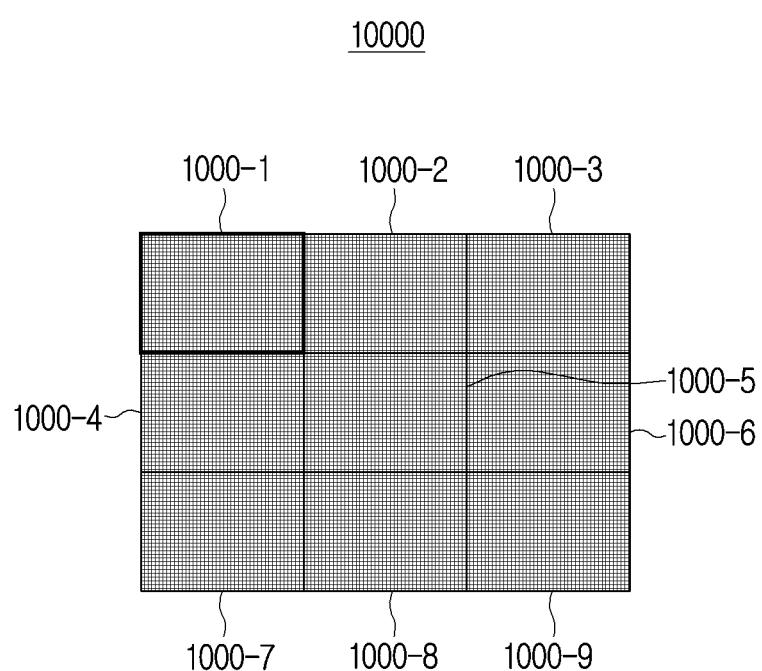
FIG. 12 is a view for schematically explaining a configuration of the display apparatus, according to an embodiment of the present disclosure.

FIG. 12 is a view for schematically explaining a configuration of the display apparatus according to an embodiment of the present disclosure. Referring to FIG. 12, a display apparatus 10000 may include nine display modules (e.g., 1000-1 to 1000-9). Here, as shown in FIG. 12, the display modules 1000-1 to 1000-9 may be assembled with each other or may be arranged in a matrix type to configure one modular display panel.

FIG. 12 illustrates that the display apparatus 10000 includes nine display modules. However, a display apparatus having a different size and/or a different resolution may be implemented by combining different number of display modules with each other.

The configuration and driving method of each of the display modules 1000-1 to 1000-9 may be the same as described above with reference to FIGS. 2 through 11B. For example, as described above, each of the display modules 1000-1 to 1000-9 may be driven by the progressive driving method.

Here, the image distortion may occur at the boundary parts of the upper and lower modules of the modular display panel when all the display modules 1000-1 to 1000-9 are successively driven from the first row line. That is, progressive driving directions of all the display module 1000-1 to 1000-9 may be all from top to bottom. For example, a moving pattern may be displayed on the modular display panel. In this case, a pattern distortion may occur at boundary parts of the display modules 1000-1, 1000-2, and 1000-3, and the display modules 1000-4, 1000-5, and 1000-6, or boundary parts of the display modules 1000-4, 1000-5, and 1000-6 and the display modules 1000-7, 1000-8, and 1000-9.

Figure 13A:
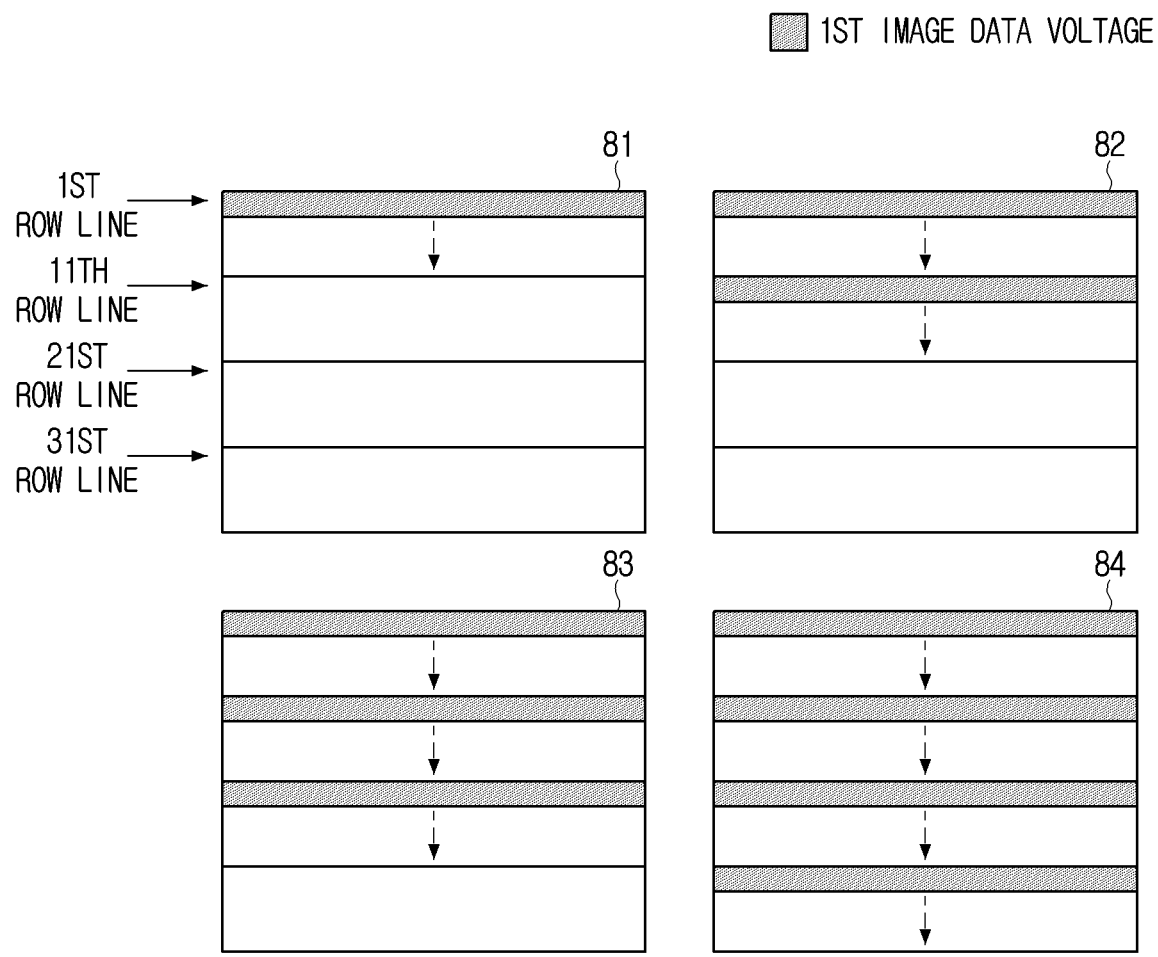
FIG. 13A is a view for explaining a cause of a pattern distortion phenomenon occurring at boundary parts of the display modules, according to an embodiment of the present disclosure.
Figure 13B:
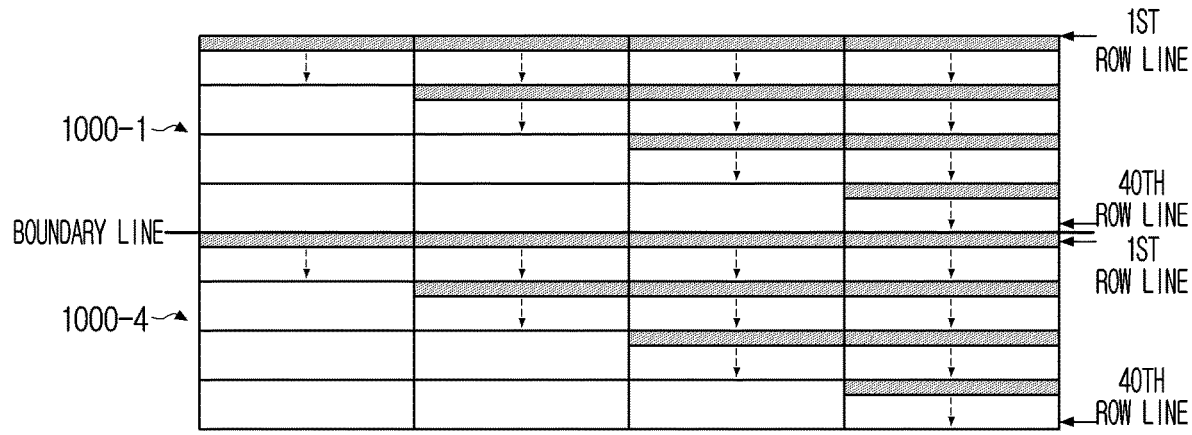
FIG. 13B is a view for explaining the cause of the pattern distortion phenomenon occurring at the boundary parts of the display modules, according to an embodiment of the present disclosure.
Figure 13C:
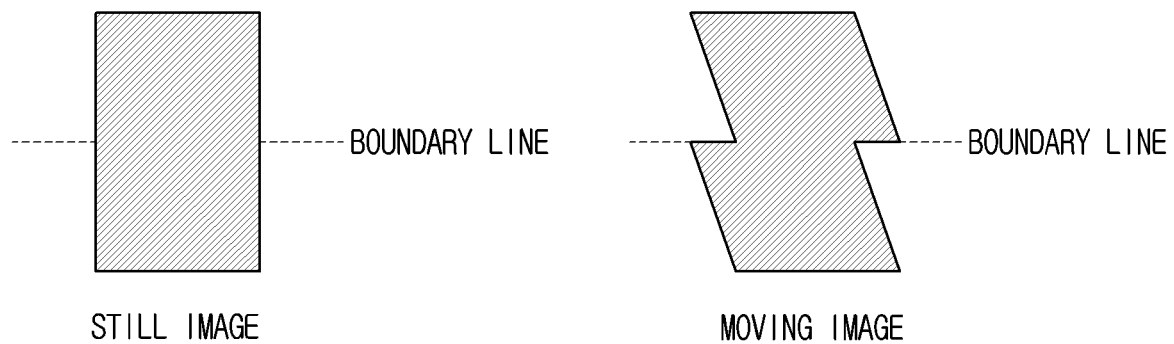
FIG. 13C is a view for explaining the cause of the pattern distortion phenomenon occurring at the boundary parts of the display modules, according to an embodiment of the present disclosure.

FIGS. 13A to 13C are views for explaining a cause of this pattern distortion phenomenon.

FIG. 13A shows a process of performing the light emission section of each row line when in one display module among the plurality of display modules 1000-1 to 1000-9, the first to 40th row lines are successively driven over time during one image frame time. For convenience of illustration, FIG. 13A exemplifies a case where the display module includes the forty row lines and four light emission sections are performed during one image frame time.

In addition, FIG. 13A shows only the light emitting operation of each row line based on the first image data voltage applied during the one image frame time. That is, the description omits the light emitting operation of the row line based on the second image data voltage applied at image frame time before the one image frame.

Referring to FIG. 13A, the first to tenth row lines may successively emit light based on the first image data voltage applied to each row line during the first light emission section. Reference numeral 81 in FIG. 13A denotes this configuration. Here, the 11th to 20th row lines, 21st to 30th row lines, and 31st to 40th row lines may also successively emit light based on the second image data voltage, and the drawing omits its illustration.

The first light emission section of the 11th to 20th row lines may then be performed together with the second light emission section of the first to 10th row lines. In this case, as shown by reference numeral 82 of FIG. 13A, the first to tenth row line and the eleventh to twentieth row lines may each successively emit light based on the first image data voltage.

The third light emission section of the first to 10th row lines, the second light emission section of the 11th to 20th row lines, and the first light emission section of the 21st to 30th row lines may then be performed together. In this case, as shown by reference numeral 83 of FIG. 13A, the first to 10th row lines, the 11th to 20th row lines, and the 21st to 30th row lines may each successively emit light based on the first image data voltage.

The fourth light emission section of the first to 10th row lines, the third light emission section of the 11th to 20th row lines, the second light emission section of the 21st to 30th row lines, and the first light emission section of the 31st to 40th row lines may then be performed together. In this case, as shown by reference numeral 84 of FIG. 13A, the first to 10th row lines, the 11th to 20th row lines, the 21st to 30th row lines, and the 31st to 40th row lines may each successively emit light based on the first image data voltage.

FIG. 13B shows a process of performing the light emission section over time when in two display modules positioned vertically adjacent to each other (e.g., the display modules 1000-1 and 1000-4) adjacent to each other among the plurality of display modules included in the display apparatus 10000 of FIG. 12, the first row line to the 40th row line are successively driven over time during one image frame time.

Referring to FIG. 13B, it may be seen that each of the row lines positioned at the boundary parts of the display modules 1000-1 and 1000-4 based on a boundary line has the different number of light emission sections performed based on the first image data voltage applied during the one image frame time.

For example, it may be seen that the first to tenth row lines of the display module 1000-4 positioned at the lower side performs four light emission sections based on the first image data voltage, while the 31st to 40th row lines of the display module 1000-1 positioned at the upper side performs one light emission section based on the first image data voltage.

Here, the 31st to 40th row lines of the display module 1000-1 may perform the remaining three light emission sections based on the first image data voltage during image frame time after the one image frame time.

As such, a time difference in performing the light emission sections at the boundary parts of the upper and lower display modules for image frame data may cause the distortion occurring at the boundary parts of the modules when a moving image is displayed.

FIG. 13C is a view for explaining the image distortion occurring at the boundary parts of the upper and lower display modules. As shown in FIG. 13C, a rectangular pattern spanning near the boundary line of the upper and lower display modules may be displayed. In this case, the same image frame may be repeated in a still image, and accordingly, the distortion may not occur at the boundary parts of the upper and lower modules. However, the rectangular pattern may be a moving image moving to the right. In this case, as shown on the right side of FIG. 13C, the pattern distortion may occur at the boundary parts of the upper and lower display modules due to the time difference in performing the light emission sections described above.

In some embodiments, the display modules horizontally adjacent to each other in the modular display panel may have the light emission section of the same row line simultaneously performed. Accordingly, the distortion that occurs at the boundary parts of the above-described upper and lower module may not occur.

Figure 14A:
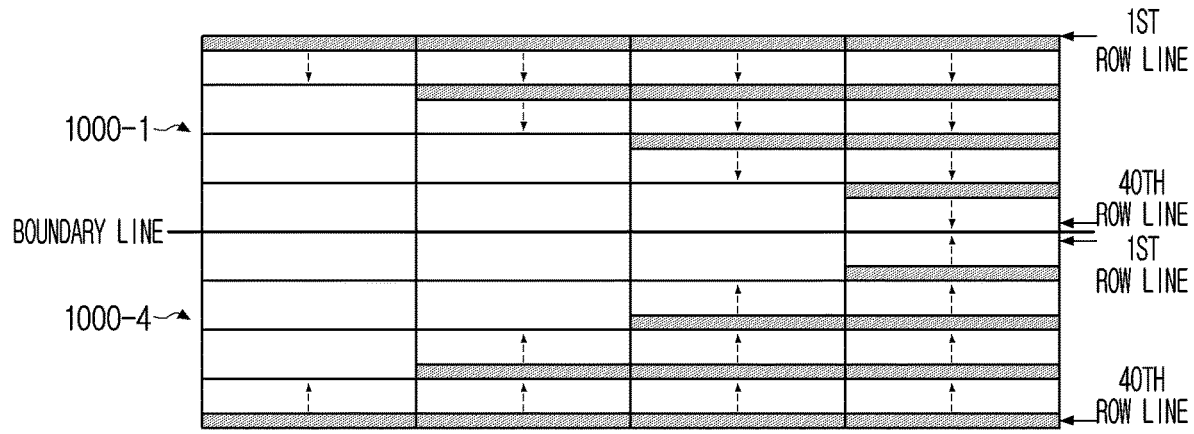
FIG. 14A is a view for explaining a driving method of a modular display panel which may remove or reduce an image distortion phenomenon occurring at the boundary parts of the modules, according to an embodiment of the present disclosure.
Figure 14B:
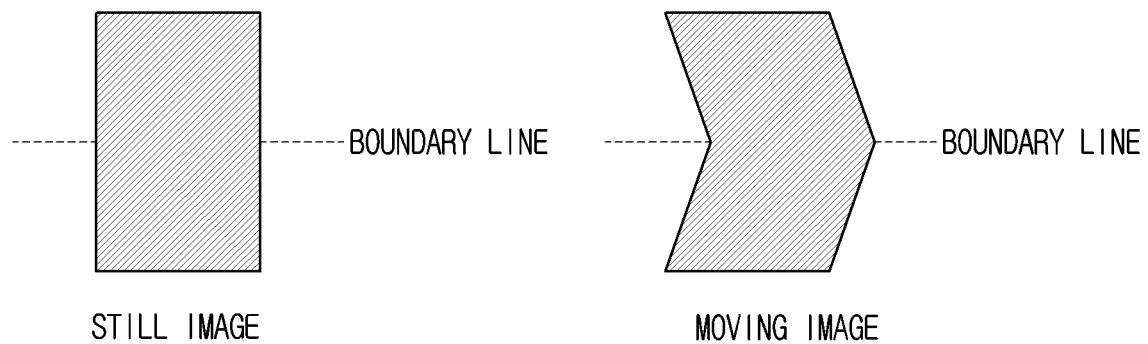
FIG. 14B is a view for explaining a driving method of a modular display panel which may remove or reduce the image distortion phenomenon occurring at the boundary parts of the modules, according to an embodiment of the present disclosure.

FIGS. 14A and 14B are views for explaining a driving method of the modular display panel which may remove or reduce the image distortion phenomenon occurring at the boundary parts of the modules described above.

According to an embodiment of the present disclosure, the subpixel circuits included in a first display module among the plurality of display modules included in the modular display panel may be successively driven in a first order of the plurality of row lines. Accordingly, the inorganic light-emitting elements included in the first display module may emit light in the first order.

On the other hand, the subpixel circuits included in a second display module positioned above or below the first display module may be successively driven in a second order opposite to the first order. Accordingly, the inorganic light-emitting elements included in the second display module may emit light in the second order.

For example, as shown in FIG. 14A, the subpixel circuits included in the display module 1000-1 may be successively driven for each row line from the first to 40th row lines, and the subpixel circuits included in the display module 1000-4 positioned below the display module 1000-1 may be successively driven for each row line from the 40th to first row lines.

In some embodiments, although not shown in the drawing, the subpixel circuits included in the display module 1000-7 positioned below the display module 1000-4 may be successively driven for each row line from the first to 40th row line, that is, in an order opposite to the order of driving the display module 1000-4.

In this way, the display modules positioned vertically adjacent to each other may have the row lines driven in the orders opposite to each other. That is, one of the display modules positioned vertically adjacent to each other may have the driving direction from top to bottom, and the other thereof may have the driving direction from bottom to top. In this case, it may be possible to eliminate the time difference in performing the light emission sections at the boundary parts of the upper and lower display modules described above with reference to FIG. 13B.

For example, it may be seen that unlike FIG. 13B, the row lines positioned at the boundary parts of the display modules 1000-1 and 1000-4 based on the boundary line in FIG. 14A may have the same number of emission sections performed (e.g., once) based on the first image data voltage.

Here, the remaining three light emission sections of the 31st to 40th row lines of the display module 1000-1 based on the first image data voltage and the remaining three light emission sections of the first to 10th row lines of the display module 1000-4 may all be performed during the next image frame time.

In this way, it may be possible to prevent the time difference in performing the light emission sections at the boundary parts of the upper and lower display modules. It may thus be possible to reduce or prevent the image distortion phenomenon occurring at the boundary parts of the upper and lower modules when a pattern or an object displayed across the upper and lower display modules displays an image moving left or right on the modular display panel.

FIG. 14B shows a rectangular object displayed on the upper and lower display modules when the modular display panel is driven as described in FIG. 14A.

Referring to FIG. 14B, the still image does not have any distortion which may occur at the boundary parts of the upper and lower modules as shown in FIG. 13C. Meanwhile, it may be seen that the moving image in which a rectangular pattern moves to the right may have a significantly reduced distortion phenomenon occurring at the boundary between the upper and lower display modules unlike shown in FIG. 13C because the time difference in performing the light emission sections is eliminated as described above.

FIG. 15 is a conceptual diagram showing a method in which the display modules vertically adjacent to each other are driven for two successive image frames.

In FIG. 15, a vertical axis represents the row line, a horizontal axis represents the time, reference numeral 60 represents the image frame period, and reference number 65 represents the blanking period.

FIG. 15 illustrates that the display modules include 270 row lines, and the seven light emission sections 62-1 to 62-7 are performed based on the image data voltage set in the data set section 61.

Referring to FIG. 15, the display module 1000-1 may have the data setting section 61 and the respective light emission sections 62-1 to 62-7 successively performed from the first to 270th row lines for one image frame.

Alternatively or additionally, the display module 1000-4 positioned below the display module 1000-1 may have the data setting section 61 and the respective light emission sections 62-1 to 62-7 successively performed from the 270th to first row lines.

Although not shown in the drawing, the display module positioned below the display module 1000-4 (e.g., display module 1000-7 of FIG. 12) may have the data setting section 61 and the respective light emission sections 62-1 to 62-7 successively performed from the first to 270th row lines.

In some embodiments, a display module (not shown) may be positioned below the display module 1000-7 (not shown). In this case, the corresponding display module may have the data setting section 61 and the respective light emission sections 62-1 to 62-7 successively performed from the 270th to first row lines.

In this way, as described above, the display modules positioned vertically adjacent to each other may have the row lines driven in the orders opposite to each other, thereby reducing or preventing the image distortion phenomenon occurring at the boundary parts of the modules when the moving image is displayed.

Figure 16:
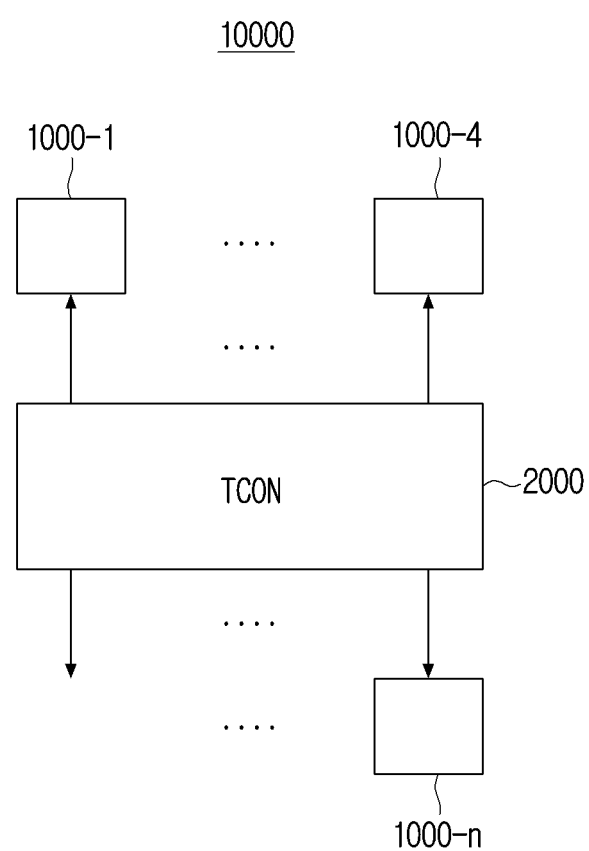
FIG. 16 is a block diagram of the display apparatus, according to an embodiment of the present disclosure.

FIG. 16 is a block diagram of the display apparatus according to an embodiment of the present disclosure.

Referring to FIG. 16, the display apparatus 10000 may include the plurality of display modules (e.g., 1000-1 to 1000-$n$) and a TCON 2000.

Here, the plurality of display modules 1000-1 to 1000-$n$ may be combined or assembled to each other in the matrix type to configure one modular display panel, for example, as shown in FIG. 12.

Each of the display modules 1000-1 to 1000-$n$ may include the display panel 100. Here, the display panel 100 may include the pixel array on which the pixels including the plurality of inorganic light-emitting elements are arranged in the plurality of row lines, and the subpixel circuits respectively corresponding to the inorganic light-emitting elements of the pixel array.

Alternatively or additionally, each of the display modules 1000-1 to 1000-$n$ may include the driving unit 500 driving the subpixel circuits for the inorganic light-emitting elements of the pixel array to successively emit light in the first order of the plurality of row lines or in the second order opposite to the first order based on the control signals provided by the timing controller 2000.

To this end, the driving unit 500 may include the scan driver providing the scan signal to the subpixel circuits in the row-line order for the image data voltage to be set to the subpixel circuits in the row-line order.

As described above, the scan signals may include VST($n$) and SP($n$). Accordingly, each of the display modules 1000-1 to 1000-$n$ may include the scan driver for providing the scan signal VST($n$) and the scan driver for providing the scan signal SP($n$).

In some embodiments, the driving unit 500 may include the emission driver providing the emission signal to the subpixel circuits in the row-line order for the inorganic light-emitting elements of the pixel array to emit light in the row-line order based on the image data voltage set based on the scan signal.

As described above, the emission signals may include the above-mentioned SET(n), Emi_PWM(n), Sweep(n), and Emi_PAM(n). Therefore, each of the display modules 1000-1 to 1000-n may include the emission driver that provides the emission signal SET(n), the emission driver that provides the emission signal Emi_PWM(n), the emission driver that provides the emission signal Sweep(n), and the emission driver that provides the emission signal Emi_PAM(n).

As described above, "row-line order" may include both the above-mentioned first order and second order, and may be determined as any one order by the control signal provided from the timing controller 2000.

The timing controller 2000 may control overall operations of the display apparatus 10000. In particular, the timing controller 2000 may drive the display modules vertically adjacent to each other among the plurality of display modules 1000-1 to 1000-n in the opposite directions.

That is, the timing controller 2000 may drive the first display module among the plurality of display modules 1000-1 to 1000-n in the row-line order from top to bottom. On the other hand, the timing controller 2000 may drive the second display module positioned above or below the first display module in the row-line order from bottom to top.

That is, the timing controller 2000 may drive the first display module in the first order of the plurality of row lines (e.g., in the row-line order from the first to last row lines). Alternatively or additionally, the timing controller 2000 may drive the second display module in the second order of the plurality of row lines (e.g., in the row-line order from the last to first row lines).

To this end, according to an embodiment of the present disclosure, the timing controller 2000 may provide the driving unit 500 of the first display module with first control signals for emitting light of the inorganic light-emitting elements of the first display module among the plurality of display modules 1000-1 to 1000-n in the first order. Accordingly, when the first control signals are applied, the scan drivers and emission drivers included in the first display module may provide the scan signals and the emission signals to the subpixel circuits in the first order.

The timing controller 2000 may also provide the driving unit 500 of the second display module with second control signals for emitting light of the inorganic light-emitting elements of the second display module positioned above or below the first display module in the second order. Accordingly, when the second control signals are applied, the scan drivers and emission drivers included in the second display module may provide the scan signals and the emission signals to the subpixel circuits in the second order.

Here, the first and second control signals may respectively be provided from the timing controller 2000 to the first and second display modules through separate wirings. Details of the first and second control signals are described below.

FIG. 16 exemplifies one timing controller 2000 for controlling the plurality of display modules 1000-1 to 1000-n included in the display apparatus 10000, and the embodiments are not limited thereto. According to an embodiment, the display apparatus 10000 may include at least one timing controller for controlling the plurality of display modules 1000-1 to 1000-n.

Hereinafter, the description describes in detail specific embodiments of the scan driver and emission driver according to the various embodiments of present disclosure.

FIGS. 17A to 17D are views for explaining the scan driver according to an embodiment of the present disclosure.

As described above, the scan driver may provide the scan signals to the subpixel circuits of the corresponding display module in the row-line order. That is, the scan signals may not be provided to all the subpixel circuits collectively through the global signal, but provided to the subpixel circuits in the row-line order through each of the scan driver circuits provided for each row line.

Figure 17A:
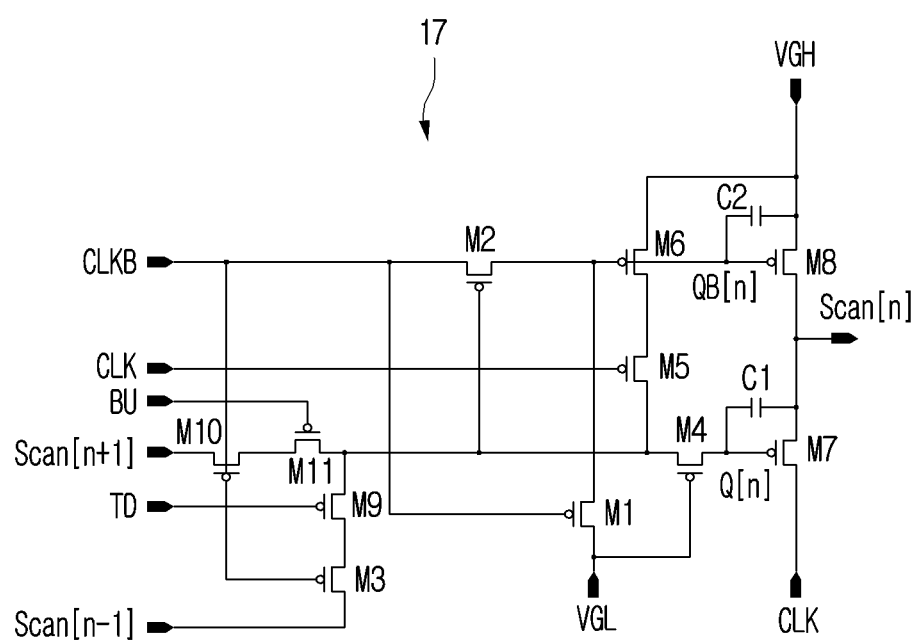
FIG. 17A is a circuit diagram of a scan driver circuit corresponding to an n-th row line, according to an embodiment of the present disclosure.

FIG. 17A shows a circuit diagram of the scan driver circuit corresponding to the n-th row line. Referring to FIG. 17A, a scan driver circuit 17 may generate and output a scan signal Scan(n). Here, the scan signal Scan(n) may be the above-mentioned scan signal VST(n) or scan signal SP(n). That is, the scan driver circuit 17 shown in FIG. 17A may be used to configure the scan driver that provides the scan signal VST(n), or configure the scan driver that provides the scan signal SP(n).

Referring to FIG. 17A, the scan driver circuit 17 may receive the following signals and output the scan signal Scan(n): 1) selection signals TD and BU, 2) any one selected based on the selection signals TD and BU from an output scan signal Scan(n−1) of a previous row line and an output scan signal Scan(n+1) of a next row line, 3) a clock signals CLK and CLKB, and 4) the driving voltage signals VGH and VGL.

In particular, the scan driver circuit 17 may select one scan signal input terminal from scan signal input terminals Scan(n−1) and Scan(n+1) based on the selection signals TD and BU, and output the scan signal Scan(n) based on the scan signal and the clock signals CLK and CLKB, input through one selected scan signal input terminal.

Here, the selection signals TD and BU and the clock signals CLK and CLKB may be the above-mentioned control signals (e.g., the first control signals or the second control signals) applied from the timing controller 2000. Accordingly, the driving order (or driving direction) of the display module may depend on how the selection signals TD and BU and the clock signals CLK and CLKB are applied. A detailed description thereof is described below.

Figure 17B:
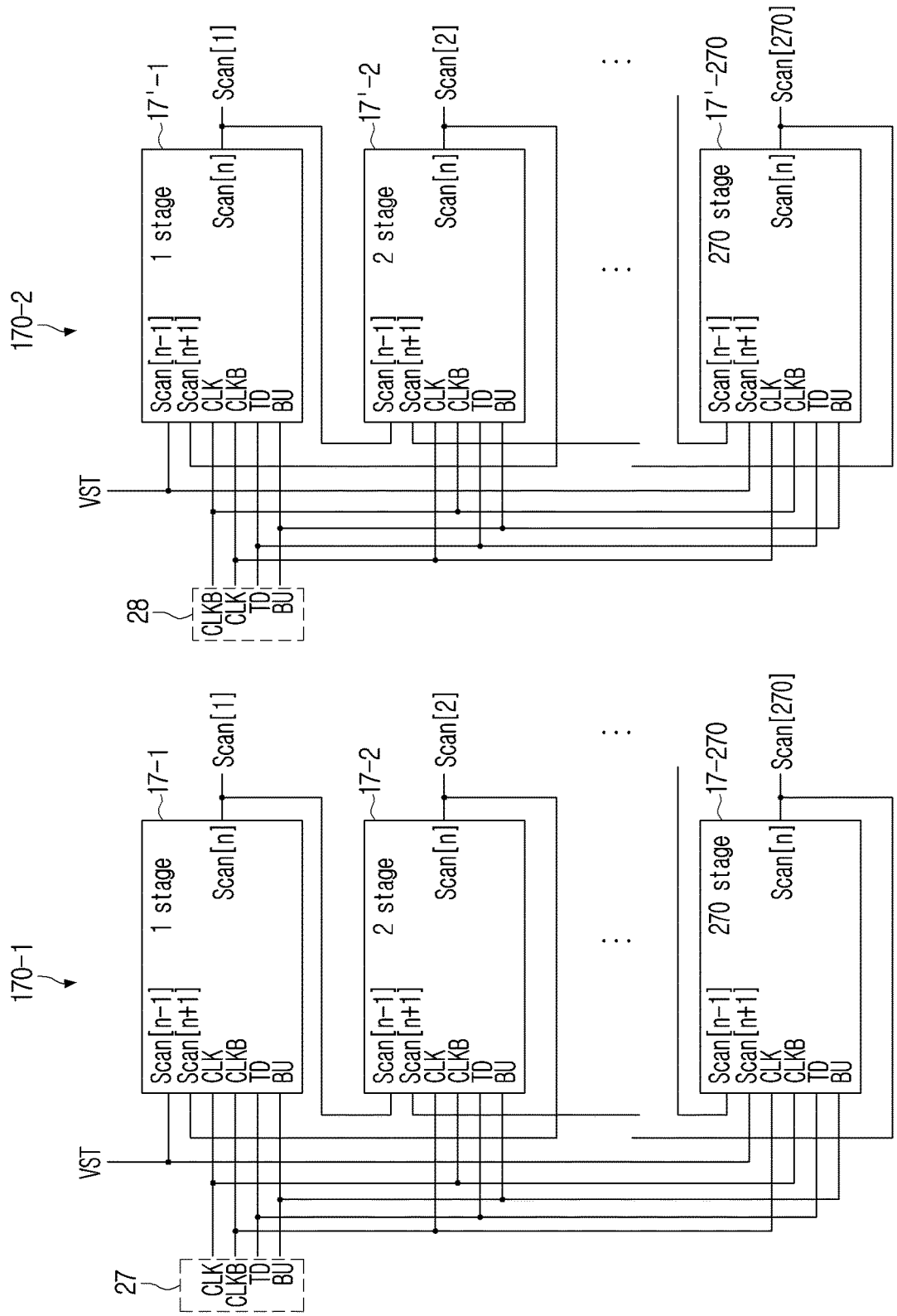
FIG. 17B is a block diagram of the scan drivers, according to an embodiment of the present disclosure.

FIG. 17B is a block diagram of the scan drivers according to an embodiment of the present disclosure.

FIG. 17B shows configurations of scan drivers 170-1 and 170-2 respectively included in two display modules vertically adjacent to each other. Here, each display module may include 270 row lines for example.

Referring to FIG. 17B, it may be seen that the scan driver 170-1 and the scan driver 170-2 have the same configuration and wiring as each other, except for a difference in that the first control signals 27 are applied to the scan driver 170-1 and the second control signals 28 are applied to the scan driver 170-2.

The scan driver 170-1 to which the first control signals 27 are applied may apply the scan signal Scan(n) to the subpixel circuits included in the corresponding display module in the first order (or first direction) of the row lines. Here, the first order of the row lines may be, for example, the order from the first to 270th row lines. Alternatively or additionally, the first direction may be the direction from top to bottom.

In some embodiments, the scan driver 170-2 to which the second control signals 28 are applied may apply the scan signal Scan(n) to the subpixel circuits included in the corresponding display module in the second order (or second direction) of the row lines. Here, the second order of the row lines may be, for example, the order from the 270th to first row lines. Alternatively or additionally, the second direction may be the direction from bottom to top.

That is, the timing controller 2000 may apply the first control signals 27 to one scan driver 170-1 among the scan drivers 170-1 and 170-2 included in the two display modules vertically adjacent to each other, and apply the second control signals 28 to the other scan driver 170-2. Accordingly, the two display modules vertically adjacent to each other may have the driving orders or driving directions opposite to each other.

In this way, it may be possible to prevent and/or reduce the distortion phenomenon of the moving pattern that occurs at the boundary between the display modules vertically adjacent to each other by making the driving orders or driving directions of the two display modules vertically adjacent to each other opposite to each other as described above.

Referring again to FIG. 17B, the scan driver 170-1 may include scan driver circuits 17-1 to 17-270 provided one by one for each row line.

Here, each of the scan driver circuits 17-1 to 17-270 may include the first scan signal input terminal Scan(n−1) for receiving the scan signal Scan(n−1) output from the scan driver circuit for the previous row line, and the second scan signal input terminal Scan(n+1) for receiving the scan signal Scan(n+1) output from the scan driver circuit for the next row line.

The first scan signal input terminal Scan(n−1) of each of the scan driver circuits 17-1 to 17-270 may be connected to the output terminal Scan(n−1) of the scan driver circuit for the previous row line, and the second scan signal input terminal Scan(n+1) may be connected to the output terminal Scan(n+1) of the scan driver circuit for the next row line.

In some embodiments, the first row line does not have the previous row line and the 270th row line does not have the next row line. Accordingly, the first scan signal input terminal Scan(n−1) of the scan driver circuit 17-1 for the first row line and the second scan signal input terminal Scan(n+1) of the scan driver circuit 17-270 for the 270th row line may each be separately connected to a wiring to which the start signal VST is applied.

Here, as described above, the scan driver circuit 17 may be operated based on the scan signal input through one scan signal input terminal selected based on the selection signals TD and BU. Accordingly, it may be acceptable to apply the same start signal VST to the first scan signal input terminal Scan(n−1) of the scan driver circuit 17-1 and the second scan signal input terminal Scan(n+1) of the scan driver circuit 17-270 through one wiring.

In some embodiments, each of the scan driver circuits 17-1 to 17-270 may include a first clock input terminal CLK and a second clock input terminal CLKB for respectively receiving the clock signals CLK and CLKB.

Here, the CLK signal and the CLKB signal may be applied to the first clock input terminal CLK and the second clock input terminal CLKB of the scan driver circuits 17-1 to 17-270 for the respective row lines in an order opposite to that of the previous row line for each row line.

That is, the CLK signal may be applied to the first clock input terminal CLK of the scan driver circuit 17-1, and the CLKB signal may be applied to the second clock input terminal CLKB. However, it may be seen that the CLKB signal is applied to the first clock input terminal CLK of the scan driver circuit 17-2 for the next row line, and the CLK signal is applied to the second clock input terminal CLKB. This configuration may also be the same up to the scan driver circuit 17-270 for the 270th row line.

Here, the CLK signal and the CLKB signal may be some of the first control signals applied from the timing controller 2000 and have phases opposite to each other. Alternatively or additionally, the CLK signal and the CLKB signal may become sources of the output signal Scan(n).

In some embodiments, each of the scan driver circuits 17-1 to 17-270 may include a first selection signal input terminal TD and a second selection signal input terminal BU respectively receiving the selection signals (e.g., first selection signal TD and second selection signal BU) for selecting one scan signal input terminal from the first scan signal input terminal and the second scan signal input terminal.

The first selection signal (e.g., a top-down (TD) signal) and the second selection signal (e.g., a bottom-up (BU) signal) may be some of the first control signals applied from the timing controller 2000 and may have different voltage levels. For example, the first selection signal may have the same voltage level as the low-level driving voltage signal VGL, and the second selection signal may have the same voltage level as the high-level driving voltage signal VGH. However, the present disclosure is not limited thereto.

The first selection signal TD of the low level and the second selection signal BU of the high level may respectively be input through the first and second selection signal input terminals TD and BU. In this case, the scan driver circuits 17-1 to 17-270 of the scan driver 170-1 may select the first scan signal input terminal Scan(n−1) from the first and second scan signal input terminals Scan(n−1) and Scan(n+1), and each output the scan signal Scan(n) corresponding to each row line based on the scan signal Scan(n−1) input through the selected first scan signal input terminal Scan(n−1).

In this case, the first scan signal input terminal Scan(n−1) may be selected based on the selection signals TD and BU, and the start signal VST may thus be input to the first scan signal input terminal Scan(n−1) of the scan driver circuit 17-1 for the first row line, and may not be input to the second scan signal input terminal Scan(n+1) of the scan driver circuit 17-270 for the 270th row line. Therefore, each of the scan driver circuits 17-1 to 17-270 may successively output the scan signals Scan(n) from the first to 270th row lines based on the scan signal Scan(n−1) for the previous row line.

In some embodiments, each of scan driver circuits 17'-1 to 17'-270 of the scan driver 170-2 may have the same configuration and connection structure as those of each of the scan driver circuits 17-1 to 17-270 of the scan driver 170-1. However, the scan driver 170-1 may receive the first control signals 27 from the timing controller 2000, while the scan driver 170-2 may receive the second control signals 28 from the timing controller 2000 through the wiring separate from that of the first control signals.

Hereinafter, the description omits redundant descriptions of the same or similar contents as those of the scan driver 170-1, and describes the scan driver 170-2 focusing on its difference.

Referring to FIG. 17B, in the scan driver circuit 17-1 for the first row line of the scan driver 170-1, the CLK signal may be input to the first clock input terminal CLK, and the CLKB signal may be input to the second clock input terminal CLKB. However, it may be seen that in the scan driver circuit 17'-1 for the first row line of the scan driver 170-2, the CLKB signal is input to the first clock input terminal CLK, and the CLK signal is applied to the second clock input terminal CLKB.

In some embodiments, in each of the scan driver circuits 17'-1 to 17'-270 of the scan driver 170-2, the CLK signal and the CLKB signal may be applied to the first clock input terminal CLK and the second clock input terminal CLKB in the order opposite to that of the previous row line for each row line.

Therefore, it may be seen that the clock signals input to each of the scan driver circuits 17-1 to 17-270 of the scan driver 170-1 and the clock signals input to each of the scan driver circuits 17'-1 to 17'-270 of the scan driver 170-2 have phases opposite to each other for the same row line.

In some embodiments, each of the first and second selection signals included in the second control signals 28 may have a level opposite to that of the first and second selection signals included in the first control signals 27. That is, the first selection signal TD of the high level may be applied to the first selection signal input terminal TD of each of the scan driver circuits 17'-1 to 17'-270 of the scan driver 170-2, and the second selection signal BU of the low level may be applied to the second selection signal input terminal BU.

Accordingly, the scan driver circuits 17'-1 to 17'-270 of the scan driver 170-2 may select the second scan signal input terminal Scan(n+1) from the first and second scan signal input terminals Scan(n−1) and Scan(n+1), and output the scan signal Scan(n) corresponding to each row line based on the scan signal Scan(n+1) input through the selected first scan signal input terminal Scan(n+1).

In this case, the second scan signal input terminal Scan (n+1) may be selected based on the selection signals TD and BU, and the start signal VST may thus be input to the second scan signal input terminal Scan(n+1) of the scan driver circuit 17'-270 for the 270th row line, and may not be input to the first scan signal input terminal Scan(n−1) of the scan driver circuit 17'-1 for the first row line.

Therefore, the scan driver circuits 17'-1 to 17'-270 may respectively output the scan signals Scan(n) successively from the 270th to first row lines based on the scan signal Scan(n+1) for the next row line.

Hereinafter, the description describes an operation of the scan driver circuit 17 in more detail with reference to FIGS. 17C and 17D.

FIG. 17C shows the scan driver circuit 17-n for the n-th row line among the plurality of scan driver circuits 17-1 to 17-270 included in the scan driver 170-1 of FIG. 17B and a driving timing diagram thereof, and FIG. 17D shows the scan driver circuit 17'-n for the n-th row line among the plurality of scan driver circuits 17'-1 to 17'-270 included in the scan driver 170-2 of FIG. 17B and a driving timing diagram thereof, respectively.

As described above, it may be confirmed from comparison of FIGS. 17C and 17D that the scan driver circuit 17-n and the scan driver circuit 17'-n have the same configuration.

However, it may be seen that the clock signals of the opposite phases are applied to the clock input terminal at the same location, and the first selection signal TD and the second selection signal BU, applied to the first selection signal input terminal TD and the second selection signal input terminal BU, have levels opposite to each other. That is, the above-described first control signals may be applied to the scan driver circuit 17-n of FIG. 17C, and the above-described second control signals may be applied to the scan driver circuit 17'-n of FIG. 17D, respectively.

Referring first to FIG. 17C, the first control signals CLK, CLKB, TD, and BU may be applied to the scan driver circuit 17-n as shown in the drawing.

Here, the first selection signal of the low level may be applied to the first selection signal input terminal TD and the second selection signal of the high level may be applied to the second selection signal input terminal BU. Therefore, a transistor M9 may be turned on and a transistor M11 may be turned off. That is, the first scan signal input terminal Scan(n−1) may be selected based on the first and second selection signals TD and BU.

Therefore, it may be seen that the scan driver circuit 17-n is operated based on the scan signal Scan(n−1) input through the first scan signal input terminal Scan(n−1).

That is, in a period ① in the driving timing diagram of FIG. 17C, a low-level voltage may be pre-charged at a node Q(n).

Referring to FIG. 17C, a transistor M3 may be turned on based on the CLKB signal during the period ①. In some embodiments, the transistor M9 may be turned on by the low-level first selection signal TD, and a transistor M4 may be turned on by the low-level driving voltage VGL.

Accordingly, the Scan(n−1) signal input through the turned-on transistor M3 may be applied to the node Q(n) through the turned-on transistors M9 and M4. Accordingly, the low-level voltage may be pre-charged to the node Q(n) through the capacitor C1.

In some embodiments, the voltage at the node Q(n) may be bootstrapped and the scan signal Scan(n) may be output in a period ② of FIG. 17C. Referring to FIG. 17C, the voltage at the node Q(n) may be bootstrapped as the CLK signal has the low level while the node Q(n) is pre-charged. Accordingly, the low-level CLK signal may be output as the scan signal Scan(n) through a fully turned-on pull-down transistor M7.

The output of the scan signal Scan(n) may then be pulled up in a period ③ of FIG. 17C. Referring to FIG. 17C, the high-level Scan(n−1) signal may be applied to the node Q(n) through the turned-on transistor M3 based on the low-level CLKB signal, the turned-on transistor M9 based on the low-level first selection signal TD, and the turned-on transistor M4 based on the low-level driving voltage VGL. Accordingly, the pull-down transistor M7 may be turned off.

In some embodiments, the low-level driving voltage VGL may be applied to a node QB(n) through the turned-on transistor M1 based on the low-level CLKB signal. A pull-up transistor M8 may thus be turned on, and the high-level driving voltage VGH may be output at an output node of the Scan(n) signal.

Referring to FIG. 17D, the second control signals CLK, CLKB, TD, and BU may be applied to the scan driver circuit 17'-n as shown in the drawing.

Here, the first selection signal TD of the high level may be applied to the first selection signal input terminal TD and the second selection signal BU of the low level may be applied to the second selection signal input terminal BU. Therefore, the transistor M9 may be turned off and the transistor M11 may be turned on. That is, the second scan signal input terminal Scan(n+1) may be selected based on the first and second selection signals TD and BU.

Therefore, it may be seen that the scan driver circuit 17'-n is operated based on the scan signal Scan(n+1) input through the second scan signal input terminal Scan(n+1).

That is, the low-level voltage may be pre-charged at a node Q(n) in the period ① in the driving timing diagram of FIG. 17D.

Referring to FIG. 17D, a transistor M10 may be turned on based on the CLK signal during the period ①. In some embodiments, the transistor M11 may be turned on by the low-level second selection signal BU, and the transistor M4 may be turned on by the low-level driving voltage VGL.

Accordingly, the Scan(n+1) signal input through the turned-on transistor M10 may be applied to the node Q(n) through the turned-on transistors M11 and M4. Accordingly, the low-level voltage may be pre-charged to the node Q(n) through the capacitor C1.

In some embodiments, the voltage at the node Q(n) may be bootstrapped and the scan signal Scan(n) may be output in a period ② of FIG. 17D. Referring to FIG. 17D, the voltage at the node Q(n) may be bootstrapped as the CLKB signal has the low level while the node Q(n) is pre-charged. Accordingly, the low-level CLKB signal may be output as the scan signal Scan(n) through the fully turned-on pull-down transistor M7.

The output of the scan signal Scan(n) may then be pulled up in a period ③ of FIG. 17D. Referring to FIG. 17D, the high-level Scan(n+1) signal may be applied to the node Q(n) through the turned-on transistor M10 based on the low-level CLK signal, the turned-on transistor M11 based on the low-level second selection signal BU, and the turned-on transistor M4 based on the low-level driving voltage VGL. Accordingly, the pull-down transistor M7 may be turned off.

In some embodiments, the low-level driving voltage VGL may be applied to the node QB(n) through the turned-on transistor M1 based on the low-level CLKB signal. The pull-up transistor M8 may thus be turned on, and the high-level driving voltage VGH may be output at the output node of the Scan(n) signal.

FIGS. 18A to 18D are views for explaining the emission driver according to an embodiment of the present disclosure.

As described above, the emission driver may provide the emission signals to the subpixel circuits of the corresponding display module in the row-line order. That is, the emission signals may not be provided to all the subpixel circuits collectively through the global signal, but provided to the subpixel circuits in the row-line order through the emission driver circuits provided for the respective row lines.

Figure 18A:
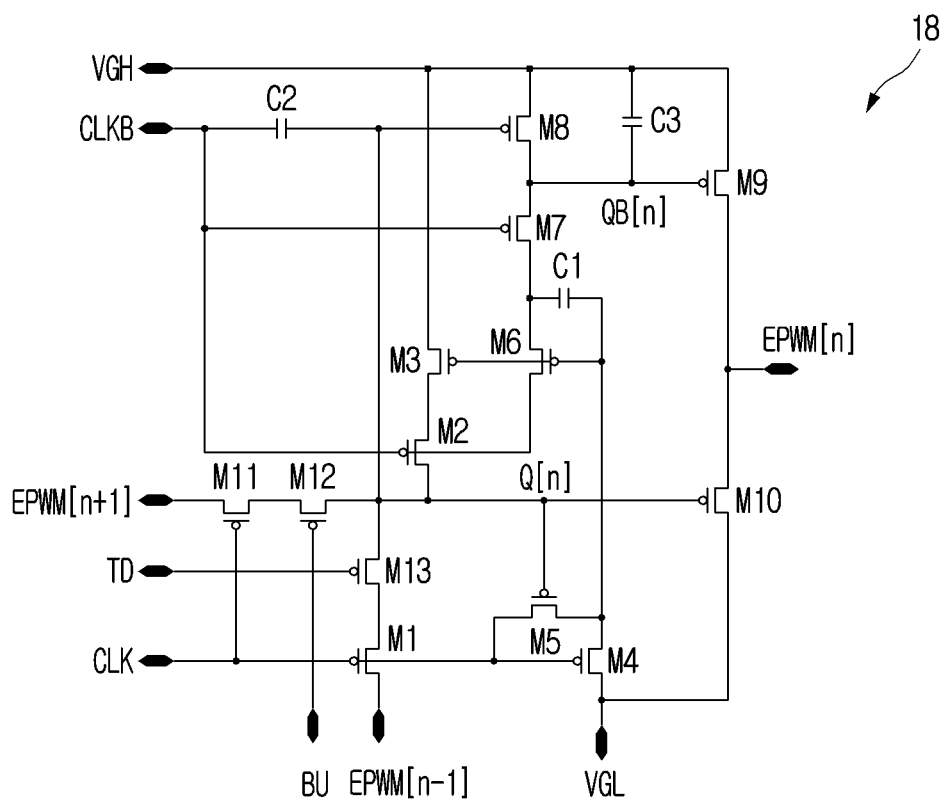
FIG. 18A is a circuit diagram of an emission driver circuit corresponding to the n-th row line, according to an embodiment of the present disclosure.

FIG. 18A shows a circuit diagram of the emission driver circuit corresponding to the n-th row line. Referring to FIG. 18A, an emission driver circuit 18 may generate and output an emission signal EPWM(n). Here, the emission signal EPWM(n) may be the above-mentioned emission signal Emi_PWM(n).

In some embodiments, the description below describes the configuration and operation of the emission driver that provides the emission signal EPWM(n) with reference to FIGS. 18A to 18C, and this content may be applied as it is to the emission driver that provides the emission signal SET(n). That is, the emission driver circuit 18 shown in FIG. 18A may be used to configure the emission driver that provides the emission signal Emi_PWM(n), or configure the emission driver that provides the emission signal SET(n).

Referring to FIG. 18A, the emission driver circuit 18 may receive the following signals and output the emission signal EPWM(n): 1) the selection signals TD and BU, 2) any one selected based on the selection signals TD and BU from an output emission signal EPWM(n−1) of a previous row line and an output scan signal EPWM(n+1) of a next row line, 3) the clock signals CLK and CLKB, and 4) the driving voltage signals VGH and VGL.

In particular, the emission driver circuit 18 may select one emission signal input terminal from emission signal input terminals EPWM(n−1) and EPWM(n+1) based on the selection signals TD and BU, and output the emission signal EPWM(n) based on the emission signal and the clock signals CLK and CLKB, input through one selected emission signal input terminal.

Here, the selection signals TD and BU and the clock signals CLK and CLKB may be the above-mentioned control signals (e.g., the first control signals or the second control signals) applied from the timing controller 2000. Accordingly, the driving order (or driving direction) of the display module may depend on how the selection signals TD and BU and the clock signals CLK and CLKB are applied.

Figure 18B:
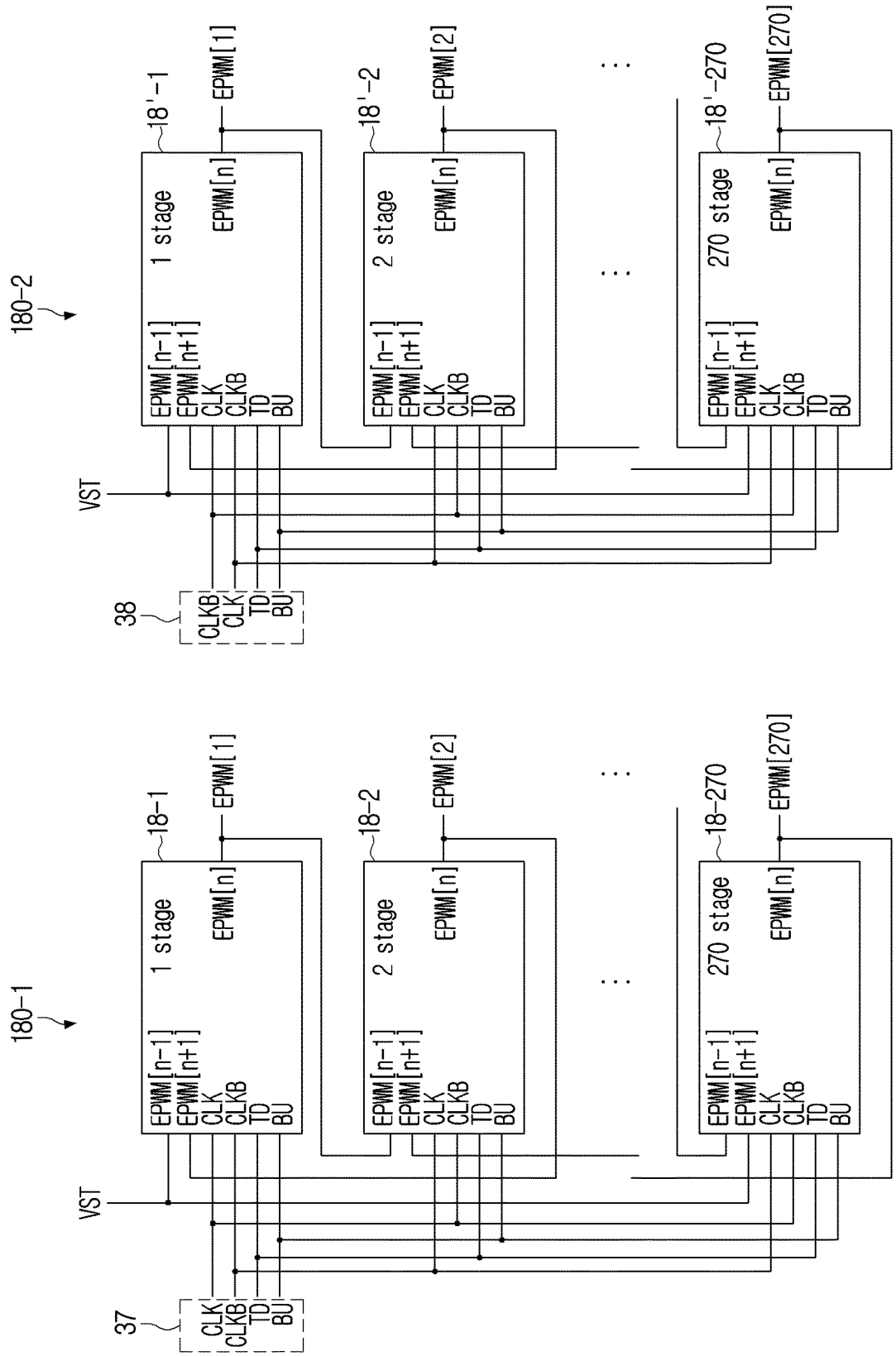
FIG. 18B is a block diagram of the emission drivers, according to an embodiment of the present disclosure.

FIG. 18B is a block diagram of the emission drivers according to an embodiment of the present disclosure.

FIG. 18B shows configurations of emission drivers 180-1 and 180-2 respectively included in two display modules vertically adjacent to each other. Here, each display module may include 270 row lines for example.

Referring to FIG. 18B, it may be seen that the emission driver 180-1 and the emission driver 180-2 have the same configuration and connection wiring as each other, except for a difference in that the first control signals 37 are applied to the emission driver 180-1 and the second control signals 38 are applied to the emission driver 180-2.

The emission driver 180-1 to which the first control signals 37 are applied may apply the emission signal EPWM (n) to the subpixel circuits included in the corresponding display module in the first order (or first direction) of the row lines. Here, the first order of the row lines may be, for example, the order from the first to 270th row lines. Alternatively or additionally, the first direction may be the direction from top to bottom.

In some embodiments, the emission driver 180-2 to which the second control signals 38 are applied may apply the emission signal EPWM(n) to the subpixel circuits included in the corresponding display module in the second order (or second direction) of the row lines. Here, the second order of the row lines may be, for example, the order from the 270th to first row lines. Alternatively or additionally, the second direction may be the direction from bottom to top.

That is, the timing controller 2000 may apply the first control signals 37 to one emission driver 180-1 among the emission drivers 180-1 and 180-2 included in the two display modules vertically adjacent to each other, and apply the second control signals 38 to the other emission driver 180-2. Accordingly, the two display modules vertically adjacent to each other may have the driving orders or driving directions opposite to each other.

In this way, it may be possible to prevent and/or reduce the distortion phenomenon of the moving pattern that occurs at the boundary between the display modules vertically adjacent to each other by making the driving orders or driving directions of the two display modules vertically adjacent to each other opposite to each other as described above.

Referring again to FIG. 18B, the emission driver 180-1 may include emission driver circuits 18-1 to 18-270 provided one by one for each row line.

Here, each of the emission driver circuits 18-1 to 18-270 may include the first emission signal input terminal EPWM (n−1) for receiving the emission signal EPWM(n−1) output from the emission driver circuit for the previous row line, and the second emission signal input terminal EPWM(n+1) for receiving the emission signal EPWM(n+1) output from the emission driver circuit for the next row line.

The first emission signal input terminal EPWM(n−1) of each of the emission driver circuits 18-1 to 18-270 may be connected to the output terminal EPWM(n−1) of the emission driver circuit for the previous row line, and the second emission signal input terminal EPWM(n+1) may be connected to the output terminal EPWM(n+1) of the emission driver circuit for the next row line.

In some embodiments, the first row line does not have the previous row line and the 270th row line does not have the next row line. Accordingly, the first emission signal input terminal EPWM(n−1) of the emission driver circuit 18-1 for the first row line and the second emission signal input terminal EPWM(n+1) of the emission driver circuit 18-270 for the 270th row line may each be separately connected to the wiring to which the start signal VST is applied.

Here, as described above, the emission driver circuit 18 may be operated based on the emission signal input through one emission signal input terminal selected based on the selection signals TD and BU. Accordingly, it may be acceptable to apply the same start signal VST to the first emission signal input terminal EPWM(n−1) of the emission driver circuit 18-1 and the second emission signal input terminal EPWM(n+1) of the emission driver circuit 18-270 through one wiring.

In some embodiments, each of the emission driver circuits 18-1 to 18-270 may include the first clock input terminal CLK and the second clock input terminal CLKB for respectively receiving the clock signals CLK and CLKB.

Here, the CLK signal and the CLKB signal may be applied to the first clock input terminal CLK and the second clock input terminal CLKB of the emission driver circuits 18-1 to 18-270 for the respective row lines in an order opposite to that of the previous row line for each row line.

For example, the CLK signal may be applied to the first clock input terminal CLK of the emission driver circuit 18-1, and the CLKB signal may be applied to the second clock input terminal CLKB. However, it may be seen that the CLKB signal is applied to the first clock input terminal CLK of the emission driver circuit 18-2 for the next row line, and the CLK signal is applied to the second clock input terminal CLKB. This configuration may also be the same up to the emission driver circuit 18-270 for the 270th row line.

Here, the CLK signal and the CLKB signal may be some of the first control signals applied from the timing controller 2000 and have the phases opposite to each other.

In some embodiments, each of the emission driver circuits 18-1 to 18-270 may include the first selection signal input terminal TD and the second selection signal input terminal BU respectively receiving the selection signals (e.g., first selection signal TD and second selection signal BU) for selecting one emission signal input terminal from the first emission signal input terminal and the second emission signal input terminal.

Here, the first selection signal TD and the second selection signal BU may be some of the first control signals applied from the timing controller 2000 and have the different voltage levels. For example, the first selection signal may have the same voltage level as the low-level driving voltage signal VGL, and the second selection signal may have the same voltage level as the high-level driving voltage signal VGH. However, the present disclosure is not limited thereto.

The first selection signal TD of the low level and the second selection signal BU of the high level may respectively be input through the first and second selection signal input terminals TD and BU. In this case, the emission driver circuits 18-1 to 18-270 may select the first emission signal input terminal EPWM(n−1) from the first and second emission signal input terminals EPWM(n−1) and EPWM(n+1), and each output the emission signal EPWM(n) corresponding to each row line based on the emission signal EPWM (n−1) input through the selected first emission signal input terminal EPWM(n−1).

In this case, the first emission signal input terminal EPWM(n−1) may be selected based on the selection signals TD and BU, and the start signal VST may thus be input to the first emission signal input terminal EPWM(n−1) of the emission driver circuit 18-1 for the first row line, and may not be input to the second emission signal input terminal EPWM(n+1) of the emission driver circuit 18-270 for the 270th row line. Therefore, each of the emission driver circuits 18-1 to 18-270 may successively output the emission signals EPWM(n) from the first to 270th row lines based on the emission signal EPWM(n−1) for the previous row line.

In some embodiments, each of emission driver circuits 18'-1 to 18'-270 of the emission driver 180-2 may have the same configuration and connection structure as those of each of the emission driver circuits 18-1 to 18-270 of the emission driver 180-1 described above. However, the emission driver 180-1 may receive the first control signals 37 from the timing controller 2000, while the emission driver 180-2 may receive the second control signals 38 from the timing controller 2000 through the wiring separate from that of the first control signals.

Hereinafter, the description omits redundant descriptions of the same or similar contents as those of the emission driver 180-1 described above, and describes the emission driver 180-2 focusing on its difference.

Referring to FIG. 18B, in the emission driver circuit 18-1 for the first row line of the emission driver 180-1, the CLK signal may be input to the first clock input terminal CLK, and the CLKB signal may be input to the second clock input terminal CLKB. However, it may be seen that in the emission driver circuit 18'-1 for the first row line of the emission driver 180-2, the CLKB signal is input to the first clock input terminal CLK, and the CLK signal is applied to the second clock input terminal CLKB.

In some embodiments, in each of the emission driver circuits 18'-1 to 18'-270 of the emission driver 180-2, the CLK signal and the CLKB signal may be applied to the first clock input terminal CLK and the second clock input terminal CLKB in the order opposite to that of the previous row line for each row line.

Therefore, it may be seen that the clock signals input to each of the emission driver circuits 18-1 to 18-270 of the emission driver 180-1 and the clock signals input to each of the emission driver circuits 18'-1 to 18'-270 of the emission driver 180-2 have phases opposite to each other for the same row line.

In some embodiments, each of the first and second selection signals included in the second control signals 38 may have a level opposite to that of the first and second selection signals included in the first control signals 37. That is, the first selection signal TD of the high level may be applied to the first selection signal input terminal TD of each of the emission driver circuits 18'-1 to 18'-270 of the emission driver 180-2, and the second selection signal BU of the low level may be applied to the second selection signal input terminal BU.

Accordingly, the emission driver circuits 18'-1 to 18'-270 of the emission driver 180-2 may select the second emission signal input terminal EPWM(n+1) from the first and second emission signal input terminals EPWM(n−1) and EPWM(n+1), and output the emission signal EPWM(n) corresponding to each row line based on the emission signal EPWM(n+1) input through the selected first emission signal input terminal EPWM(n+1).

In this case, the second emission signal input terminal EPWM(n+1) may be selected based on the selection signals TD and BU, and the start signal VST may thus be input to the second emission signal input terminal EPWM(n+1) of the emission driver circuit 18'-270 for the 270th row line, and may not be input to the first emission signal input terminal EPWM(n−1) of the emission driver circuit 18'-1 for the first row line.

Therefore, the emission driver circuits 18'-1 to 18'-270 may respectively output the emission signals EPWM(n) successively from the 270th to first row lines based on the emission signal EPWM(n+1) for the next row line.

Hereinafter, the description describes an operation of the emission driver circuit 18 in more detail with reference to FIGS. 18C and 18D.

FIG. 18C shows the emission driver circuit 18-*n* for the n-th row line among the plurality of emission driver circuits 18-1 to 18-270 included in the emission driver 180-1 of FIG. 18B and a driving timing diagram thereof, and FIG. 18D shows the emission driver circuit 18'-n for the n-th row line among the plurality of emission driver circuits 18'-1 to 18'-270 included in the emission driver 180-2 of FIG. 18B and a driving timing diagram thereof, respectively.

As described above, it may be confirmed from comparison of FIGS. 18C and 18D that the emission driver circuit 18-*n* and the emission driver circuit 18'-n have the same configuration.

However, it may be seen that the clock signals of the opposite phases are applied to the clock input terminal at the same location, and the first selection signal TD and the second selection signal BU, applied to the first selection signal input terminal TD and the second selection signal input terminal BU, have the levels opposite to each other. That is, the above-described first control signals may be applied to the emission driver circuit 18-*n* of FIG. 18C, and the above-described second control signals may be applied to the emission driver circuit 18'-n of FIG. 18D, respectively.

Referring first to FIG. 18C, the first control signals CLK, CLKB, TD, and BU may be applied to the emission driver circuit 18-*n* as shown in the drawing.

Here, the first selection signal TD of the low level may be applied to the first selection signal input terminal TD and the second selection signal BU of the high level may be applied to the second selection signal input terminal BU. Therefore, a transistor M13 may be turned on and a transistor M12 may be turned off. That is, the first emission signal input terminal EPWM(n−1) may be selected based on the first and second selection signals TD and BU.

Therefore, it may be seen that the emission driver circuit 18-*n* may be operated based on the emission signal EPWM(n−1) input through the first emission signal input terminal EPWM(n−1).

That is, in a period ① of the driving timing diagram of FIG. 18C, the EPWM(n−1) signal of the low level may be applied at the node Q(n) through the turned-on transistor M1 based on the low-level CLK signal and the turned-on transistor M13 based on the low-level TD signal. Accordingly, the transistor M10 may be turned on, and the low-level driving voltage VGL may be output as the emission signal EPWM(n).

In some embodiments, in periods ②, ③, and ④ of the driving timing diagram of FIG. 18C, the emission signal EPWM(n) of the low level may maintain its output.

That is, in the period ②, the CLK signal may have the high level and the transistor M1 may thus be turned off. Accordingly, the EPWM(n−1) signal of the low level may not be directly applied to the node Q(n). However, the voltage at the node Q(n) may float while the EPWM(n−1) signal of the low level is applied thereto in the period ①, the transistor M10 may thus be maintained to be turned on, and the emission signal EPWM(n) of the low level may maintain its output.

In the period ③, the CLK signal may have the low level again, the transistor M1 may thus be turned on, and the EPWM(n−1) signal of the low level may be applied to the node Q(n). The transistor M10 may thus be maintained to be turned on, and the emission signal EPWM(n) of the low level may maintain its output.

In the period ④, although the CLK signal has the high level and the transistor M1 is thus turned off, the transistor M10 may be maintained to be turned on, and the emission signal EPWM(n) of the low level may maintain its output as in the period ②.

In the period ⑤ of the driving timing diagram of FIG. 18C, the emission signal EPWM(n) of the low level may then stop its output.

That is, in the period ⑤, the CLK signal may have the low level, the transistor M1 may thus be turned on, and the EPWM(n−1) signal may be applied to the node Q(n). However, the EPWM(n−1) signal may have the high level in the period ⑤, the high-level voltage may thus be applied to the node Q(n), and the transistor M10 may be turned off.

Accordingly, the VGL signal may no longer be output as the emission signal EPWM(n). In some embodiments, in the period ⑤, the voltage at the node Q(n) as well as the node QB(n) may maintain the high level, and the transistor M9 may not be turned on either. Accordingly, the voltage at an output node (or a drain terminal of the transistor M10) of the emission driver 18-*n* may float. However, a level of the voltage at the node Q(n) may be changed from the low level to the high level due to a parasitic capacitance component of the transistor M10, and the voltage at an output node of the emission driver circuit 18-*n* may also rise slightly as shown in the drawing.

In a period ⑥ of the driving timing diagram of FIG. 18C, the emission signal EPWM(n) of the high level may then be output. That is, in the period ⑥, the node QB(n) may have the low level, the transistor M9 may thus be turned on, and the high-level driving voltage VGH may be output as the emission signal EPWM(n) through the turned-on transistor M9.

Referring to FIG. 18D, the second control signals CLK, CLKB, TD, and BU may be applied to the emission driver circuit 18'-n as shown in the drawing.

Here, the first selection signal TD of the high level may be applied to the first selection signal input terminal TD and the second selection signal BU of the low level may be applied to the second selection signal input terminal BU. Therefore, the transistor M13 may be turned off and the transistor M12 may be turned on. That is, the second emission signal input terminal EPWM(n+1) may be selected based on the first and second selection signals TD and BU.

Therefore, it may be seen that the emission driver circuit 18'-n may be operated based on the emission signal EPWM(n+1) input through the second emission signal input terminal EPWM(n+1).

That is, in a period ① of the driving timing diagram of FIG. 18D, the EPWM(n+1) signal of the low level may be applied at the node Q(n) through the turned-on transistor M11 based on the low-level CLKB signal and the turned-on transistor M12 based on the low-level BU signal. Accordingly, the transistor M10 may be turned on, and the low-level driving voltage VGL may be output as the emission signal EPWM(n).

In some embodiments, in periods ②, ③, and ④ of the driving timing diagram of FIG. 18C, the emission signal EPWM(n) of the low level may maintain its output.

That is, in the period ②, the CLKB signal may have the high level and the transistor M11 may thus be turned off. Accordingly, the EPWM(n+1) signal of the low level may not be directly applied to the node Q(n). However, the voltage at the node Q(n) may float while the EPWM(n+1) signal of the low level is applied thereto in the period ①, the transistor M10 may thus be maintained to be turned on, and the emission signal EPWM(n) of the low level may maintain its output.

In the period ③, the CLKB signal may have the low level again, the transistor M11 may thus be turned on, and the EPWM(n+1) signal of the low level may be applied to the node Q(n). The transistor M10 may thus be maintained to be turned on, and the emission signal EPWM(n) of the low level may maintain its output.

In the period ④, although the CLKB signal has the high level and the transistor M11 is thus turned off, the transistor M10 may be maintained to be turned on, and the emission signal EPWM(n) of the low level may maintain its output as in the period ②.

In the period ⑤ of the driving timing diagram of FIG. 18D, the emission signal EPWM(n) of the low level may then stop its output.

That is, in the period ⑤, the CLKB signal may have the low level, the transistor M11 may thus be turned on, and the EPWM(n+1) signal may be applied to the node Q(n). However, the EPWM(n+1) signal may have the high level in the period ⑤, the high-level voltage may thus be applied to the node Q(n), and the transistor M10 may be turned off.

Accordingly, the VGL signal may no longer be output as the emission signal EPWM(n). In some embodiments, in the period ⑤, the voltage at the node Q(n) as well as the node QB(n) may maintain the high level, and the transistor M9 may not be turned on either. Accordingly, the voltage at an output node (or the drain terminal of the transistor M10) of the emission driver 18'-n may float. However, a level of the voltage at the node Q(n) may be changed from the low level to the high level due to the parasitic capacitance component of the transistor M10, and the voltage at an output node of the emission driver circuit 18'-n may also rise slightly as shown in the drawing.

In a period ⑥ of the driving timing diagram of FIG. 18D, the emission signal EPWM(n) of the high level may then be output. That is, in the period ⑥, the node QB(n) may have the low level, the transistor M9 may thus be turned on, and the high-level driving voltage VGH may be output as the emission signal EPWM(n) through the turned-on transistor M9.

FIGS. 19A to 19D are views for explaining a sweep driver according to an embodiment of the present disclosure.

As described above, the sweep driver may provide the sweep signals to the subpixel circuits of the corresponding display module in the row-line order. That is, the sweep signals may not be provided to all the subpixel circuits collectively through the global signal, but provided to the subpixel circuits in the row-line order through the sweep driver circuits provided for the respective row lines.

Figure 19A:
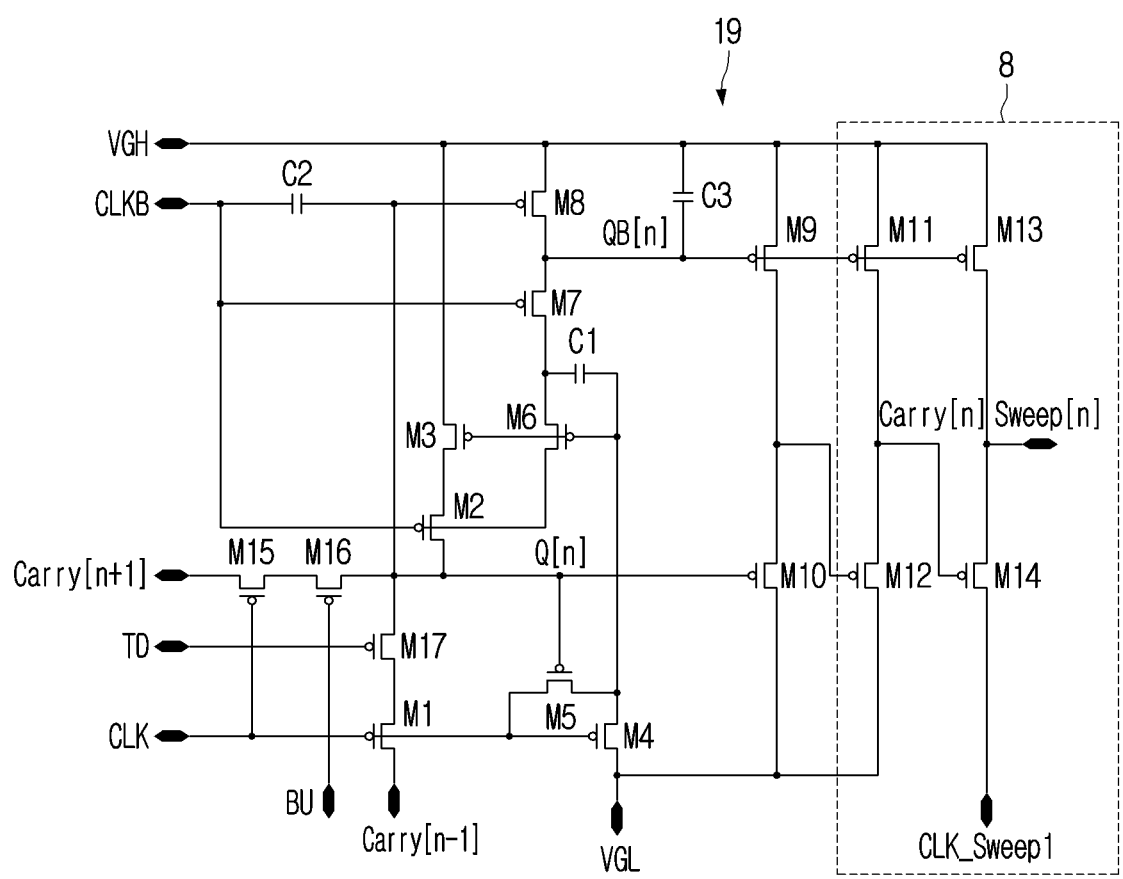
FIG. 19A is a circuit diagram of a sweep driver circuit corresponding to the n-th row line, according to an embodiment of the present disclosure.

FIG. 19A shows a circuit diagram of the sweep driver circuit corresponding to the n-th row line. Referring to FIG. 19A, a sweep driver circuit 19 may generate and output a sweep signal Sweep(n).

Referring to FIG. 19A, the sweep driver circuit 19 may receive the following signals and output the sweep signal Sweep(n): 1) the selection signals TD and BU, 2) any one selected based on the selection signals TD and BU from an output carry signal Carry(n−1) of a previous row line and an output carry signal Carry(n+1) of a next row line, 3) the clock signals CLK and CLKB, 4) an input sweep signal (CLK_Sweep 1), and 5) the driving voltage signals VGH and VGL.

Here, the input sweep signal CLK_Sweep 1 may have a form in which sweep signals sweeping between two different voltages are continuously repeated, and may be one of the plurality of input sweep signals having different phases. For example, there may be six input sweep signals having different phases, such as CLK_Sweep 1 to CLK_Sweep 6, and FIG. 19A exemplifies a case where CLK_Sweep 1, one of these signals, is input. The number of input sweep signals having the different phases is not limited to six, and may be changed according to the embodiments. Here, "having the different phases" may indicate that signals of the same waveform are shifted by predetermined time on a time axis. Here, the shifted predetermined time may depend on the number of signals having the different phases.

The sweep signal Sweep(n) may have a special shape of sweeping between two voltages over time rather than a general square wave shape. In order to successively provide this special type of sweep signal Sweep(n) in the row-line order, a carry signal Carry(n) and an input sweep signal CLK_Sweep may be used in the sweep driver according to an embodiment of the present disclosure.

The sweep driver circuit 19 may select one carry signal input terminal from carry signal input terminals Carry(n−1) and Carry(n+1) based on the selection signals TD and BU, and output the carry signal Carry(n) based on the carry signal input through the selected one carry signal input terminal. Alternatively or additionally, the sweep driver circuit 19 may output the sweep signal Sweep(n) by selecting some of the input sweep signals CLK_Sweep 1 based on the carry signal Carry(n).

Here, the selection signals TD and BU, the clock signals CLK and CLKB, and the input sweep signal CLK_Sweep 1 may be the above-mentioned control signals (e.g., the first control signals or the second control signals) applied from the timing controller 2000. Accordingly, the driving order (or driving direction) of the display module may depend on how the selection signals TD and BU, the clock signals CLK and CLKB, and the input sweep signal CLK_Sweep 1 are applied. A detailed description thereof is described below.

In some embodiments, it may be seen that the sweep driver circuit 19 shown in FIG. 19A is configured by including the carry signal and a sweep signal output unit 8 in addition to the emission driver circuit 18 of FIG. 18A. Therefore, an operation of the sweep driver circuit 19 may be somewhat similar to that of the emission driver circuit 18. A detailed description thereof is described below.

Figure 19B:
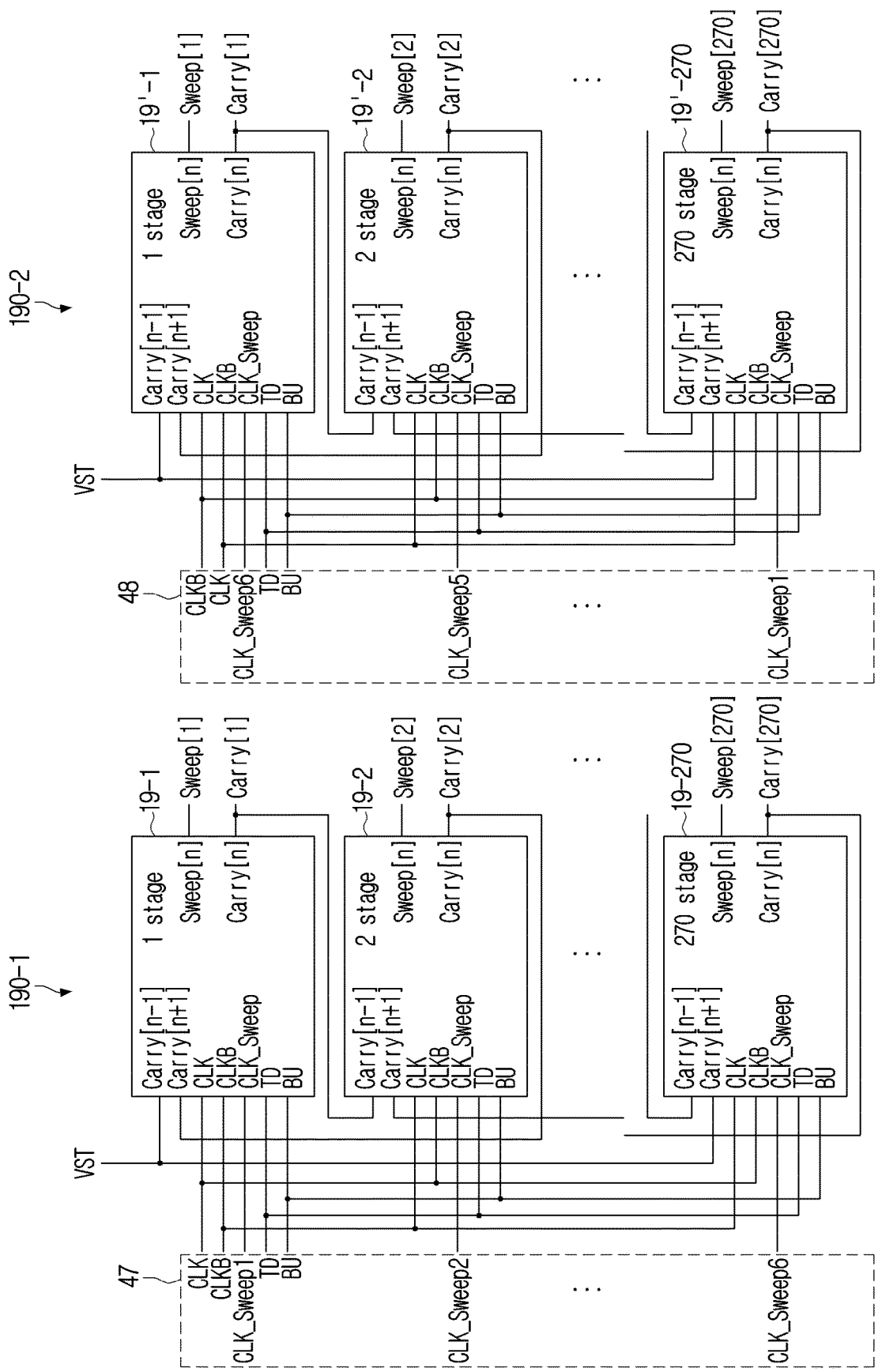
FIG. 19B is a block diagram of the sweep drivers, according to an embodiment of the present disclosure.

FIG. 19B is a block diagram of the sweep drivers according to an embodiment of the present disclosure.

FIG. 19B shows configurations of sweep drivers 190-1 and 190-2 respectively included in two display modules vertically adjacent to each other. Here, each display module may include 270 row lines for example.

Referring to FIG. 19B, it may be seen that the sweep driver 190-1 and the sweep driver 190-2 have the same configuration and connection wiring as each other, except for a difference in that the first control signals 47 are applied to the sweep driver 190-1 and the second control signals 48 are applied to the sweep driver 190-2.

The sweep driver 190-1 to which the first control signals 47 are applied may apply the sweep signal Sweep(n) to the subpixel circuits included in the corresponding display module in the first order (or first direction) of the row lines. Here, the first order of the row lines may be, for example, the order from the first to 270th row lines. Alternatively or additionally, the first direction may be the direction from top to bottom.

In some embodiments, the sweep driver 190-2 to which the second control signals 48 are applied may apply the sweep signal Sweep(n) to the subpixel circuits included in the corresponding display module in the second order (or second direction) of the row lines. Here, the second order of the row lines may be, for example, the order from the 270th to first row lines. Alternatively or additionally, the second direction may be the direction from bottom to top.

That is, the timing controller 2000 may apply the first control signals 47 to one sweep driver 190-1 among the sweep drivers 190-1 and 190-2 included in the two display modules vertically adjacent to each other, and apply the second control signals 48 to the other sweep driver 190-2. Accordingly, the two display modules vertically adjacent to each other may have the driving orders or driving directions opposite to each other.

In this way, it may be possible to prevent and/or reduce the distortion phenomenon of the moving pattern that occurs at the boundary between the display modules vertically adjacent to each other by making the driving orders or driving directions of the two display modules vertically adjacent to each other opposite to each other as described above.

Referring again to FIG. 19B, the sweep driver 190-1 may include sweep driver circuits 19-1 to 19-270 provided one by one for each row line.

Here, each of the sweep driver circuits 19-1 to 19-270 may have the first carry signal input terminal Carry(n−1) for receiving the carry signal Carry(n−1) output from the sweep driver circuit for the previous row line, and the second carry signal input terminal Carry(n+1) for receiving the carry signal Carry(n+1) output from the sweep driver circuit for the next row line.

The first carry signal input terminal Carry(n−1) of each of the sweep driver circuits 19-1 to 19-270 may be connected to the carry signal output terminal Carry(n−1) of the sweep driver circuit for the previous row line, and the second carry signal input terminal Carry(n+1) may be connected to the carry signal output terminal Carry(n+1) of the sweep driver circuit for the next row line.

In some embodiments, the first row line does not have the previous row line and the 270th row line does not have the next row line. Accordingly, the first carry signal input terminal Carry(n−1) of the sweep driver circuit 19-1 for the first row line and the second carry signal input terminal Carry(n+1) of the sweep driver circuit 19-270 for the 270th row line may each be separately connected to the wiring to which the start signal VST is applied.

Here, as described above, the sweep driver circuit 19 may be operated based on the carry signal input through one carry signal input terminal selected based on the selection signal TD or BU. Accordingly, it may be possible to apply the same start signal VST to the first carry signal input terminal Carry(n−1) of the sweep driver circuit 19-1 and the second carry signal input terminal Carry(n+1) of the sweep driver circuit 19-270 through one wiring.

In some embodiments, each of the sweep driver circuits 19-1 to 19-270 may include the first clock input terminal CLK and the second clock input terminal CLKB for respectively receiving the clock signals CLK and CLKB.

Here, the CLK signal and the CLKB signal may be applied to the first clock input terminal CLK and the second clock input terminal CLKB of the sweep driver circuits 19-1 to 19-270 for the respective row lines in an order opposite to that of the previous row line for each row line.

That is, the CLK signal may be applied to the first clock input terminal CLK of the sweep driver circuit 19-1, and the CLKB signal may be applied to the second clock input terminal CLKB. However, it may be seen that the CLKB signal is applied to the first clock input terminal CLK of the sweep driver circuit 19-2 for the next row line, and the CLK signal is applied to the second clock input terminal CLKB. This configuration may also be the same up to the sweep driver circuit 19-270 for the 270th row line.

Here, the CLK signal and the CLKB signal may be some of the first control signals applied from the timing controller 2000 and have the phases opposite to each other.

In some embodiments, each of the sweep driver circuits 19-1 to 19-270 may include an input sweep signal input terminal CLK_Sweep for receiving the input sweep signal described above in FIG. 19A. Here, the input sweep signals may be some of the first control signals 47 applied from the timing controller 2000.

Six input sweep signals CLK_Sweep 1, CLK_Sweep 2, CLK_Sweep 3, CLK_Sweep 4, CLK_Sweep 5, and CLK_Sweep 6 having the same waveform and different phases may be cyclically applied one by one to the input sweep signal input terminal CLK_Sweep of the sweep driver circuits 19-1 to 19-270 for the respective row lines.

That is, as shown in FIG. 19B, the input sweep signal CLK_Sweep 1 may be applied to the sweep driver circuit 19-1 for the first row line, and the input sweep signal CLK_Sweep 2 may be applied to the sweep driver circuit 19-2 for the second row line.

Alternatively or additionally, although not shown in the drawing, the input sweep signals CLK_Sweep 3 to CLK_Sweep 6 may be successively applied one by one to the sweep driver circuits for the 3rd to 6th row lines, and the input sweep signal CLK_Sweep 1 may be applied again to the sweep driver circuit for the 7th row line.

In this way, the input sweep signals may be applied one by one to the remaining sweep driver circuits, and the input sweep signal CLK_Sweep 6 may be applied to the last sweep driver circuit 19-270 for the 270th row line.

Alternatively or additionally, each of the sweep driver circuits 19-1 to 19-270 may include the first selection signal input terminal TD and the second selection signal input terminal BU respectively receiving the selection signals (e.g., first selection signal TD and second selection signal BU) for selecting one carry signal input terminal from the first carry signal input terminal Carry(n−1) and the second carry signal input terminal Carry(n+1).

Here, the first selection signal TD and the second selection signal BU may be some of the first control signals applied from the timing controller 2000 and have the different voltage levels. For example, the first selection signal may have the same voltage level as the low-level driving voltage signal VGL, and the second selection signal may have the same voltage level as the high-level driving voltage signal VGH. However, the present disclosure is not limited thereto.

In some embodiments, the first selection signal TD of the low level and the second selection signal BU of the high level may respectively be input through the first and second selection signal input terminals TD and BU. In this case, the sweep driver circuits 19-1 to 19-270 may select the first carry signal input terminal Carry(n−1) from the first and second carry signal input terminals Carry(n−1) and Carry (n+1), and each output the carry signal Carry(n) corresponding to each row line based on the carry signal Carry(n−1) input through the selected first carry signal input terminal Carry(n−1).

In this case, the first carry signal input terminal Carry(n−1) may be selected based on the selection signals TD and BU, and the start signal VST may thus be input to the first carry signal input terminal Carry(n−1) of the sweep driver circuit 19-1 for the first row line, and may not be input to the second carry signal input terminal Carry(n+1) of the sweep driver circuit 19-270 for the 270th row line.

Therefore, each of the sweep driver circuits 19-1 to 19-270 may successively output the carry signals Carry(n) from the first to 270th row lines based on the carry signal Carry(n−1) for the previous row line.

Alternatively or additionally, as described above with reference to FIG. 19A, the sweep driver circuit 19 may select some of the input sweep signals based on the carry signal Carry(n) and output the sweep signal Sweep(n). Therefore, the sweep driver circuits 19-1 to 19-270 may also successively output the sweep signal Sweep(n) together with the carry signal Carry(n) from the first to 270th row lines.

In some embodiments, each of sweep driver circuits 19'-1 to 19'-270 of the sweep driver 190-2 may have the same configuration and connection structure as those of each of the sweep driver circuits 19-1 to 19-270 of the sweep driver 190-1 described above. However, the sweep driver 190-1 may receive the first control signals 47 from the timing controller 2000, while the sweep driver 190-2 may receive the second control signals 48 from the timing controller 2000 through the wiring separate from that of the first control signals.

Hereinafter, the description omits redundant descriptions of the same or similar contents as those of the sweep driver 190-1 described above, and describes the sweep driver 190-2 focusing on its difference.

Referring to FIG. 19B, in the sweep driver circuit 19-1 for the first row line of the sweep driver 190-1, the CLK signal may be input to the first clock input terminal CLK, and the CLKB signal may be input to the second clock input terminal CLKB. However, it may be seen that in the sweep driver circuit 19'-1 for the first row line of the sweep driver 190-2, the CLKB signal is input to the first clock input terminal CLK, and the CLK signal is applied to the second clock input terminal CLKB.

In some embodiments, in each of the sweep driver circuits 19'-1 to 19'-270 of the sweep driver 190-2, the CLK signal and the CLKB signal may be applied to the first clock input terminal CLK and the second clock input terminal CLKB in the order opposite to that of the previous row line for each row line.

Therefore, it may be seen that the clock signals input to each of the sweep driver circuits 19-1 to 19-270 of the sweep driver 190-1 and the clock signals input to each of the sweep driver circuits 19'-1 to 19'-270 of the sweep driver 190-2 have phases opposite to each other for the same row line.

Referring to FIG. 19B, each of the sweep driver circuits 19'-1 to 19'-270 of the sweep driver 190-2 may also include the input sweep signal input terminal CLK_Sweep for receiving the input sweep signal. Here, the input sweep signals may be some of the second control signals 48 applied from the timing controller 2000.

The six input sweep signals CLK_Sweep 1, CLK_Sweep 2, CLK_Sweep 3, CLK_Sweep 4, CLK_Sweep 5, and CLK_Sweep 6 having the same waveform but the different phases may be cyclically applied one by one to the input sweep signal input terminal CLK_Sweep of the sweep driver circuits 19'-1 to 19'-270 for the respective row lines. However, the input sweep signal may be applied to the sweep driver 190-2 in an order different from that of the sweep driver 190-1.

That is, as shown in FIG. 19B, the input sweep signal CLK_Sweep 1 may be applied to the sweep driver circuit 19'-1 for the 270th row line.

Alternatively or additionally, although not shown in the drawing, the input sweep signal CLK_Sweep 2 may be applied to the sweep driver circuit for the 269th row line. Alternatively or additionally, the input sweep signals CLK_Sweep 3 to CLK_Sweep 6 may be successively applied one by one to the sweep driver circuits for the 268th to 265th row lines, and the input sweep signal CLK_Sweep 1 may be applied again to the sweep driver circuits for the 264th row line.

In this way, the input sweep signals may be applied one by one to the remaining sweep driver circuits, and the input sweep signals CLK_Sweep 5 and CLK_Sweep 6 may be applied to the sweep driver circuit 19'-2 for the second row line and the sweep driver circuit 19'-1 for the first row line, respectively.

In some embodiments, each of the first and second selection signals TD and BU included in the second control signals 48 may have a level opposite to that of the first and second selection signals TD and BU included in the first control signals 47. That is, unlike the sweep driver 190-1, the first selection signal TD of the high level may be applied to the first selection signal input terminal TD of each of the sweep driver circuits 19'-1 to 19'-270 of the sweep driver 190-2, and the second selection signal BU of the low level may be applied to the second selection signal input terminal BU.

Accordingly, the sweep driver circuits 19'-1 to 19'-270 of the sweep driver 190-2 may select the second carry signal input terminal Carry(n+1) from the first and second carry signal input terminals Carry(n−1) and Carry(n+1), and output the carry signal Carry(n) corresponding to each row line based on the carry signal Carry(n+1) input through the selected second carry signal input terminal Carry(n+1).

In this case, the second carry signal input terminal Carry (n+1) may be selected based on the selection signals TD and BU, and the start signal VST may thus be input to the second carry signal input terminal Carry(n+1) of the sweep driver circuit 19'-270 for the 270th row line, and may not be input to the first carry signal input terminal Carry(n−1) of the sweep driver circuit 19'-1 for the first row line.

Therefore, the sweep driver circuits 19'-1 to 19'-270 may respectively output the carry signals Carry(n) successively from the 270th to first row lines based on the carry signal Carry(n+1) for the next row line.

Here, as described above with reference to FIG. 19A, the sweep driver circuit 19 may select some of the input sweep signals based on the carry signal Carry(n) and output the sweep signal Sweep(n). Therefore, the sweep driver circuits 19'-1 to 19'-270 may also successively output the sweep signal Sweep(n) together with the carry signal Carry(n) from the 270th to first row lines.

Hereinafter, the description describes an operation of the sweep driver circuit 19 in more detail with reference to FIGS. 19C and 19D.

FIG. 19C shows the sweep driver circuit 19-n for the n-th row line among the plurality of sweep driver circuits 19-1 to 19-270 included in the sweep driver 190-1 of FIG. 19B and a driving timing diagram thereof, and FIG. 19D shows the sweep driver circuit 19'-n for the n-th row line among the plurality of sweep driver circuits 19'-1 to 19'-270 included in the sweep driver 190-2 of FIG. 19B and a driving timing diagram thereof, respectively.

As described above, it may be confirmed from comparison of FIGS. 19C and 19D that the sweep driver circuit 19-n and the sweep driver circuit 19'-n have the same configuration.

However, it may be seen that the clock signals of the opposite phases are applied to the clock input terminal at the same location, different input sweep signals are input to the input sweep signal input terminal at the same location, and the first selection signal TD and the second selection signal BU, applied to the first selection signal input terminal TD and the second selection signal input terminal BU, have levels opposite to each other. That is, the above-described first control signals 47 may be applied to the sweep driver circuit 19-n of FIG. 19C, and the above-described second control signals 48 may be applied to the sweep driver circuit 19'-n of FIG. 19D, respectively.

Referring first to FIG. 19C, the first control signals CLK, CLKB, CLK_Sweep 1, TD, and BU may be applied to the sweep driver circuit 19-n as shown in the drawing.

Here, the first selection signal TD of the low level may be applied to the first selection signal input terminal TD and the second selection signal BU of the high level may be applied to the second selection signal input terminal BU. Therefore, a transistor M17 may be turned on and a transistor M16 may be turned off. That is, the first carry signal input terminal Carry(n−1) may be selected based on the first and second selection signals TD and BU.

Therefore, it may be seen that the sweep driver circuit 19-n may be operated based on the carry signal Carry(n−1) input through the first carry signal input terminal Carry(n−1).

That is, in a period ① of the driving timing diagram of FIG. 19C, the Carry(n−1) signal of the low level may be applied at the node Q(n) through the turned-on transistor M1 based on the low-level CLK signal and the turned-on transistor M17 based on the low-level TD signal. Accordingly, the transistor M10 may be turned on, and the low-level driving voltage VGL may be applied to a gate terminal of the transistor M12. Accordingly, the low-level driving voltage VGL may be output as the carry signal Carry(n) through the turned-on transistor M12.

In some embodiments, in periods ②, ③, and ④ of the driving timing diagram of FIG. 19C, the carry signal Carry(n) of the low level may maintain its output.

That is, in the period ②, the CLK signal may have the high level and the transistor M1 may thus be turned off. Accordingly, the Carry(n−1) signal of the low level may not be directly applied to the node Q(n). However, the voltage at the node Q(n) may float while the Carry(n−1) signal of the low level is applied thereto in the period ①, and the transistor M10 may thus be maintained to be turned on. The transistor M12 may thus be maintained to be turned on, and the carry signal Carry(n) of the low level may maintain its output.

In the period ③, the CLK signal may have the low level again, the transistor M1 may thus be turned on, and the Carry(n−1) signal of the low level may be applied to the node Q(n). The transistors M10 and M12 may thus be maintained to be turned on, and the carry signal Carry(n) of the low level may maintain its output.

In the period ④, although the CLK signal has the high level and the transistor M1 is thus turned off, the transistors M10 and M12 may be maintained to be turned on, and the carry signal Carry(n) of the low level may maintain its output as in the period ②.

In the period ⑤ of the driving timing diagram of FIG. 19C, the carry signal Carry(n) of the low level may then maintain its output unlike the operation of the emission driver 18-n of FIG. 18C.

That is, in the period ⑤, the CLK signal may have the low level, the transistor M1 may thus be turned on, and the Carry(n−1) signal may be applied to the node Q(n). However, the Carry(n−1) signal may have the high level in the period ⑤, the high-level voltage may thus be applied to the node Q(n), and the transistor M10 may be turned off. Accordingly, the VGL signal may no longer be output through the transistor M10.

However, in the period ⑤, the voltage at the node Q(n) as well as the node QB(n) may maintain the high level, and the transistor M9 may not be turned on either. Alternatively or additionally, the voltage at the drain terminal of the transistor M10 may float while the low-level voltage is applied thereto in the period ④. Therefore, the transistor M12 may be maintained to be turned on, and the VGL signal may be output as the carry signal Carry(n) through the transistor M12. That is, the carry signal Carry(n) of the low level may maintain its output.

In the period ⑥ of the driving timing diagram of FIG. 19C, the carry signal Carry(n) of the high level may then be output. That is, in the period ⑥, the node QB(n) may have the low level, and the transistors M9 and M11 may thus be turned on; the high-level driving voltage VGH may be applied to the gate terminal of the transistor M12 through the turned-on transistor M9, and the transistor M12 may thus be turned off; and the high-level driving voltage VGH may be output as the carry signal Carry(n) through the turned-on transistor M11.

In some embodiments, the sweep signal Sweep(n) sweeping between the two voltages may be selectively output from the input sweep signal CLK_Sweep 1 while the carry signal Carry(n) of the low level is output.

Referring to FIG. 19C, the sweep signal Sweep(n) may be selectively output from the input sweep signal CLK_Sweep 1 while the transistor M14 is turned on. As described above, the carry signal Carry(n) may have the low level in the periods ① to ⑤. Therefore, the transistor M14 may be turned on in the periods ① to ⑤, and output the input sweep signal CLK_Sweep 1 applied to the source terminal as the sweep signal Sweep(n) in the periods ① to ⑤.

Referring to FIG. 19D, the second control signals CLK, CLKB, CLK_Sweep 6, TD, and BU may be applied to the emission driver circuit 19'-n as shown in the drawing.

Here, the first selection signal TD of the high level may be applied to the first selection signal input terminal TD and the second selection signal BU of the low level may be applied to the second selection signal input terminal BU. Therefore, the transistor M17 may be turned off and the transistor M16 may be turned on. That is, the second carry signal input terminal Carry(n+1) may be selected based on the first and second selection signals TD and BU.

Therefore, it may be seen that the sweep driver circuit 19'-n is operated based on the carry signal Carry(n+1) input through the second carry signal input terminal Carry(n+1).

That is, in a period ① of the driving timing diagram of FIG. 19D, the Carry(n+1) signal of the low level may be applied at the node Q(n) through a turned-on transistor M15 based on the low-level CLKB signal and the turned-on transistor M16 based on the low-level BU signal. Accordingly, the transistor M10 may be turned on, and the low-level driving voltage VGL may be output as the carry signal Carry(n) through the turned-on transistor M12.

In some embodiments, in periods ②, ③, and ④ of the driving timing diagram of FIG. 19D, the carry signal Carry (n) of the low level may maintain its output.

That is, in the period ②, the CLKB signal may have the high level and the transistor M15 may thus be turned off. Accordingly, the Carry(n+1) signal of the low level may not be directly applied to the node Q(n). However, the voltage at the node Q(n) may float while the Carry(n+1) signal of the low level is applied thereto in the period ①, and the transistor M10 may thus be maintained to be turned on. The transistor M12 may thus be maintained to be turned on, and the carry signal Carry(n) of the low level may maintain its output.

In the period ③, the CLKB signal may have the low level again, the transistor M15 may thus be turned on, and the Carry(n+1) signal of the low level may be applied to the node Q(n). The transistors M10 and M12 may thus be maintained to be turned on, and the carry signal Carry(n) of the low level may maintain its output.

In the period ④, although the CLKB signal has the high level and the transistor M15 is thus turned off, the transistors M10 and M12 may be maintained to be turned on, and the carry signal Carry(n) of the low level may maintain its output as in the period ②.

In the period ⑤ of the driving timing diagram of FIG. 19D, the carry signal Carry(n) of the low level may then maintain its output unlike the operation of the emission driver 18'-n of FIG. 18D.

That is, in the period ⑤, the CLKB signal may have the low level, the transistor M15 may thus be turned on, and the Carry(n+1) signal may be applied to the node Q(n). However, the Carry(n+1) signal may have the high level in the period ⑤, the high-level voltage may thus be applied to the node Q(n), and the transistor M10 may be turned off. Accordingly, the VGL signal may no longer be output through the transistor M10.

However, in the period ⑤, the voltage at the node Q(n) as well as the node QB(n) may maintain the high level, and the transistor M9 may not be turned on either. Alternatively or additionally, the voltage at the drain terminal of the transistor M10 may float while the low-level voltage is applied thereto in the period ④. Therefore, the transistor M12 may be maintained to be turned on, and the VGL signal may be output as the carry signal Carry(n) through the transistor M12. That is, the carry signal Carry(n) of the low level may maintain its output.

In the period ⑥ of the driving timing diagram of FIG. 19D, the carry signal Carry(n) of the high level may then be output. That is, in the period ⑥, the node QB(n) may have the low level, and the transistors M9 and M11 may thus be turned on; the high-level driving voltage VGH may be applied to the gate terminal of the transistor M12 through the turned-on transistor M9, and the transistor M12 may thus be turned off; and the high-level driving voltage VGH may be output as the carry signal Carry(n) through the turned-on transistor M11.

In some embodiments, the sweep signal Sweep(n) sweeping between the two voltages may be selectively output from the input sweep signal CLK_Sweep 6 while the carry signal Carry(n) of the low level is output.

That is, referring to FIG. 19D, the sweep signal Sweep(n) may be selectively output from the input sweep signal CLK_Sweep 6 while the transistor M14 is turned on. As described above, the carry signal Carry(n) may have the low level in the periods ① to ⑤. Therefore, the transistor M14 may be turned on in the periods ① to ⑤, and output the input sweep signal CLK_Sweep 6 applied to the source terminal as the sweep signal Sweep(n) in the periods ① to ⑤.

FIGS. 20A to 20D are views for explaining an emission driver according to an embodiment of the present disclosure.

As described above, the emission driver may provide the emission signals to the subpixel circuits of the corresponding display module in the row-line order. That is, the emission signals may not be provided to all the subpixel circuits collectively through the global signal, but provided to the subpixel circuits in the row-line order through the emission driver circuits provided for the respective row lines.

Figure 20A:
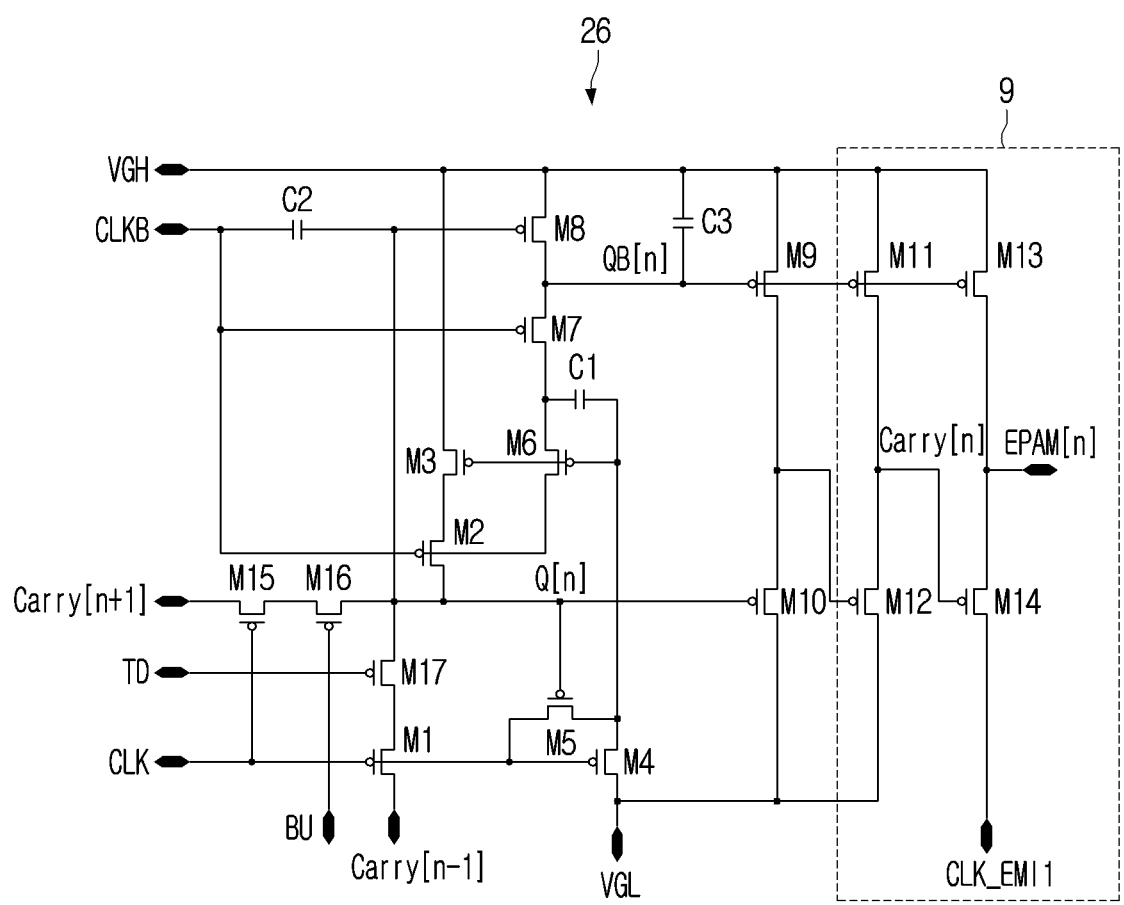
FIG. 20A is a circuit diagram of an emission driver circuit corresponding to the n-th row line, according to an embodiment of the present disclosure.

FIG. 20A shows a circuit diagram of the emission driver circuit corresponding to the n-th row line. Referring to FIG. 20A, an emission driver circuit 26 may generate and output an emission signal EPAM(n). Here, the emission signal EPAM(n) may be the above-mentioned emission signal Emi_PAM(n).

Referring to FIG. 20A, the emission driver circuit 26 may receive the following signals and output the emission signal EPAM(n): 1) the selection signals TD and BU, 2) any one selected based on the selection signals TD and BU from an output carry signal Carry(n−1) of a previous row line and an output carry signal Carry(n+1) of a next row line, 3) the clock signals CLK and CLKB, 4) an input emission signal CLK_EMI 1, and 5) the driving voltage signals VGH and VGL.

Here, the input emission signal CLK_EMI 1 may be one of the plurality of input emission signals having the same waveform and different phases. For example, there may be six input emission signals having different phases, such as CLK_EMI 1 to CLK_EMI 6, and FIG. 20A exemplifies a case where CLK_EMI 1, one of these signals, is input. The number of input emission signals having the different phases is not limited to six, and may be changed according to the embodiments. Here, "having the different phases" may indicate that signals of the same waveform are shifted by predetermined time on a time axis. Here, the shifted predetermined time may depend on the number of signals having the different phases.

As described above, in order to drive the display panel 100 by the progressive driving method, the emission signal EPAM(n) may need to have a low level in each light emission section that is performed in the row-line order in the image frame period 60 (and also in a part of the section 66 in the blanking period 65). However, in order to implement the non-light emission section 67 in which none of the inorganic light-emitting elements of the display panel 100 emits light, the emission signal EPAM(n) for each row line may need to have a high level in the non-light emission section 67 during the blanking period 65.

In order to generate the emission signal EPAM(n) satisfying these two conditions together, the emission driver according to an embodiment of the present disclosure uses the carry signal Carry(n) and the input emission signal CLK_EMI.

The emission driver circuit 26 may select one carry signal input terminal from the carry signal input terminals Carry (n−1) and Carry(n+1) based on the selection signals TD and BU, and output the carry signal Carry(n) based on the carry signal input through the selected one carry signal input terminal. Alternatively or additionally, the emission driver circuit 26 may output the emission signal EPAM(n) by selecting some of the input emission signals CLK_EMI 1 based on the carry signal Carry(n).

Here, the selection signals TD and BU, the clock signals CLK and CLKB, and the input emission signal CLK_EMI 1 may be the above-mentioned control signals (e.g., the first control signals or the second control signals) applied from the timing controller 2000. Accordingly, the driving order (or driving direction) of the display module may depend on how the selection signals TD and BU, the clock signals CLK and CLKB, and the input emission signal CLK_EMI 1 are applied. A detailed description thereof is described below.

In some embodiments, it may be seen that the emission driver circuit 26 shown in FIG. 20A is configured by including the carry signal and an emission signal output unit 9 in addition to the emission driver circuit 18 of FIG. 18A. Therefore, an operation of the emission driver circuit 26 may be somewhat similar to that of the emission driver circuit 18. A detailed description thereof is described below.

Figure 20B:
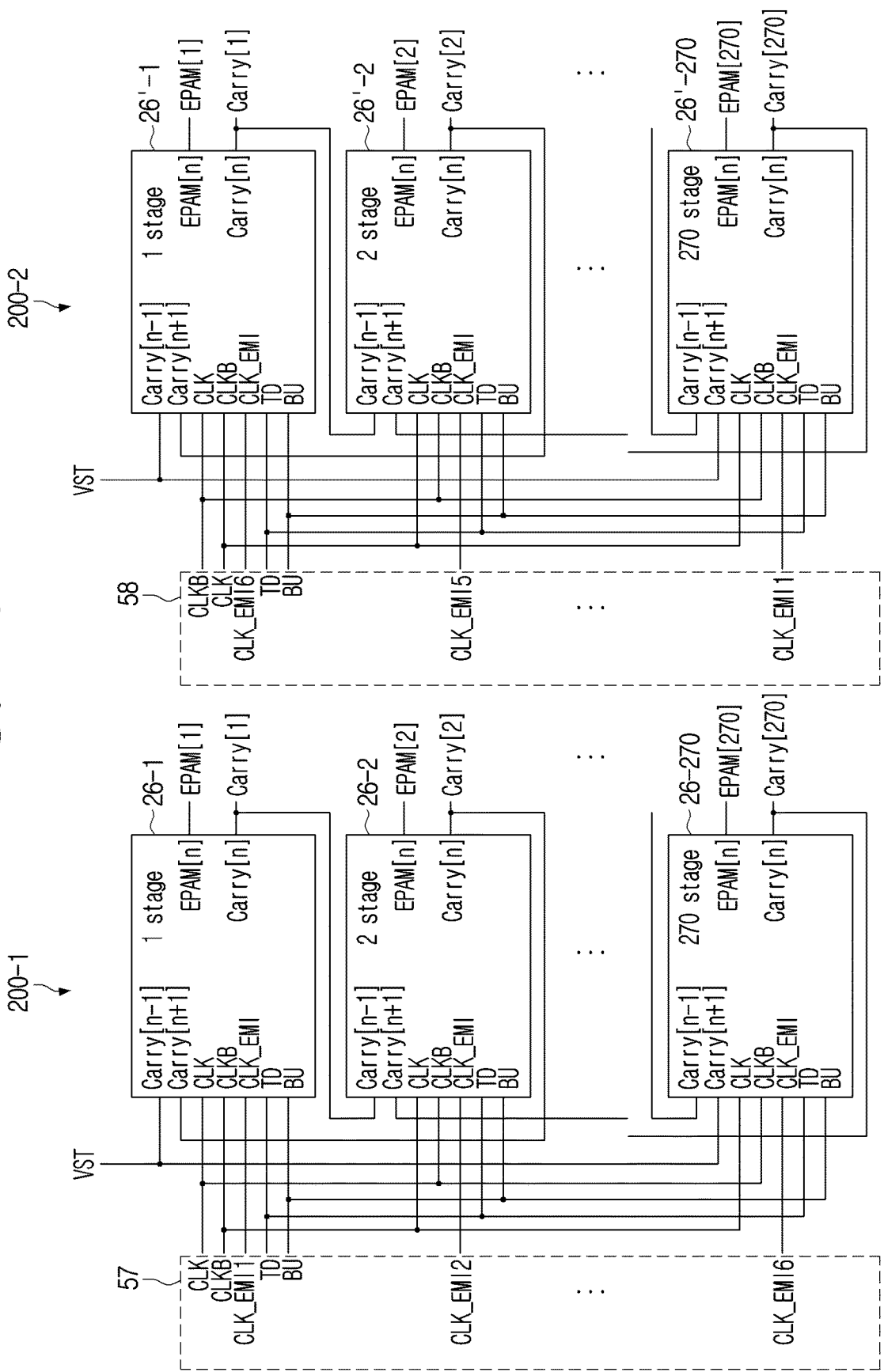
FIG. 20B is a block diagram of the emission drivers, according to an embodiment of the present disclosure.

FIG. 20B is a block diagram of the emission drivers according to an embodiment of the present disclosure.

FIG. 20B shows configurations of emission drivers 200-1 and 200-2 respectively included in two display modules vertically adjacent to each other. Here, each display module may include 270 row lines for example.

Referring to FIG. 20B, it may be seen that the emission driver 200-1 and the emission driver 200-2 have the same configuration and wiring as each other, except for a difference in that the first control signals 57 are applied to the emission driver 200-1 and the second control signals 58 are applied to the emission driver 200-2.

The emission driver 200-1 to which the first control signals 57 are applied may provide the emission signal EPAM(n) to the subpixel circuits included in the corresponding display module in the first order (or first direction) of the row lines. Here, the first order of the row lines may be, for example, the order from the first to 270th row lines. Alternatively or additionally, the first direction may be the direction from top to bottom.

In some embodiments, the emission driver 200-2 to which the second control signals 58 are applied may provide the emission signal EPAM(n) to the subpixel circuits included in the corresponding display module in the second order (or second direction) of the row lines. Here, the second order of the row lines may be, for example, the order from the 270th to first row lines. Alternatively or additionally, the second direction may be the direction from bottom to top.

That is, the timing controller 2000 may apply the first control signals 57 to one emission driver 200-1 among the emission drivers 200-1 and 200-2 included in the two display modules vertically adjacent to each other, and apply the second control signals 58 to the other emission driver 200-2. Accordingly, the two display modules vertically adjacent to each other may have the driving orders or driving directions opposite to each other.

In this way, it may be possible to prevent and/or reduce the distortion phenomenon of the moving pattern that occurs at the boundary between the display modules vertically adjacent to each other by making the driving orders or driving directions of the two display modules vertically adjacent to each other opposite to each other as described above.

In some embodiments, the emission signal EPAM(n) provided by the emission driver 200-1 and the emission signal EPAM(n) provided by the emission driver 200-2 may be provided in the row-line order (e.g., in the first order or in the second order) based on the carry signal Carry(n), as well as all have the low level in the image frame period 60 (and also in a part of the section 66 in the blanking period 65) and the high level in the non-light emission section 67.

Referring again to FIG. 20B, the emission driver 200-1 may include emission driver circuits 26-1 to 26-270 provided one by one for each row line.

Here, each of the emission driver circuits 26-1 to 26-270 may include the first carry signal input terminal Carry(n−1) for receiving the carry signal Carry(n−1) output from the emission driver circuit for the previous row line, and the second carry signal input terminal Carry(n+1) for receiving the carry signal Carry(n+1) output from the emission driver circuit for the next row line.

The first carry signal input terminal Carry(n−1) of each of the emission driver circuits 26-1 to 26-270 may be connected to the carry signal output terminal Carry(n−1) of the emission driver circuit for the previous row line, and the second carry signal input terminal Carry(n+1) may be connected to the carry signal output terminal Carry(n+1) of the emission driver circuit for the next row line.

In some embodiments, the first row line does not have the previous row line and the 270th row line does not have the next row line. Accordingly, the first carry signal input terminal Carry(n−1) of the emission driver circuit 26-1 for the first row line and the second carry signal input terminal Carry(n+1) of the emission driver circuit 26-270 for the 270th row line may each be separately connected to the wiring to which the start signal VST is applied.

Here, as described above, the emission driver circuit 26 may be operated based on the carry signal input through one carry signal input terminal selected based on the selection signal TD or BU. Accordingly, it may be acceptable to apply the same start signal VST to the first carry signal input terminal Carry(n−1) of the emission driver circuit 26-1 and the second carry signal input terminal Carry(n+1) of the emission driver circuit 26-270 through one wiring.

In some embodiments, each of the emission driver circuits 26-1 to 26-270 may include the first clock input terminal CLK and the second clock input terminal CLKB for respectively receiving the clock signals CLK and CLKB.

Here, the CLK signal and the CLKB signal may be applied to the first clock input terminal CLK and the second clock input terminal CLKB of the emission driver circuits 26-1 to 26-270 for the respective row lines in an order opposite to that of the previous row line for each row line.

That is, the CLK signal may be applied to the first clock input terminal CLK of the emission driver circuit 26-1, and the CLKB signal may be applied to the second clock input terminal CLKB. However, it may be seen that the CLKB signal is applied to the first clock input terminal CLK of the emission driver circuit 26-2 for the next row line, and the CLK signal is applied to the second clock input terminal CLKB. This configuration may also be the same up to the emission driver circuit 26-270 for the 270th row line.

Here, the CLK signal and the CLKB signal may be some of the first control signals applied from the timing controller 2000 and have the phases opposite to each other.

In some embodiments, each of the emission driver circuits 26-1 to 26-270 may include an input emission signal input terminal CLK_EMI for receiving the input emission signal described above in FIG. 20A. Here, the input emission signals may be some of the first control signals 57 applied from the timing controller 2000.

Six input emission signals CLK_EMI 1, CLK_EMI 2, CLK_EMI 3, CLK_EMI 4, CLK_EMI 5, and CLK_EMI 6 having the same waveform and different phases may be cyclically applied one by one to the input emission signal input terminal CLK_EMI of the emission driver circuits 26-1 to 26-270 for the respective row lines.

That is, as shown in FIG. 20B, the input emission signal CLK_EMI 1 may be applied to the emission driver circuit 26-1 for the first row line, and the input sweep signal CLK_EMI 2 may be applied to the emission driver circuit 26-2 for the second row line.

Alternatively or additionally, although not shown in the drawing, the input emission signals CLK_EMI 3 to CLK_EMI 6 may be successively applied one by one to the emission driver circuits for the 3rd to 6th row lines, and the input emission signal CLK_EMI 1 may be applied again to the emission driver circuit for the 7th row line.

In this way, the input emission signals may be applied one by one to the remaining emission driver circuits, and the input emission signal CLK_EMI 6 may be applied to the last emission driver circuit 26-270 for the 270th row line.

Alternatively or additionally, each of the emission driver circuits 26-1 to 26-270 may include the first selection signal input terminal TD and the second selection signal input terminal BU respectively receiving the selection signals (e.g., first selection signal TD and second selection signal BU) for selecting one carry signal input terminal from the first carry signal input terminal Carry(n−1) and the second carry signal input terminal Carry(n+1).

Here, the first selection signal TD and the second selection signal BU may be some of the first control signals applied from the timing controller 2000 and have the different voltage levels. For example, the first selection signal TD may have the same voltage level as the low-level driving voltage signal VGL, and the second selection signal BU may have the same voltage level as the high-level driving voltage signal VGH. However, the present disclosure is not limited thereto.

In some embodiments, the first selection signal TD of the low level and the second selection signal BU of the high level may respectively be input through the first and second selection signal input terminals TD and BU. In this case, the emission driver circuits 26-1 to 26-270 may select the first carry signal input terminal Carry(n−1) from the first and second carry signal input terminals Carry(n−1) and Carry(n+1), and each output the carry signal Carry(n) corresponding to each row line based on the carry signal Carry(n−1) input through the selected first carry signal input terminal Carry(n−1).

In this case, the first carry signal input terminal Carry(n−1) may be selected based on the selection signals TD and BU, and the start signal VST may thus be input to the first carry signal input terminal Carry(n−1) of the emission driver circuit 26-1 for the first row line, and may not input to the second carry signal input terminal Carry(n+1) of the emission driver circuit 26-270 for the 270th row line.

Therefore, each of the emission driver circuits 26-1 to 26-270 may successively output the carry signals Carry(n) of the low level from the first to 270th row lines based on the carry signal Carry(n−1) for the previous row line.

Alternatively or additionally, as described above with reference to FIG. 20A, the emission driver circuit 26 may select some of the input emission signals based on the carry signal Carry(n) and output the emission signal EPAM(n). Therefore, the emission driver circuits 26-1 to 26-270 may also successively output the emission signal EPAM(n) together with the carry signal Carry(n) from the first to 270th row lines.

Here, the carry signal Carry(n) output in the row-line order may have the low level in both the image frame period 60 and the blanking period 65. On the other hand, the emission signal EPAM(n) output in the row-line order may have the low level in the image frame period 60 (and also in a part of the section 66 in the blanking period 65) and have the high level in the non-light emission section 67.

In some embodiments, each of emission driver circuits 26'-1 to 26'-270 of the emission driver 200-2 may have the same configuration and connection structure as those of each of the emission driver circuits 26-1 to 26-270 of the emission driver 200-1 described above. However, the emission driver 200-1 may receive the first control signals 57 from the timing controller 2000, while the emission driver 200-2 may receive the second control signals 58 from the timing controller 2000 through the wiring separate from that of the first control signals.

Hereinafter, the description omits redundant descriptions of the same or similar contents as those of the emission driver 200-1 described above, and describes the emission driver 200-2 focusing on its difference.

Referring to FIG. 20B, in the emission driver circuit 26-1 for the first row line of the emission driver 200-1, the CLK signal may be input to the first clock input terminal CLK, and the CLKB signal may be input to the second clock input terminal CLKB. However, it may be seen that in the emission driver circuit 26'-1 for the first row line of the emission driver 200-2, the CLKB signal is input to the first clock input terminal CLK, and the CLK signal is applied to the second clock input terminal CLKB.

In some embodiments, also in each of the emission driver circuits 26'-1 to 26'-270 of the emission driver 200-2, the CLK signal and the CLKB signal may be applied to the first clock input terminal CLK and the second clock input terminal CLKB in the order opposite to that of the previous row line for each row line.

Therefore, it may be seen that the clock signals input to each of the emission driver circuits 26-1 to 26-270 of the emission driver 200-1 and the clock signals input to each of the emission driver circuits 26'-1 to 26'-270 of the emission driver 200-2 have phases opposite to each other for the same row line.

Referring to FIG. 20B, each of the sweep driver circuits 26'-1 to 26'-270 of the emission driver 200-2 may also include the input emission signal input terminal CLK_EMI for receiving the input emission signal. Here, the input emission signals may be some of the second control signals 58 applied from the timing controller 2000.

The six input emission signals CLK_EMI 1, CLK_EMI 2, CLK_EMI 3, CLK_EMI 4, CLK_EMI 5, and CLK_EMI 6 having the same waveform and the different phases may be cyclically applied one by one to the input emission signal input terminal CLK_EMI of the emission driver circuits 26'-1 to 26'-270 for the respective row lines. However, the input emission signal may be applied to the emission driver 200-2 in an order different from that of the emission driver 200-1.

That is, as shown in FIG. 20B, the input emission signal CLK_EMI 1 may be applied to the emission driver circuit 26'-270 for the 270th row line.

Alternatively or additionally, although not shown in the drawing, the input emission signal CLK_EMI 2 may then be applied to the emission driver circuit for the 269th row line. Alternatively or additionally, the input emission signals CLK_EMI 3 to CLK_EMI 6 may be successively applied one by one to the emission driver circuits for the 268th to 265th row lines, and the input emission signal CLK_EMI 1 may be applied again to the emission driver circuit for the 264th row line.

In this way, the input emission signals may be applied one by one to the remaining emission driver circuits, and the input emission signals CLK_EMI 5 and CLK_EMI 6 may be applied to the emission driver circuit 26'-2 for the second row line and the emission driver circuit 26'-1 for the first row line, respectively.

In some embodiments, each of the first and second selection signals TD and BU included in the second control signals 58 may have a level opposite to that of the first and second selection signals TD and BU included in the first control signals 57. That is, unlike the emission driver 200-1, the first selection signal TD of the high level may be applied to the first selection signal input terminal TD of each of the emission driver circuits 26'-1 to 26'-270 of the emission driver 200-2, and the second selection signal BU of the low level may be applied to the second selection signal input terminal BU.

Accordingly, the emission driver circuits 26'-1 to 26'-270 of the emission driver 200-2 may select the second carry signal input terminal Carry(n+1) from the first and second carry signal input terminals Carry(n−1) and Carry(n+1), and output the carry signal Carry(n) corresponding to each row line based on the carry signal Carry(n+1) input through the selected second carry signal input terminal Carry(n+1).

In this case, the second carry signal input terminal Carry (n+1) may be selected based on the selection signals TD and BU, and the start signal VST may thus be input to the second carry signal input terminal Carry(n+1) of the emission driver circuit 26'-270 for the 270th row line, and may not be input to the first carry signal input terminal Carry(n−1) of the emission driver circuit 26'-1 for the first row line.

Therefore, the emission driver circuits 26'-1 to 26'-270 may respectively output the carry signals Carry(n) successively from the 270th to first row lines based on the carry signal Carry(n+1) for the next row line.

Here, as described above with reference to FIG. 20A, the emission driver circuit 26 may select some of the input emission signals based on the carry signal Carry(n) and output the emission signal EPAM(n). Therefore, the emission driver circuits 26'-1 to 26'-270 may also successively output the emission signal EPAM(n) together with the carry signal Carry(n) from the 270th to first row lines.

Here, the carry signal Carry(n) output in the row-line order may have the low level in both the image frame period 60 and the blanking period 65. On the other hand, the emission signal EPAM(n) output in the row-line order may have the low level in the image frame period 60 (and also in a part of the section 66 in the blanking period 65) and have the high level in the non-light emission section 67.

Hereinafter, the description describes an operation of the emission driver circuit 26 in more detail with reference to FIGS. 20C and 20D.

FIG. 20C shows the emission driver circuit 26-n for the n-th row line among the plurality of emission driver circuits 26-1 to 26-270 included in the emission driver 200-1 of FIG. 20B and a driving timing diagram thereof, and FIG. 20D shows the emission driver circuit 26'-n for the n-th row line among the plurality of emission driver circuits 26'-1 to 26'-270 included in the emission driver 200-2 of FIG. 20B and a driving timing diagram thereof, respectively.

First, it may be confirmed that the emission driver circuit 26-n in FIG. 20C and the scan driver circuit 26'-n in FIG. 20D have the same configuration as described above when comparing these circuits with each other.

However, it may be seen that the clock signals of the opposite phases are applied to the clock input terminal at the same location, different input emission signals are input to the input emission signal input terminal at the same location, and the first selection signal TD and the second selection signal BU, applied to the first selection signal input terminal TD and the second selection signal input terminal BU, have levels opposite to each other. That is, the above-described first control signals 57 may be applied to the emission driver circuit 26-n of FIG. 20C, and the above-described second control signals 58 may be applied to the emission driver circuit 26'-n of FIG. 20D, respectively.

Referring first to FIG. 20C, the first control signals CLK, CLKB, CLK_EMI 1, TD, and BU may be applied to the emission driver circuit 26-n as shown in the drawing.

Here, the first selection signal TD of the low level may be applied to the first selection signal input terminal TD and the second selection signal BU of the high level may be applied to the second selection signal input terminal BU. Therefore, the transistor M17 may be turned on and the transistor M16 may be turned off. That is, the first carry signal input terminal Carry(n−1) may be selected based on the first and second selection signals TD and BU.

Therefore, it may be seen that the emission driver circuit 26-n may be operated based on the carry signal Carry(n−1) input through the first carry signal input terminal Carry(n−1).

That is, in a period ① of the driving timing diagram of FIG. 20C, the Carry(n−1) signal of the low level may be applied at the node Q(n) through the turned-on transistor M1 based on the low-level CLK signal and the turned-on transistor M17 based on the low-level TD signal. Accordingly, the transistor M10 may be turned on, and the low-level driving voltage VGL may be applied to the gate terminal of the transistor M12. Accordingly, the low-level driving voltage VGL may be output as the carry signal Carry(n) through the turned-on transistor M12.

In some embodiments, in periods ②, ③, and ④ of the driving timing diagram of FIG. 20C, the carry signal Carry (n) of the low level may maintain its output.

That is, in the period ②, the CLK signal may have the high level and the transistor M1 may thus be turned off. Accordingly, the Carry(n−1) signal of the low level may not be directly applied to the node Q(n). However, the voltage at the node Q(n) may float while the Carry(n−1) signal of the low level is applied thereto in the period ①, and the transistor M10 may thus be maintained to be turned on. The transistor M12 may thus be maintained to be turned on, and the carry signal Carry(n) of the low level may maintain its output.

In the period ③, the CLK signal may have the low level again, the transistor M1 may thus be turned on, and the Carry(n−1) signal of the low level may be applied to the node Q(n). The transistors M10 and M12 may thus be maintained to be turned on, and the carry signal Carry(n) of the low level may maintain its output.

In the period ④, although the CLK signal has the high level and the transistor M1 is thus turned off, the transistors M10 and M12 may be maintained to be turned on, and the carry signal Carry(n) of the low level may maintain its output as in the period ②.

In the period ⑤ of the driving timing diagram of FIG. 20C, the carry signal Carry(n) of the low level may then maintain its output unlike the operation of the emission driver 18-n of FIG. 18C.

That is, in the period ⑤, the CLK signal may have the low level, the transistor M1 may thus be turned on, and the Carry(n−1) signal may be applied to the node Q(n). However, the Carry(n−1) signal may have the high level in the period ⑤, the high-level voltage may thus be applied to the node Q(n), and the transistor M10 may be turned off. Accordingly, the VGL signal may no longer be output through the transistor M10.

However, in the period ⑤, the voltage at the node Q(n) as well as the node QB(n) may maintain the high level, and the transistor M9 may not be turned on either. Alternatively or additionally, the voltage at the drain terminal of the transistor M10 may float while the low-level voltage is applied thereto in the period ④. Therefore, the transistor M12 may be maintained to be turned on, and the VGL signal may be output as the carry signal Carry(n) through the transistor M12. That is, the carry signal Carry(n) of the low level may maintain its output.

In the period ⑥ of the driving timing diagram of FIG. 20C, the carry signal Carry(n) of the high level may then be output. That is, in the period ⑥, the node QB(n) may have the low level, and the transistors M9 and M11 may thus be turned on; the high-level driving voltage VGH may be applied to the gate terminal of the transistor M12 through the turned-on transistor M9, and the transistor M12 may thus be turned off; and the high-level driving voltage VGH may be output as the carry signal Carry (n) through the turned-on transistor M11.

In some embodiments, the emission signal EPAM(n) may be selectively output from the input sweep signal CLK_EMI 1 while the carry signal Carry(n) of the low level is output.

That is, referring to the circuit diagram of FIG. 20C, the emission signal EPAM(n) may be selectively output from the input emission signal CLK_EMI 1 while the transistor M14 is turned on. As described above, the carry signal Carry(n) may have the low level in the periods ① to ⑤. Therefore, the transistor M14 may be turned on in the periods ① to ⑤, and output the input emission signal CLK_EMI 1 applied to the source terminal as the emission signal EPAM(n) in the periods ① to ⑤.

Here, it may be seen that each waveform of the input emission signals CLK_EMI 1 to CLK_EMI 6 shown in the driving timing diagram of FIG. 20C has a pattern in which the low and high levels are repeated in the image frame period 60 (and also in a part of the section 66 in the blanking period 65), and each of the input emission signals CLK_EMI 1 to CLK_EMI 6 has the high level in the non-light emission section 67.

Therefore, it may be seen that the emission driver circuit 26-n outputs the low-level emission signal EPAM(n) in the image frame period 60 (and also in a part of the section 66 in the blanking period 65) and the high-level emission signal EPAM(n) in the non-light emission section 67 even though the low-level carry signal Carry (n) is output equally in the image frame period 60 and the blanking period 65. That is, it may be seen that the emission signal EPAM(n) satisfying the above two conditions together is generated and output through the emission driver circuit 26-n according to an embodiment of the present disclosure.

Referring to FIG. 20D, the second control signals CLK, CLKB, CLK_EMI 6, TD, and BU may be applied to the emission driver circuit 26'-n as shown in the drawing.

Here, the first selection signal TD of the high level may be applied to the first selection signal input terminal TD and the second selection signal BU of the low level may be applied to the second selection signal input terminal BU. Therefore, the transistor M17 may be turned off and the transistor M16 may be turned on. That is, the second carry signal input terminal Carry(n+1) may be selected based on the first and second selection signals TD and BU.

Therefore, it may be seen that the emission driver circuit 26'-n is operated based on the carry signal Carry(n+1) input through the second carry signal input terminal Carry(n+1).

That is, in a period ① of the driving timing diagram of FIG. 20D, the Carry(n+1) signal of the low level may be applied at the node Q(n) through the turned-on transistor M15 based on the low-level CLKB signal and the turned-on transistor M16 based on the low-level BU signal. Accordingly, the transistor M10 may be turned on, and the low-level driving voltage VGL may be output as the carry signal Carry(n) through the turned-on transistor M12.

In some embodiments, in periods ②, ③, and ④ of the driving timing diagram of FIG. 20D, the carry signal Carry (n) of the low level may maintain its output.

That is, in the period ②, the CLKB signal may have the high level and the transistor M15 may thus be turned off. Accordingly, the Carry(n+1) signal of the low level may not be directly applied to the node Q(n). However, the voltage at the node Q(n) may float while the Carry(n+1) signal of the low level is applied thereto in the period ①, and the transistor M10 may thus be maintained to be turned on. The transistor M12 may thus be maintained to be turned on, and the carry signal Carry(n) of the low level may maintain its output.

In the period ③, the CLK signal may have the low level again, the transistor M15 may thus be turned on, and the Carry(n+1) signal of the low level may be applied to the node Q(n). The transistors M10 and M12 may thus be maintained to be turned on, and the carry signal Carry(n) of the low level may maintain its output.

In the period ④, although the CLKB signal has the high level and the transistor M15 is thus turned off, the transistors M10 and M12 may be maintained to be turned on, and the carry signal Carry(n) of the low level may maintain its output as in the period ②.

In the period ⑤ of the driving timing diagram of FIG. 20D, the carry signal Carry(n) of the low level may then maintain its output unlike the operation of the emission driver 18'-n of FIG. 18D.

That is, in the period ⑤, the CLKB signal may have the low level, the transistor M15 may thus be turned on, and the Carry(n+1) signal may be applied to the node Q(n). However, the Carry(n+1) signal may have the high level in the period ⑤, the high-level voltage may thus be applied to the node Q(n), and the transistor M10 may be turned off. Accordingly, the VGL signal may no longer be output through the transistor M10.

However, in the period ⑤, the voltage at the node Q(n) as well as the node QB(n) may maintain the high level, and the transistor M9 may not be turned on either. Alternatively or additionally, the voltage at the drain terminal of the transistor M10 may float while the low-level voltage is applied thereto in the period ④. Therefore, the transistor M12 may be maintained to be turned on, and the VGL signal may be output as the carry signal Carry(n) through the transistor M12. That is, the carry signal Carry(n) of the low level may maintain its output.

In the period ⑥ of the driving timing diagram of FIG. 20D, the carry signal Carry(n) of the high level may then be output. That is, in the period ⑥, the node QB(n) may have the low level, and the transistors M9 and M11 may thus be turned on; the high-level driving voltage VGH may be applied to the gate terminal of the transistor M12 through the turned-on transistor M9, and the transistor M12 may thus be turned off; and the high-level driving voltage VGH may be output as the carry signal Carry (n) through the turned-on transistor M11.

In some embodiments, the emission signal EPAM(n) may be selectively output from the input emission signal CLK_Sweep 6 while the carry signal Carry(n) of the low level is output.

That is, referring to the circuit diagram of FIG. 20D, the emission signal EPAM(n) may be selectively output from the input emission signal CLK_EMI 6 while the transistor M14 is turned on. As described above, the carry signal Carry(n) may have the low level in the periods ① to ⑤. Therefore, the transistor M14 may be turned on in the periods ① to ⑤, and output the input emission signal CLK_EMI 6 applied to the source terminal as the emission signal EPAM(n) in the periods ① to ⑤.

Here, it may be seen that each waveform of the input emission signals CLK_EMI 6 to CLK_EMI 1 shown in the driving timing diagram of FIG. 20D has the pattern in which the low and high levels are repeated in the image frame period 60 (and also in a part of the section 66 in the blanking period 65), and each of the input emission signals CLK_EMI 6 to CLK_EMI 1 has the high level in the non-light emission section 67.

Therefore, it may be seen that the emission driver circuit 26'-n outputs the low-level emission signal EPAM(n) in the image frame period 60 (and also in a part of the section 66 in the blanking period 65) and the high-level emission signal EPAM(n) in the non-light emission section 67 even though the low-level carry signal Carry (n) is output equally in the image frame period 60 and the blanking period 65. That is, it may be seen that the emission signal EPAM(n) satisfying the above two conditions together is generated and output through the emission driver circuit 26'-n according to an embodiment of the present disclosure.

Hereinafter, the description describes an emission driver according to another embodiment of present disclosure with reference to FIGS. 21A through 21L. Like the emission driver described with reference to FIGS. 20A to 20D, the emission driver described with reference to FIGS. 21A through 21L may be an emission driver for providing the emission signal EPAM(n) (e.g., Emi_PAM(n)).

The emission driver described with reference to FIGS. 21A through 21L is different from the emission driver described with reference to FIGS. 20A to 20D in using the pre-charging and bootstrapping methods to output the carry signal Carry(n) and the emission signal EPAM(n).

As described above, the emission driver may provide the emission signals to the subpixel circuits of the corresponding display module in the row-line order. That is, the emission signals may not be provided to all the subpixel circuits collectively through the global signal, but provided to the subpixel circuits in the row-line order through the emission driver circuits provided for the respective row lines.

Figure 21A:
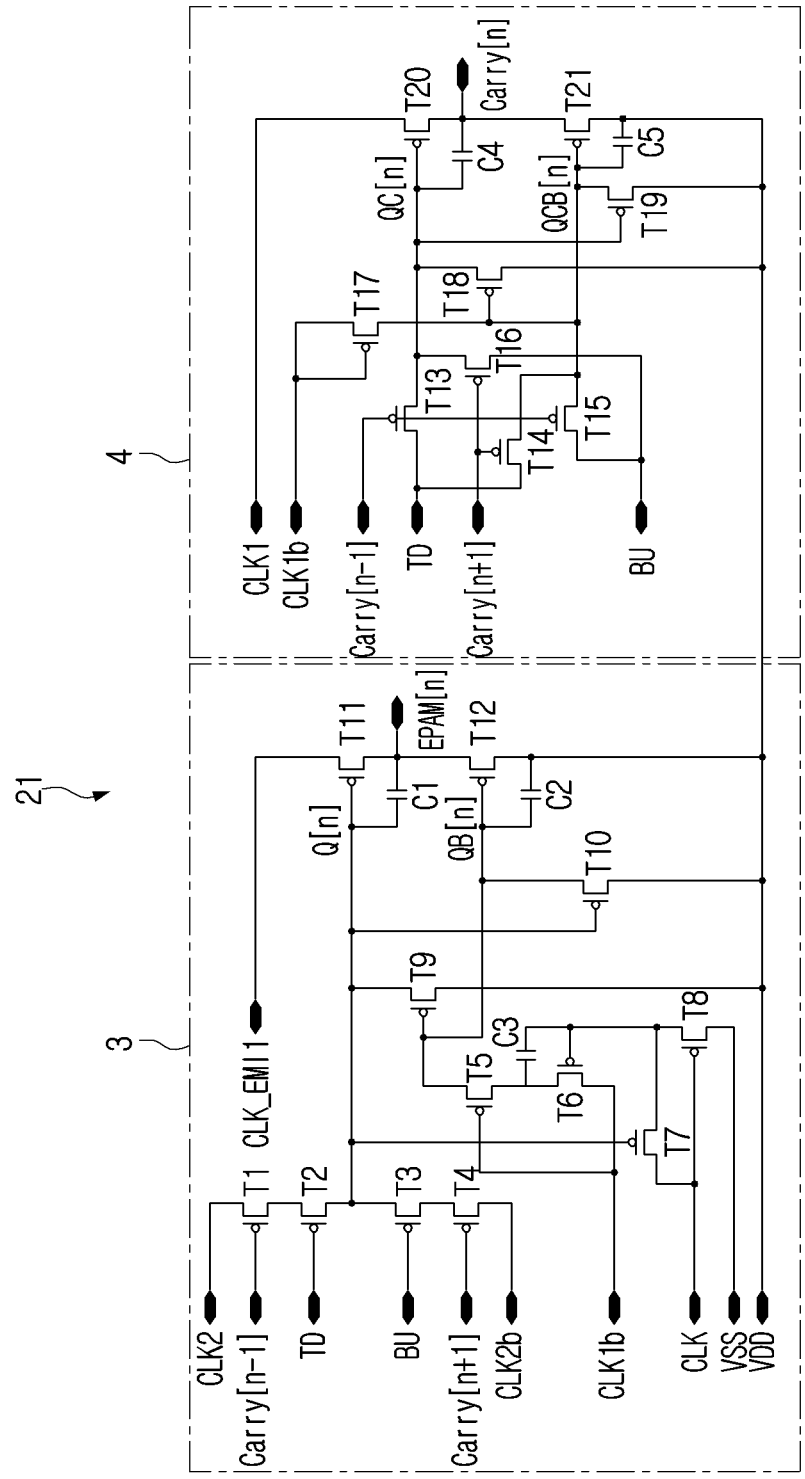
FIG. 21A is a circuit diagram of an emission driver circuit corresponding to the n-th row line, according to an embodiment of the present disclosure.

FIG. 21A shows a circuit diagram of an emission driver circuit corresponding to the n-th row line. Referring to FIG. 21A, the emission driver circuit 21 may include an emission signal generation unit 3 and a carry signal generation unit 4; and the emission signal generation unit 3 and the carry signal generation unit 4 may respectively include nodes Q (e.g., Q(n) and QC(n)), respectively.

Referring to FIG. 21A, the emission signal generation unit 3 may receive the following signals, generate the emission signal EPWM(n), and output the generated the emission signal EPWM(n): 1) the selection signals TD and BU, 2) any one selected based on the selection signals TD and BU from an output carry signal Carry(n−1) of a previous row line and an output carry signal Carry(n+1) of a next row line, 3) any one selected based on the selection signals TD and BU from second clock signals CLK2 and CLK2b, 4) first clock signals CLK1 and CLK1b, 5) the input emission signal CLK_EMI 1, and 6) the driving voltage signals VSS and VDD.

Here, the input emission signal CLK_EMI 1 may be one of the plurality of input emission signals having the same waveform and different phases. For example, there may be six input emission signals having different phases, such as CLK_EMI 1 to CLK_EMI 6, and FIG. 20A exemplifies a case where CLK_EMI 1, one of these signals, is input. The number of input emission signals having the different phases is not limited to six, and may be changed according to the embodiments. Here, "having the different phases" may indicate that signals of the same waveform are shifted by predetermined time on a time axis. Here, the shifted predetermined time may depend on the number of signals having the different phases.

In some embodiments, the carry signal generation unit 4 may receive the following signals, generate the carry signal Carry(n), and output the generated carry signal Carry(n): 1) the selection signals TD and BU, 2) any one selected based on the selection signals TD and BU from the output carry signal Carry(n−1) of the previous row line and the output carry signal Carry(n+1) of the next row line, 3) the first clock signals CLK1 and CLK1b, and 4) the driving voltage signals VSS and VDD.

As described above, in order to drive the display panel 100 by the progressive driving method, the emission signal EPAM(n) may need to have the low level in each light emission section that is performed in the row-line order in the image frame period 60 (and also in a part of the section 66 in the blanking period 65). However, in order to implement the non-light emission section 67 in which none of the inorganic light-emitting elements of the display panel 100 emits light, the emission signal EPAM(n) for each row line may need to have the high level in the non-light emission section 67 in the blanking period 65.

In order to generate the emission signal EPAM(n) satisfying these two conditions together, the emission driver according to an embodiment of the present disclosure uses the carry signal Carry(n) and the input emission signal CLK_EMI.

Here, the selection signals TD and BU, the first clock signals CLK1 and CLK1b, the second clock signals CLK2 and CLK2b, and the input emission signal CLK_EMI 1 may be the above-mentioned control signals (e.g., the first control signals or the second control signals) applied from the timing controller 2000. In some embodiments, the driving order (or driving direction) of the display module may depend on how the control signals are applied, and a detailed description thereof is provided below.

Figure 21B:
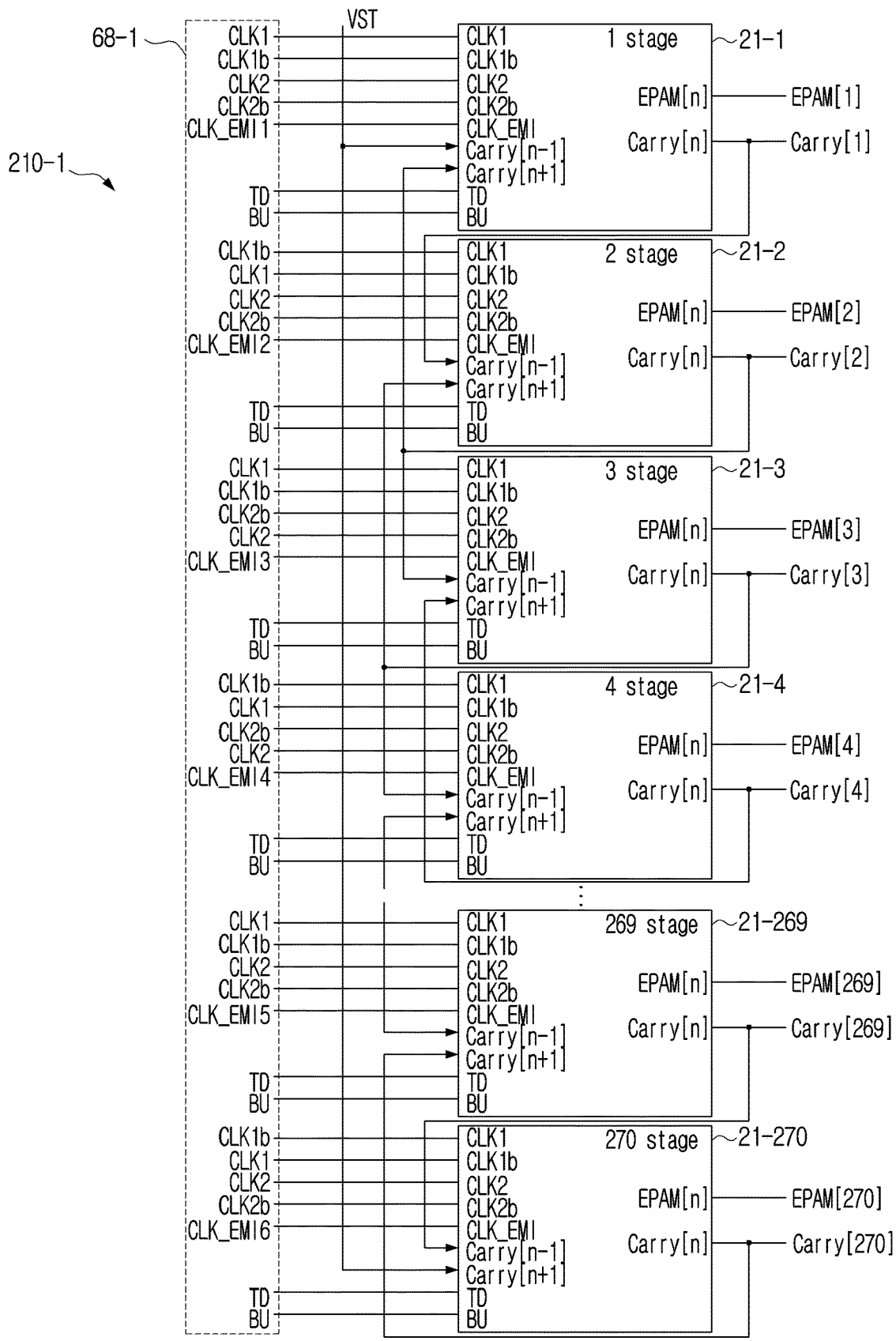
FIG. 21B is a block diagram of the emission drivers, according to an embodiment of the present disclosure.
Figure 21C:
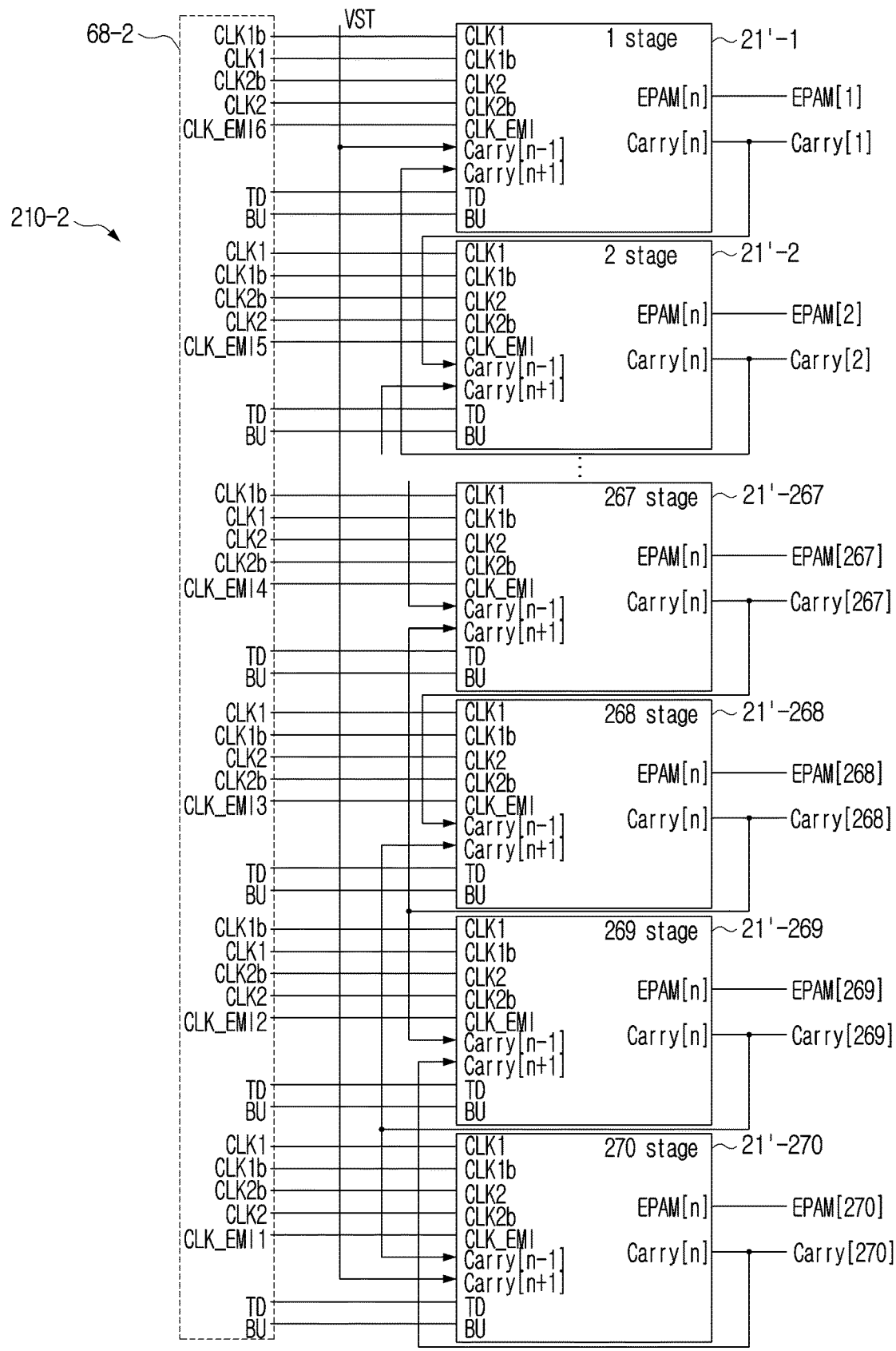
FIG. 21C is a block diagram of the emission drivers, according to an embodiment of the present disclosure.

FIGS. 21B and 21C are block diagrams of the emission drivers according to an embodiment of the present disclosure. FIGS. 21B and 21C each show configurations of emission drivers 210-1 and 200-2 respectively included in two display modules vertically adjacent to each other. Here, each display module may include 270 row lines for example.

Referring to FIGS. 21B and 21C, it may be seen that the emission driver 210-1 and the emission driver 210-2 have the same configuration and wiring as each other, except for a difference in that the first control signals 68-1 are applied to the emission driver 210-1 and the second control signals 68-2 are applied to the emission driver 210-2.

The emission driver 210-1 of FIG. 21B to which the first control signals 68-1 are applied may provide the emission signal EPAM(n) to the subpixel circuits included in the corresponding display module in the first order (or first direction) of the row lines. Here, the first order of the row lines may be, for example, the order from the first to 270th row lines. Alternatively or additionally, the first direction may be the direction from top to bottom.

In some embodiments, the emission driver 210-2 of FIG. 21C to which the second control signals 68-2 are applied may provide the emission signal EPAM(n) to the subpixel circuits included in the corresponding display module in the second order (or second direction) of the row lines. Here, the second order of the row lines may be, for example, the order from the 270th to first row lines. Alternatively or additionally, the second direction may be the direction from bottom to top.

That is, the timing controller 2000 may apply the first control signals 68-1 to one emission driver 210-1 among the emission drivers 210-1 and 210-2 included in the two display modules vertically adjacent to each other, and apply the second control signals 68-2 to the other emission driver 210-2. Accordingly, the two display modules vertically adjacent to each other may have the driving orders or driving directions opposite to each other.

In this way, it may be possible to prevent and/or reduce the distortion phenomenon of the moving pattern that occurs at the boundary between the display modules vertically adjacent to each other by making the driving orders or driving directions of the two display modules vertically adjacent to each other opposite to each other as described above.

In some embodiments, the emission signal EPAM(n) provided by the emission driver 210-1 and the emission signal EPAM(n) provided by the emission driver 210-2 may be provided in the row-line order (e.g., in the first order or in the second order) based on the carry signal Carry(n), as well as all have the low level in the image frame period 60 (and also in a part of the section 66 in the blanking period 65) and the high level in the non-light emission section 67.

Referring again to FIG. 21B, the emission driver 210-1 may include emission driver circuits 21-1 to 21-270 provided one by one for each row line.

Here, each of the emission driver circuits 21-1 to 21-270 may include the first carry signal input terminal Carry(n−1) for receiving the carry signal Carry(n−1) output from the emission driver circuit for the previous row line, and the second carry signal input terminal Carry(n+1) for receiving the carry signal Carry(n+1) output from the emission driver circuit for the next row line.

The first carry signal input terminal Carry(n−1) of each of the emission driver circuits 21-1 to 21-270 may be connected to the carry signal output terminal Carry(n−1) of the emission driver circuit for the previous row line, and the second carry signal input terminal Carry(n+1) may be connected to the carry signal output terminal Carry(n+1) of the emission driver circuit for the next row line.

In some embodiments, the first row line does not have the previous row line and the 270th row line does not have the next row line. Accordingly, the first carry signal input terminal Carry(n−1) of the emission driver circuit 21-1 for the first row line and the second carry signal input terminal Carry(n+1) of the emission driver circuit 21-270 for the 270th row line may each be separately connected to the wiring to which the start signal VST is applied.

Here, as described above, the emission driver circuit 21 may be operated based on the carry signal input through one carry signal input terminal selected based on the selection signal TD or BU. Accordingly, it may be acceptable to apply the same start signal VST to the first carry signal input terminal Carry(n−1) of the emission driver circuit 21-1 and the second carry signal input terminal Carry(n+1) of the emission driver circuit 21-270 through one wiring.

In some embodiments, each of the emission driver circuits 21-1 to 21-270 may include a first clock input terminal CLK1 and a second clock input terminal CLK1b for respectively receiving the first clock signals CLK1 and CLK1b.

Here, the CLK1 signal and the CLK1b signal may each be applied to the first clock input terminal CLK1 and the second clock input terminal CLK1b of the emission driver circuits 21-1 to 21-270 for the respective row lines in an order opposite to that of the previous row line for each row line.

That is, the CLK1 signal may be applied to the first clock input terminal CLK1 of the emission driver circuit 21-1, and the CLK1b signal may be applied to the second clock input terminal CLK1b. However, it may be seen that the CLK1b signal is applied to the first clock input terminal CLK1 of the emission driver circuit 21-2 for the next row line, and the CLK1 signal is applied to the second clock input terminal CLK1b. This configuration may also be the same up to the emission driver circuit 21-270 for the 270th row line.

Here, the CLK1 signal and the CLK1b signal may be some of the first control signals 68-1 applied from the timing controller 2000 and have the phases opposite to each other.

In some embodiments, each of the emission driver circuits 21-1 to 21-270 may include a third clock input terminal CLK2 and a fourth clock input terminal CLK2b for respectively receiving the second clock signals CLK2 and CLK2b.

Here, the CLK2 signal and the CLK2b signal may each be applied to the third clock input terminal CLK2 and the fourth clock input terminal CLK2b of the emission driver circuits 21-1 to 21-270 for the respective row lines in an order opposite to that of the previous row lines for every two row lines.

That is, the CLK2 signal may be applied to the third clock input terminal CLK2 of the emission driver circuit 21-1 or 21-2, and the CLK2b signal may be applied to the fourth clock input terminal CLK2b. However, it may be seen that the CLK2b signal is applied to the third clock input terminal CLK2 of the emission driver circuits for the next two row lines, that is, the emission driver circuits 21-3 and 21-4, and the CLK2 signal is applied to the fourth clock input terminal CLK2b. This configuration may also be the same up to the emission driver circuit 21-270 for the 270th row line.

Here, the CLK2 signal and the CLK2b signal may be some of the first control signals 68-1 applied from the timing controller 2000 and have the phases opposite to each other.

In some embodiments, according to an embodiment of present disclosure, a period of the above-mentioned second clock signal CLK2 or CLK2b may be twice as long as that of the first clock signal CLK1 or CLK1b, and an embodiment is not limited thereto.

In some embodiments, each of the emission driver circuits 21-1 to 21-270 may include the input emission signal input terminal CLK_EMI for receiving the input emission signal described above in FIG. 21A. Here, the input emission signals may be some of the first control signals 68-1 applied from the timing controller 2000.

The six input emission signals CLK_EMI 1, CLK_EMI 2, CLK_EMI 3, CLK_EMI 4, CLK_EMI 5, and CLK_EMI 6 having the same waveform and the different phases may be cyclically applied one by one to the input emission signal input terminal CLK_EMI of the emission driver circuits 21-1 to 21-270 for the respective row lines.

That is, as shown in FIG. 21B, the input emission signals CLK_EMI 1 to CLK_EMI 4 may be successively applied one by one to the emission driver circuits 21-1 to 21-4 for the first to fourth row lines.

Alternatively or additionally, although not shown in the drawings, the input emission signals CLK_EMI 5 to CLK_EMI 6 may be successively applied one by one to the emission driver circuits for the 5th to 6th row lines, and the input emission signal CLK_EMI 1 may be applied again to the emission driver circuit for the 7th row line.

In this way, the input emission signals may be applied one by one to the remaining emission driver circuits, and the input emission signal CLK_EMI 6 may be applied to the last emission driver circuit 21-270 for the 270th row line.

In some embodiments, each of the emission driver circuits 21-1 to 21-270 may include the first selection signal input terminal TD and the second selection signal input terminal BU respectively receiving the selection signals (e.g., first selection signal TD and second selection signal BU) for selecting one carry signal input terminal from the first carry signal input terminal Carry(n−1) and the second carry signal input terminal Carry(n+1).

Here, the first selection signal TD and the second selection signal BU may be some of the first control signals 68-1 applied from the timing controller 2000 and have the different voltage levels. For example, the first selection signal TD may have the same voltage level as the low-level driving voltage signal VGL or VSS, and the second selection signal BU may have the same voltage level as the high-level driving voltage signal VGH or VDD. However, the present disclosure is not limited thereto.

In some embodiments, the first selection signal TD of the low level and the second selection signal BU of the high level may respectively be input through the first and second selection signal input terminals TD and BU. In this case, the emission driver circuits 21-1 to 21-270 may select the first carry signal input terminal Carry(n−1) from the first and second carry signal input terminals Carry(n−1) and Carry (n+1), and each output the emission signal EPAM(n) and the carry signal Carry(n) corresponding to the respective row lines based on the carry signal Carry(n−1) input through the selected first carry signal input terminal Carry(n−1).

In this case, the first carry signal input terminal Carry(n−1) may be selected based on the selection signals TD and BU, and the start signal VST may thus be input to the first carry signal input terminal Carry(n−1) of the emission driver circuit 21-1 for the first row line, and may not input to the second carry signal input terminal Carry(n+1) of the emission driver circuit 21-270 for the 270th row line.

Therefore, each of the emission driver circuits 21-1 to 21-270 may successively output the emission signal EPAM (n) and the carry signals Carry(n) from the first to 270th row lines based on the carry signal Carry(n−1) for the previous row line.

Here, the carry signal Carry(n) output in the row-line order may have the low level in both the image frame period 60 and the blanking period 65. On the other hand, the emission signal EPAM(n) output in the row-line order may have the low level in the image frame period 60 (and also in a part of the section 66 in the blanking period 65) and have the high level in the non-light emission section 67.

In some embodiments, a length of time that the emission signal EPAM(n) and the carry signal Carry(n), output by each of the emission driver circuits 21-1 to 21-270, have the low level may be different from each other. For example, the length of time that the carry signal Carry(n) has the low level may be 1H, and the length of time that the emission signal EPAM(n) has the low level may be 5H. However, the present disclosure is not limited thereto.

Each of the emission driver circuits 21-1 to 21-270 may separately include the emission signal generation unit 3 and the carry signal generation unit 4, as described above with reference to FIG. 21A. That is, each of the emission driver circuits 21-1 to 21-270 may separately output the emission signal EPAM (n) and the carry signal Carry (n) respectively generated through the emission signal output unit 3 and the carry signal output unit 4, rather than outputting the emission signal EPAM(n) by selecting some of the input emission signals based on the carry signal Carry(n) as in an embodiment described above with reference to FIGS. 20A to 20D.

Therefore, the length of time that the emission signal EPAM(n) has the low level and the length of time that the carry signal Carry(n) has the low level may be different from each other. A detailed description thereof is described below.

Referring to FIG. 21C, each of emission driver circuits 21'-1 to 21'-270 of the emission driver 210-2 may have the same configuration and connection structure as those of each of the emission driver circuits 21-1 to 21-270 of the emission driver 210-1 described above. However, the emission driver 210-1 may receive the first control signals 68-1 from the timing controller 2000, while the emission driver 210-2 may receive the second control signals 68-2 from the timing controller 2000 through the wiring separate from that of the first control signals.

Hereinafter, the description omits redundant descriptions of the same or similar contents as those of the emission driver 210-1 described above, and describes the emission driver 210-2 focusing on its difference.

Referring to FIG. 21C, unlike FIG. 21B, it may be seen that in the emission driver circuit 26'-1 for the first row line of the emission driver 210-2, the CLK1*b* signal is input to the first clock input terminal CLK1, and the CLK1 signal is applied to the second clock input terminal CLK1*b*.

In some embodiments, in each of the emission driver circuits 21'-1 to 21'-270 of the emission driver 210-2, the CLK1 signal and the CLK1*b* signal may be applied to the first clock input terminal CLK1 and the second clock input terminal CLK1*b* in the order opposite to that of the previous row line for each row line.

Therefore, it may be seen that the first clock signals input to each of the emission driver circuits 21-1 to 21-270 of the emission driver 210-1 and the first clock signals input to each of the emission driver circuits 21'-1 to 21'-270 of the emission driver 210-2 have phases opposite to each other for the same row line.

Referring to FIG. 21C, unlike FIG. 21B, the CLK2*b* signal may be applied to the third clock input terminal CLK2 of the emission driver circuit 21'-270 for the 270th row line and the emission driver circuit 21'-269 for the 269th row line, and the CLK2 signal may be input to the fourth clock input terminal CLK2*b*.

The emission driver 210-2 may also have the order changed for each two row lines when the second clock signals CLK2 and CLK2*b* are applied to the third and fourth clock input terminals CLK2 and CLK2*b*. Therefore, it may be seen that the CLK2 signal is input to the third clock input terminal CLK2 of the emission driver circuit 21'-268 for the 268th row line and the emission driver circuit 21'-267 for the 267th row line, and the CLK2*b* signal is input to the fourth clock input terminal CLK2*b*.

As a result, the second clock signals input to each of the emission driver circuits 21-1 to 21-270 of the emission driver 210-1 and the second clock signals input to each of the emission driver circuits 21'-1 to 21'-270 of the emission driver 210-2 may have the phases opposite to each other for the same row line.

Referring to FIG. 21C, each of the emission driver circuits 21'-1 to 21'-270 of the emission driver 210-2 may also include the input emission signal input terminal CLK_EMI for receiving the input emission signal. Here, the input emission signals may be some of the second control signals 68-2 applied from the timing controller 2000.

The six input emission signals CLK_EMI 1, CLK_EMI 2, CLK_EMI 3, CLK_EMI 4, CLK_EMI 5, and CLK_EMI 6 having the same waveform and the different phases may be cyclically applied one by one also to the input emission signal input terminal CLK_EMI of the emission driver circuits 21'-1 to 21'-270 for the respective row lines. However, the input emission signal may be applied to the emission driver 210-2 in an order different from that of the emission driver 210-1.

That is, as shown in FIG. 21C, in the emission driver 210-2, the six input emission signals CLK_EMI 1, CLK_EMI 2, CLK_EMI3, CLK_EMI 4, CLK_EMI 5, and CLK_EMI 6 may be cyclically applied one by one to the emission driver circuits for the respective row lines, starting from the emission driver circuit 21'-270 for the 270th row line.

Therefore, it may be seen that the input emission signal CLK_EMI 2 is applied to the emission driver circuit 21'-269 for the 269th row line, the input emission signal CLK_EMI 3 is applied to the emission driver circuit 21'-268 for the 268th row line, and the input emission signal CLK_EMI 4 is applied to the emission driver circuit 21'-267 for the 267th row line.

Although not shown in the drawings, the input emission signal CLK_EMI 5 may be applied to the emission driver circuit for the 266th row line, the input emission signal CLK_EMI 6 is applied to the emission driver circuit for the 265th row line, and CLK_EMI 1 is applied again to the emission driver circuit for the 264th row line.

In this way, the input emission signals may be applied one by one to the remaining emission driver circuits, and the input emission signals CLK_EMI 5 and CLK_EMI 6 may be applied to the emission driver circuit 21'-2 for the second row line and the emission driver circuit 21'-1 for the first row line, respectively.

In some embodiments, each of the first and second selection signals TD and BU included in the second control signals 68-2 may have a level opposite to that of the first and second selection signals TD and BU included in the first control signals 68-1. That is, unlike the emission driver 210-1, the first selection signal TD of the high level may be applied to the first selection signal input terminal TD of each of the emission driver circuits 21'-1 to 21'-270 of the emission driver 210-2, and the second selection signal BU of the low level may be applied to the second selection signal input terminal BU.

Accordingly, the emission driver circuits 21'-1 to 21'-270 of the emission driver 210-2 may select the second carry signal input terminal Carry(n+1) from the first and second carry signal input terminals Carry(n−1) and Carry(n+1), and each output the emission signal EPAM(n) and the carry signal Carry(n) corresponding to each row line based on the carry signal Carry(n+1) input through the selected second carry signal input terminal Carry(n+1).

In this case, the second carry signal input terminal Carry(n+1) may be selected based on the selection signals TD and BU, and the start signal VST may thus be input to the second carry signal input terminal Carry(n+1) of the emission driver circuit 21'-270 for the 270th row line, and may not be input to the first carry signal input terminal Carry(n−1) of the emission driver circuit 21'-1 for the first row line.

Therefore, the emission driver circuits 21'-1 to 21'-270 may respectively output the emission signal EPAM(n) and the carry signals Carry(n) successively from the 270th to first row lines based on the carry signal Carry(n+1) for the next row line.

Here, the carry signal Carry(n) output in the row-line order may have the low level in both the image frame period 60 and the blanking period 65. On the other hand, the emission signal EPAM(n) output in the row-line order may have the low level in the image frame period 60 (and also in a part of the section 66 in the blanking period 65) and have the high level in the non-light emission section 67.

In some embodiments, the length of time that the emission signal EPAM(n) and the carry signal Carry(n), output by each of the emission driver circuits 21'-1 to 21'-270, have the low level may be different from each other, which is the same as described above in FIG. 21B.

Hereinafter, the description describes an operation of the emission driver circuit (21-*n* for the n-th row line among the plurality of emission driver circuits 21-1 to 21-270 included in the emission driver 210-1 of FIG. 21B in more detail with reference to FIGS. 21D to 21J.

Figure 21D:
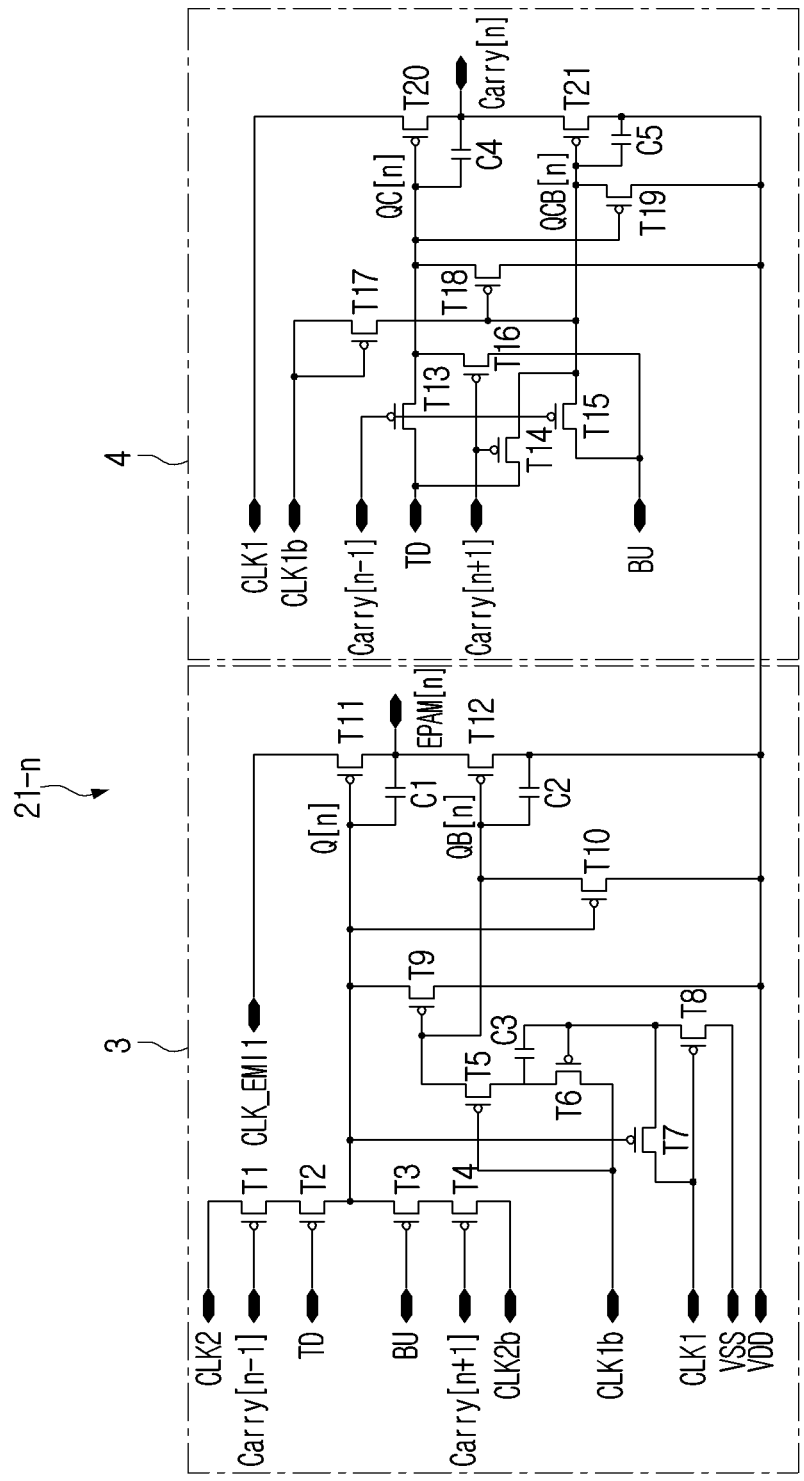
FIG. 21D is a circuit diagram of the emission driver circuit corresponding to the n-th row line, according to an embodiment of the present disclosure.
Figure 21E:
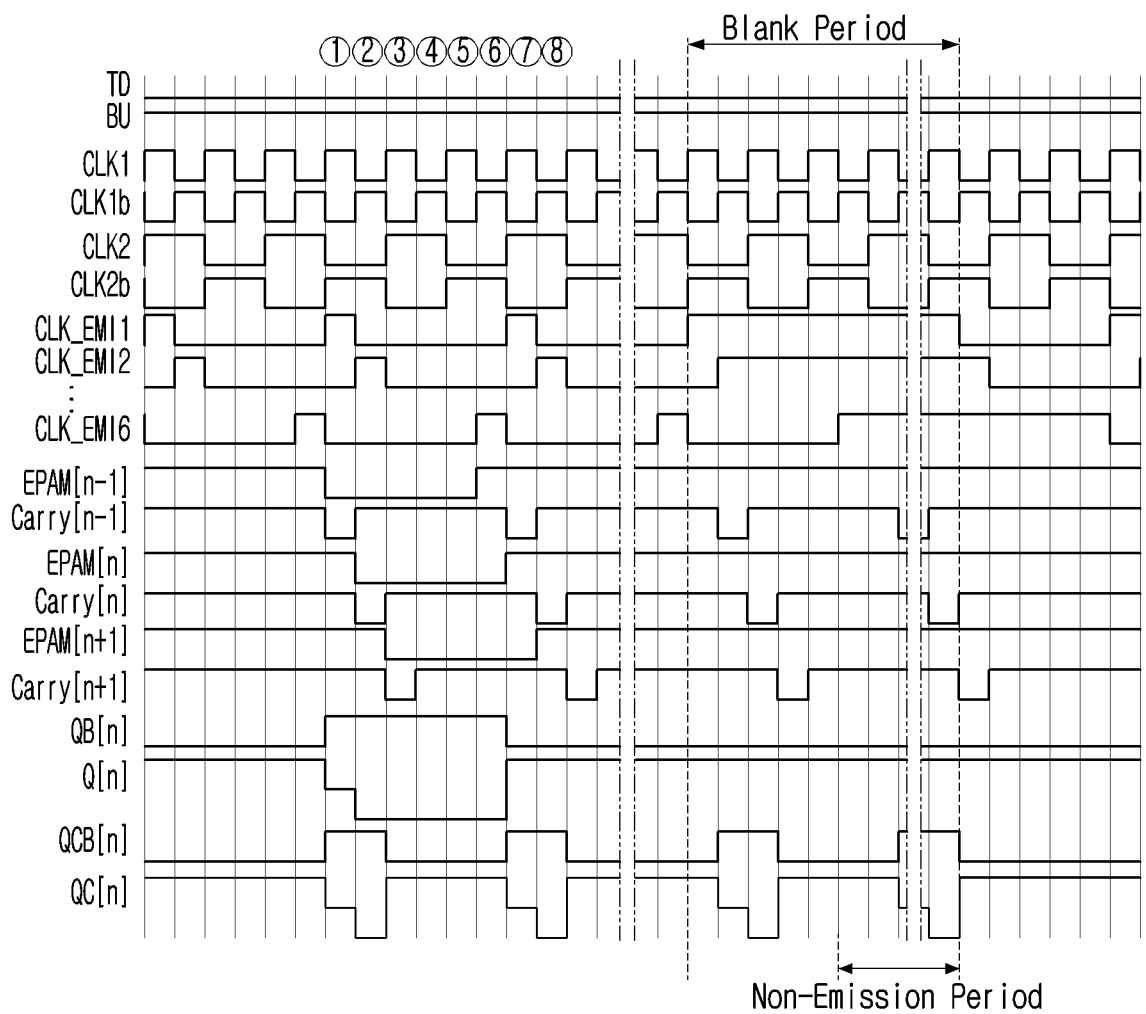
FIG. 21E is a driving timing diagram of the emission driver circuit for the n-th row line, according to an embodiment of the present disclosure.

FIG. 21D is a circuit diagram of the emission driver circuit 21-*n*, and FIG. 21E is a driving timing diagram of the emission driver circuit 21-*n*.

Referring to FIG. 21D, the emission driver circuit 21-*n* may include the emission signal generation unit 3 and the carry signal generation unit 4; and the emission signal generation unit 3 may include the node Q(n) and the carry signal generation unit 4 may include the node QC(n), respectively. Alternatively or additionally, the emission driver circuit 21-*n* may receive the first control signals (or the selection signals TD and BU, the first clock signals CLK1 and CLK1*b*, the second clock signals CLK2 and CLK2*b*, and the input emission signal CLK_EMI 1) as shown in the drawing.

Referring to FIG. 21E, it may be seen that the period of the second clock signal CLK2 or CLK2*b* is twice as long as that of the first clock signal CLK1 or CLK1*b*. However, an embodiment is not limited thereto. It may also be seen that the carry signal has the low level for 1H time, while the emission signal has the low level for 5H time. However, an embodiment is not limited thereto.

Alternatively or additionally, referring to FIG. 21E, the first selection signal TD may have the low level, and the second selection signal BU may have the high level.

Therefore, referring to FIG. 21D, the transistor T2 of the emission signal generation unit 3 may be turned on and the transistor T3 may be turned off. That is, it may be seen that the first scan signal input terminal Scan (n−1) is selected based on the first and second selection signals TD and BU, and the emission signal generation unit 3 may be operated based on the scan signal Scan(n−1) input through the first scan signal input terminal Scan(n−1).

In some embodiments, it may be seen that in the case of the carry signal generation unit 4, the transistor T12 is turned on, and the TD signal of the low level is applied to the node QC(n), and the transistor T15 is turned on and the BU signal of the high level is applied to a node QCB(n), only when the carry signal Carry(n−1) has the low level.

Hereinafter, the description describes the operation of the emission driver circuit 21-*n* in periods ① to ⑧ of the driving timing diagram of FIG. 21E in detail with reference to FIGS. 21F to 21J.

Figure 21F:
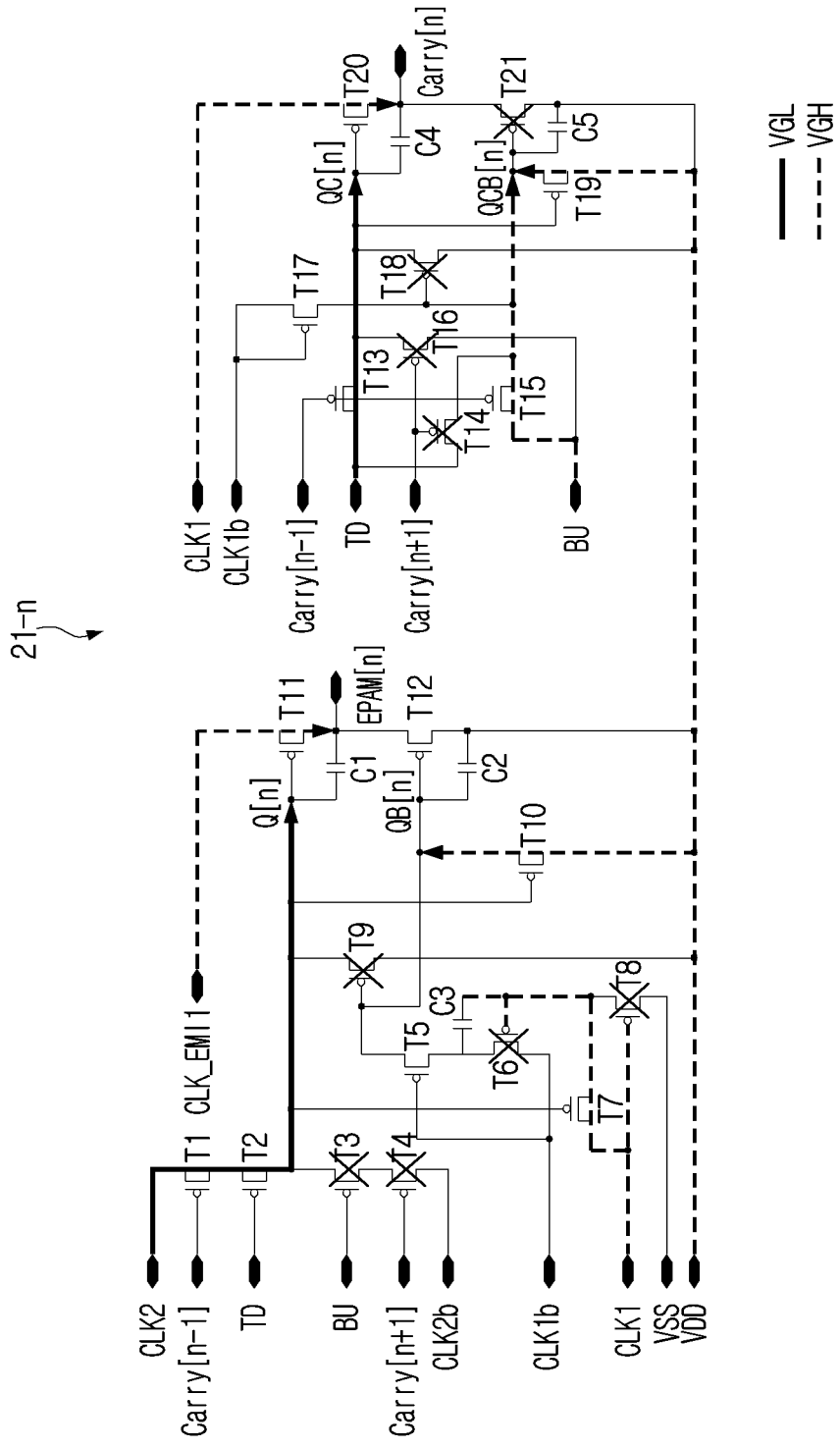
FIG. 21F is a view for explaining an operation of the emission driver circuit in more detail, according to an embodiment of the present disclosure.

FIG. 21F shows the operation of the emission driver circuit 21-*n* in the period ① of the driving timing diagram of FIG. 21E. In the period ①, the nodes Q(n) and QC(n) node may be pre-charged with the low-level voltage.

That is, in the case of the emission signal generation unit 3, the low-level CLK2 signal may be applied to the node Q(n) through the turned-on transistor T1 based on the Carry (n−1) signal of the low level and the turned-on transistor T2 based on the TD signal. Accordingly, the low-level voltage may be pre-charged to the node Q(n) through the capacitor C1.

Alternatively or additionally, in the case of the carry signal generation unit 4, the low-level TD voltage may be applied to the node QC (n) through the turned-on transistor T13 based on the Carry (n−1) signal of the low level. Accordingly, the low-level voltage may be pre-charged to the node QC(n) through a capacitor C4.

Figure 21G:
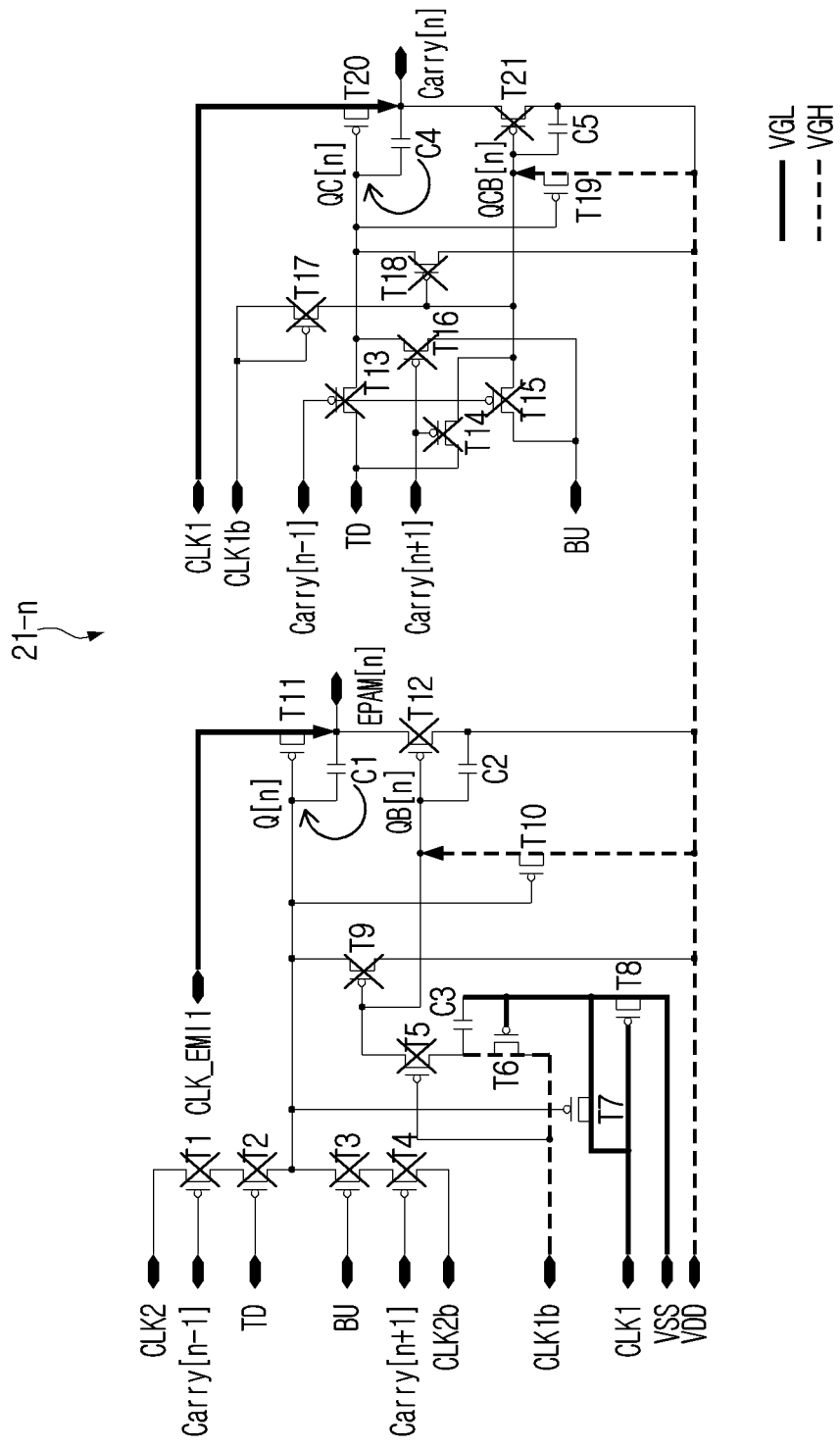
FIG. 21G is a view for explaining the operation of the emission driver circuit in more detail, according to an embodiment of the present disclosure.

FIG. 21G shows the operation of the emission driver circuit 21-*n* in the period ② of the driving timing diagram of FIG. 21E. In the period ②, the voltage at the node Q(n) may be bootstrapped to output the low-level emission signal EPAM(n), and the voltage at the node QC(n) may be bootstrapped to output the carry signal Carry(n) of the low level.

That is, in the case of the emission signal generation unit 3, the Carry(n−1) signal may have the high level in the period ②, and the node Q(n) may float while being pre-charged with the low level voltage. Here, the CLK_EMI 1 signal may have the low level, and the voltage at the node Q(n) may thus be bootstrapped through the capacitor C1. Accordingly, the low-level CLK_EMI 1 signal may be output as the emission signal EPAM(n) through the fully turned-on transistor T11.

Alternatively or additionally, in the case of the carry signal generation unit 4, the Carry(n−1) signal may have the high level in the period ②, and the node Q(n) may thus float while being pre-charged with the low level voltage. Here, the CLK1 signal may have the low level, and the voltage at the node Q(n) may thus be bootstrapped through the capacitor C4. Accordingly, the low-level CLK1 signal may be output as the carry signal Carry(n) through a fully turned-on transistor T20.

Figure 21H:
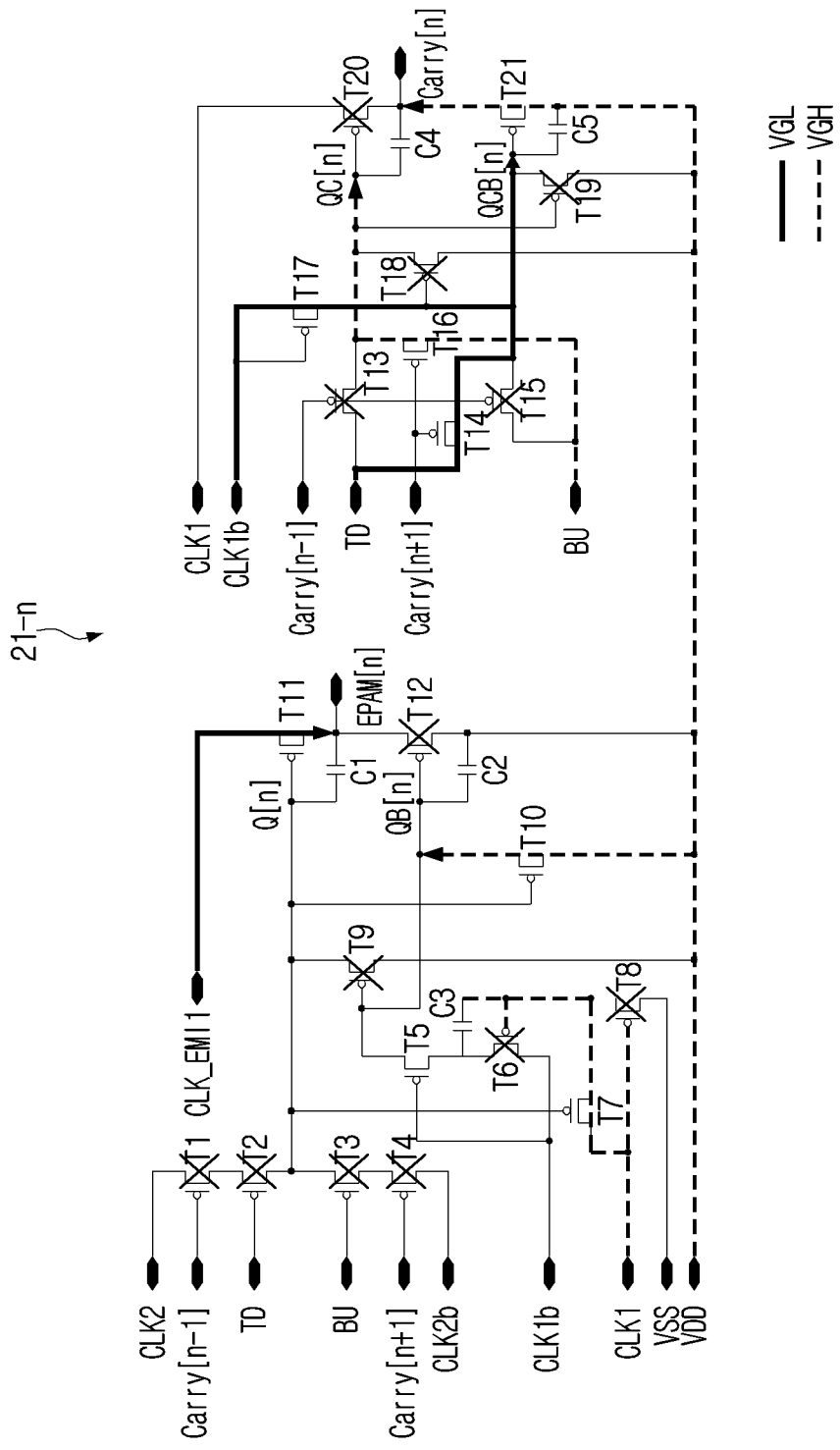
FIG. 21H is a view for explaining the operation of the emission driver circuit in more detail, according to an embodiment of the present disclosure.

FIG. 21H shows the operation of the emission driver circuit 21-*n* in the periods ③ to ⑥ of the driving timing diagram of FIG. 21E. In the periods ③ to ⑥, the emission signal EPAM(n) of the low level may maintain its output, and the carry signal Carry(n) of the low level may have a pulled-up output.

That is, in the case of the emission signal generation unit 3, the Carry (n−1) signal may have the high level in the periods ③ to ⑥, and the CLK_EMI 1 signal may have the low level. Accordingly, the node Q(n) may maintain the bootstrapped voltage and continuously output the EPAM(n) signal of the low level.

In some embodiments, in case of the carry signal generation unit 4, the carry signal Carry(n+1) may have the low level in the period ③, and the high-level BU signal may be applied to the node QC(n) through the turned-on transistor T16. Accordingly, the transistor T20 may be turned off, and the carry signal Carry(n) of the low level may have the pulled-up output.

Here, the low-level TD signal may be applied to the node QCB(n) through a turned-on transistor T14 based on the carry signal Carry(n+1) of the low level, and the low-level CLK1*b* signal may be applied to the node QCB(n) through the turned-on transistor T17 based on the low-level CLK1*b* signal. Accordingly, a transistor T21 may be turned on, and the high-level driving voltage VDD may be output from an output node of the Carry(n) signal through the turned-on transistor T21.

Figure 21I:
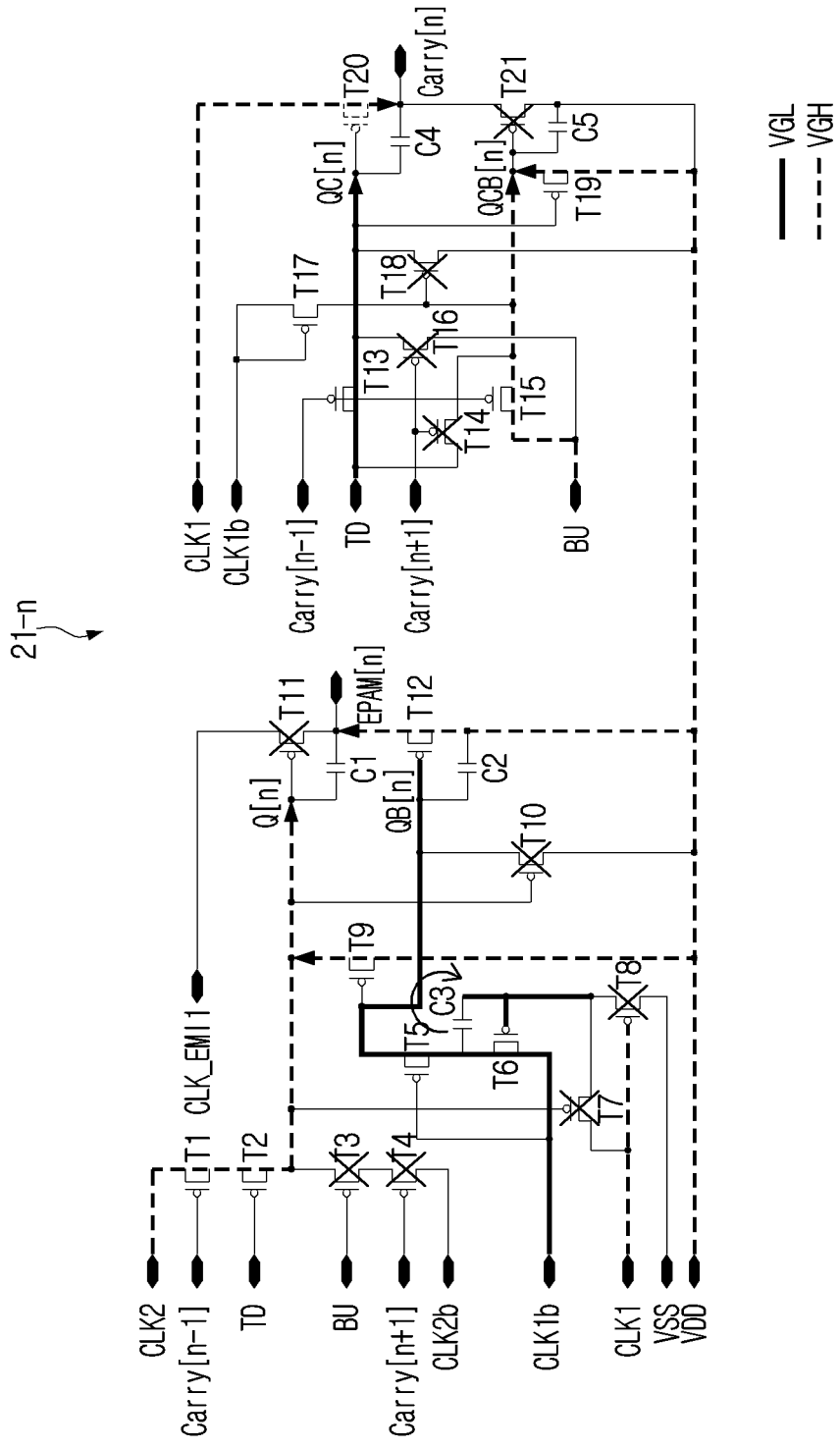
FIG. 21I is a view for explaining the operation of the emission driver circuit in more detail, according to an embodiment of the present disclosure.

FIG. 21I shows the operation of the emission driver circuit 21-*n* in the period ⑦ of the driving timing diagram of FIG. 21E. In the period ⑦, the node Q(n) and the emission signal EPAM(n) of the low level may have the pulled-up output, and the node QC(n) may be pre-charged.

That is, in the period ⑦, the CLK2 signal may have the high level. Accordingly, in the case of the emission signal generation unit 3, the high-level CLK2 signal may be applied to the node Q(n) through the turned-on transistor T1 based on the Carry (n−1) signal of the low level and the turned-on transistor T2 based on the TD signal. Alternatively or additionally, the high-level driving voltage VDD may be applied to the node Q(n) through the turned-on transistor T9 based on the low-level CLK1*b* signal. Accordingly, the transistor T11 may be turned off. In some embodiments, the node QB(n) may have the low level based on the low-level CLK1*b* signal, and accordingly, the high-level driving voltage VDD may be output from an output node of the emission signal EPAM(n) through the turned-on transistor T12.

In some embodiments, in the period ⑦, the CLK1 signal may have the high level. Accordingly, in the case of the carry signal generation unit 4, the low-level TD signal may be applied to the node QC(n) through the turned-on transistor T13 based on the Carry(n−1) signal of the low level. Accordingly, the low-level voltage may be pre-charged to the node QC(n) through the capacitor C4.

Figure 21J:
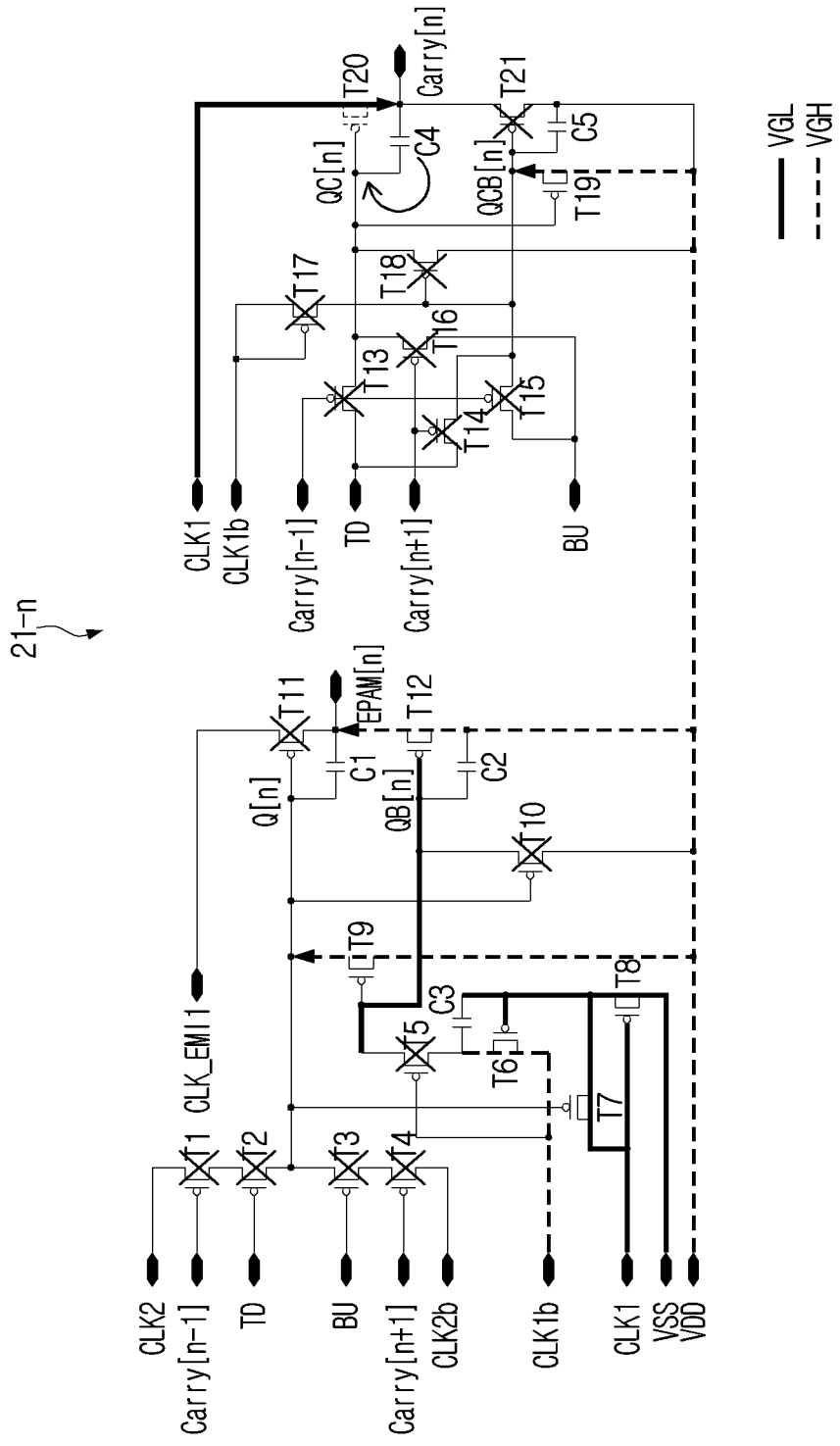
FIG. 21J is a view for explaining the operation of the emission driver circuit in more detail, according to an embodiment of the present disclosure.

FIG. 21J shows the operation of the emission driver circuit 21-*n* in the period ⑧ of the driving timing diagram of FIG. 21E. In the period ⑧, the high-level driving voltage VDD may be applied to the node Q(n), and the high-level driving voltage VDD may be output through an output node of the EPAM(n) signal, and the voltage at the QC(n) node may be bootstrapped to output the carry signal Carry(n) of the low level.

That is, in the case of the emission signal generation unit 3, the CLK1*b* signal may have the high level in the period ⑧, and a gate terminal of the transistor T9 and the node QB(n) may float while having the low-level voltage applied thereto in the period ⑦. Therefore, the high-level driving voltage VDD may be applied to the node Q(n) through the transistor T9 maintained to be turned on, and the high-level driving voltage VDD may be output from the output node of the EPAM(n) signal through the transistor T12 maintained to be turned on.

In some embodiments, in the case of the carry signal generation unit 4, the Carry(n−1) signal may have the high level in the period ⑧, and the node Q(n) may thus float while being pre-charged with the low level voltage. Here, the CLK1 signal may have the low level, and the voltage at the node Q(n) may thus be bootstrapped through the capacitor C4. Accordingly, the low-level CLK1 signal may be output as the carry signal Carry(n) through the fully turned-on transistor T20.

In some embodiments, the input emission signals CLK_EMI 1 to CLK_EMI 6 may all have the high level in the non-light emission section (or non-emission period), and the high-level voltage may thus be output through the output node of the EPAM(n) signal even though the transistor T11 is turned on.

Figure 21K:
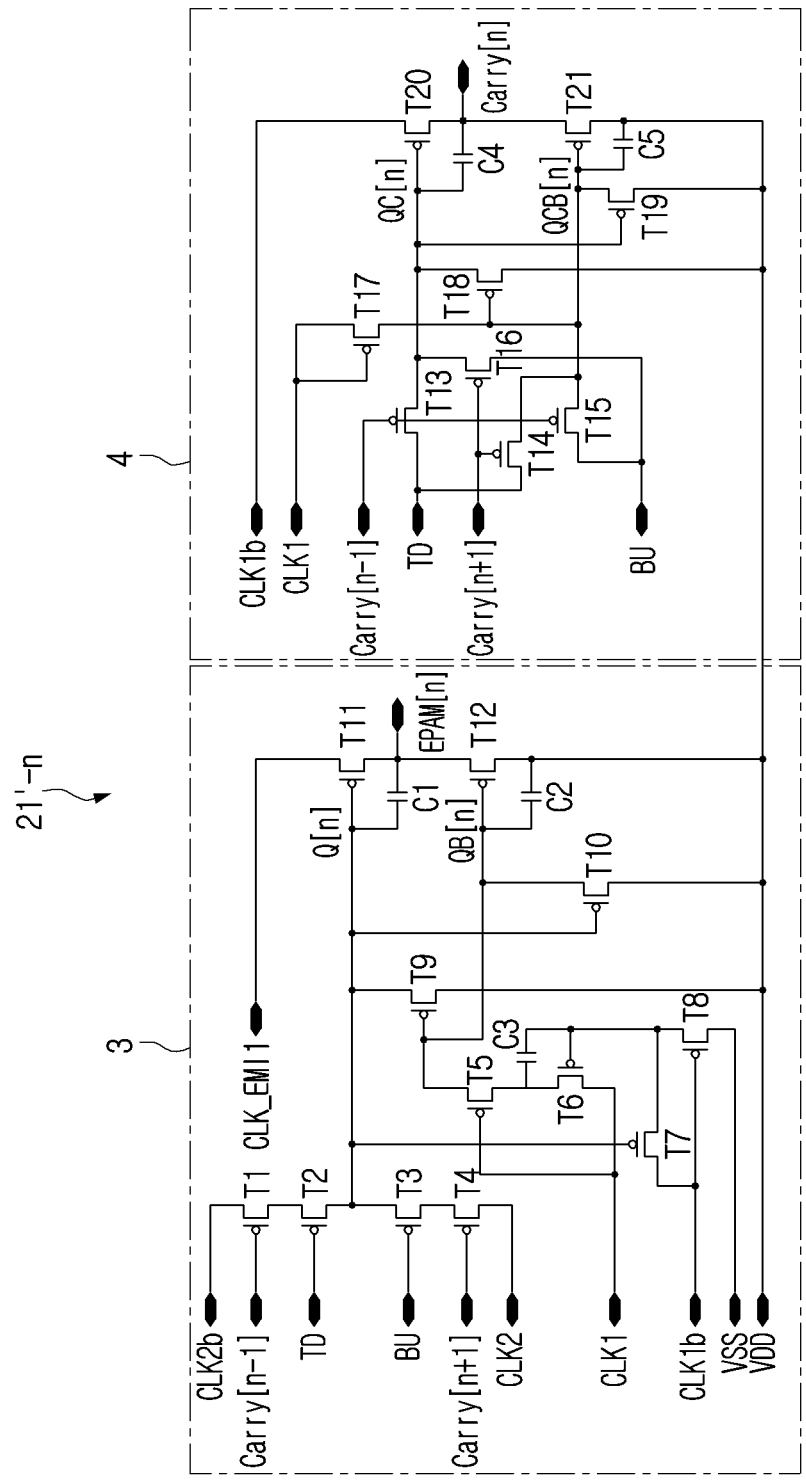
FIG. 21K is a circuit diagram of the emission driver circuit, according to an embodiment of the present disclosure.
Figure 21L:
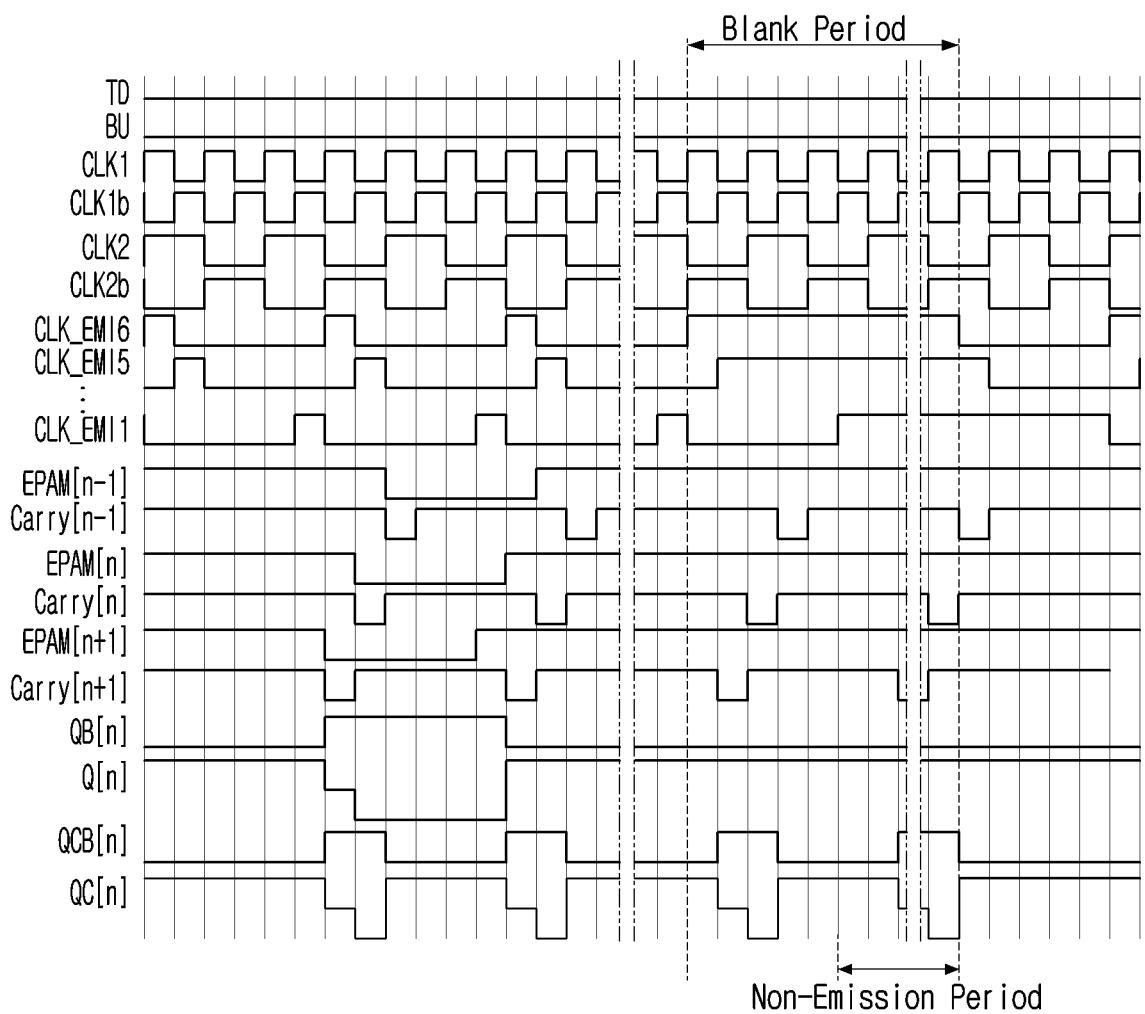
FIG. 21L is a driving timing diagram of the emission driver circuit, according to an embodiment of the present disclosure.

FIGS. 21K and 21L respectively show the circuit diagram and driving timing diagram of the emission driver circuits 21'-n for the n-th row line among the plurality of emission driver circuits 21'-1 to 21'-270 included in the emission driver 210-2 of FIG. 21C.

First, it may be confirmed that the emission driver circuit 21-*n* in FIG. 21D and the emission driver circuit 21'-n in FIG. 21K have the same configuration when comparing these circuits with each other.

However, the clock signals of the opposite phases may be applied to the clock input terminal at the same location. That is, it may be seen that the CLK2*b* signal is input to the input terminal of the emission driver circuit 21'-n positioned at the same location as the input terminal of the emission driver circuit 21-*n* for receiving the CLK2 signal, and the CLK2 signal may be input to the input terminal of the emission driver circuit 21'-n positioned at the same location as the input terminal of the emission driver circuit 21-*n* for receiving the CLK2*b* signal. The same is true for the CLK1 and CLK1*b* signals.

Alternatively or additionally, different input emission signals may be input to the input emission signal input terminal at the same location when comparing the emission driver circuit 21-*n* of FIG. 21D and the emission driver circuit 21'-n of FIG. 21K with each other. That is, it may be seen that the CLK_EMI 1 signal is input to the emission driver circuit 21-*n* and the CLK_EMI 6 signal is input to the emission driver circuit 21'-n even though these circuits are the emission driver circuit for the same n-th row line.

Referring to FIG. 21L, it may be seen that the first selection signal TD and the second selection signal BU have the levels opposite to their levels shown in FIG. 21E.

As such, the above-described first control signals 68-1 may be applied to the emission driver circuit 21-*n* of FIG. 21D, and the above-described second control signals 68-2 may be applied to the emission driver circuit 21'-n of FIG. 21K, respectively through different wirings.

Referring to FIG. 21K, the emission driver circuit 21'-n may include the emission signal generation unit 3 and the carry signal generation unit 4; and the emission signal generation unit 3 may include the node Q(n) and the carry signal generation unit 4 may include the node QC (n), respectively. Alternatively or additionally, the emission driver circuit 21'-n may receive the second control signals (or the selection signals TD and BU, the first clock signals CLK1 and CLK1*b*, the second clock signals CLK2 and CLK2*b*, and the input emission signal CLK_EMI 6 as shown in the drawing.

Referring to FIG. 21L, it may be seen that the period of the second clock signal CLK2 or CLK2*b* is twice as long as that of the first clock signal CLK1 or CLK1*b*. However, an embodiment is not limited thereto. It may also be seen that the carry signal has the low level for 1H time, while the emission signal has the low level for 5H time. However, an embodiment is not limited thereto.

Referring to FIG. 21L, the first selection signal TD may have the high level, and the second selection signal BU may have the low level. Therefore, referring to FIG. 21K, the transistor T2 of the emission signal generation unit 3 may be turned off and the transistor T3 may be turned on. That is, it may be seen that the second scan signal input terminal Scan (n+1) is selected based on the first and second selection signals TD and BU, and the emission signal generation unit 3 may be operated based on the scan signal Scan(n+1) input through the second scan signal input terminal (Scan(n+1)).

In some embodiments, it may be seen that in the case of the carry signal generation unit 4, the transistor T16 is turned on, and the BU signal of the low level is applied to the node QC(n), and the transistor T14 is turned on and the TD signal of the high level is applied to the node QCB(n), only when the carry signal Carry(n+1) has the low level.

In other optional or additional embodiments, a more detailed operation of the emission driver circuit 21'-n shown in FIG. 21K may be sufficiently understood through the driving timing diagram shown in FIG. 21L and explanation of the emission driver circuit 21-*n* described above through FIGS. 21D to 21J, and a redundant description thereof is thus omitted.

Figure 22A:
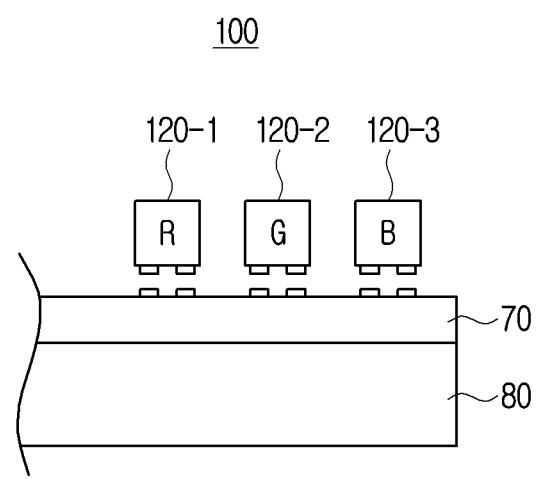
FIG. 22A is a cross-sectional view of the display panel, according to an embodiment of the present disclosure.

FIG. 22A is a cross-sectional view of the display panel 100 according to an embodiment of the present disclosure. FIG. 22A shows only one pixel included in the display panel 100 for convenience of explanation.

Referring to FIG. 22A, the display panel 100 may include a glass substrate 80, a TFT layer 70, and inorganic light-emitting elements R, G, and B denoted by 120-1, 120-2, and 120-3. Here, the above-mentioned sub-pixel circuit 110 may be implemented as a TFT, and included in the TFT layer 70 on the glass substrate 80.

Each of the inorganic light-emitting elements R, G, and B denoted by 120-1, 120-2, and 120-3 may be mounted on the TFT layer 70 to be electrically connected to the corresponding subpixel circuit 110, thereby configuring the above-mentioned subpixel.

Although not shown in the drawing, in the TFT layer 70, the subpixel circuit 110 for providing the driving current to the inorganic light-emitting elements 120-1, 120-2, and 120-3 may be provided for each of the inorganic light-emitting elements 120-1, 120-2, and 120-3, and each of the inorganic light-emitting elements 120-1, 120-2, and 120-3 may be mounted or positioned on each the TFT layer 70 to thus be electrically connected with the corresponding sub-pixel circuit 110.

Referring to FIG. 22A exemplifies that the inorganic light-emitting elements R, G, and B denoted by 120-1, 120-2, and 120-3 are flip chip type micro LEDs. However, the inorganic light-emitting elements R, G, and B denoted by 120-1, 120-2, and 120-3 are not limited thereto, and may be lateral or vertical type micro LEDs according to an embodiment.

Figure 22B:
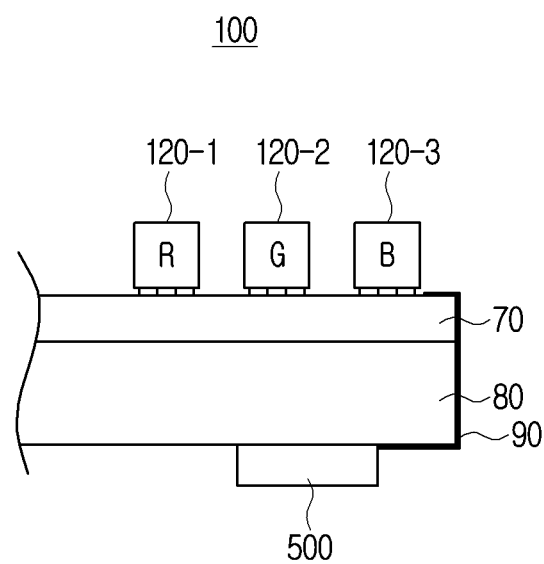
FIG. 22B is a cross-sectional view of a display panel, according to another embodiment of the present disclosure.

FIG. 22B is a cross-sectional view of the display panel 100 according to another embodiment of the present disclosure.

Referring to FIG. 22B, the display panel 100 may include the TFT layer 70 positioned on one surface of the glass substrate 80, inorganic light-emitting elements R, G and B, denoted by 120-1, 120-2, and 120-3, and mounted on the TFT layer 70, the driving unit 500, and a connection wiring 90 for electrically connecting the subpixel circuit 110 positioned in the TFT layer 70 and the driving unit 500 with each other.

As described above, according to an embodiment of the present disclosure, at least some of various drivers or circuits of the driving unit 500 may be implemented in separate chips to be positioned on a rear surface of the glass substrate 80, and connected with the subpixel circuits 110 positioned in the TFT layer 70 through the connection wiring 90.

In this regard, referring to FIG. 22B, it may be seen that the subpixel circuits 110 included in the TFT layer 70 are electrically connected with the driving unit 500 through the connection wiring 90 positioned on an edge (or side) of a TFT panel (hereinafter, the TFT layer 70 and the glass substrate 80 are collectively referred to as the TFT panel). Here, the connection wiring 90 may include at least some of the above-mentioned scan lines and data lines DL.

In this way, the subpixel circuits 110 included in the TFT layer 70 and the driving unit 500 may be connected with each other by positioning the connection wiring 90 in an edge region of the display panel 100. The reason is that a crack or the like may occur in the glass substrate 80 due to a temperature difference between a manufacturing process of TFT panels 70 and 80 and a process of filling a hole with a conductive material If the subpixel circuits 110 and the driving unit 500 are connected with each other by forming the hole passing through the glass substrate 80.

Figure 22C:
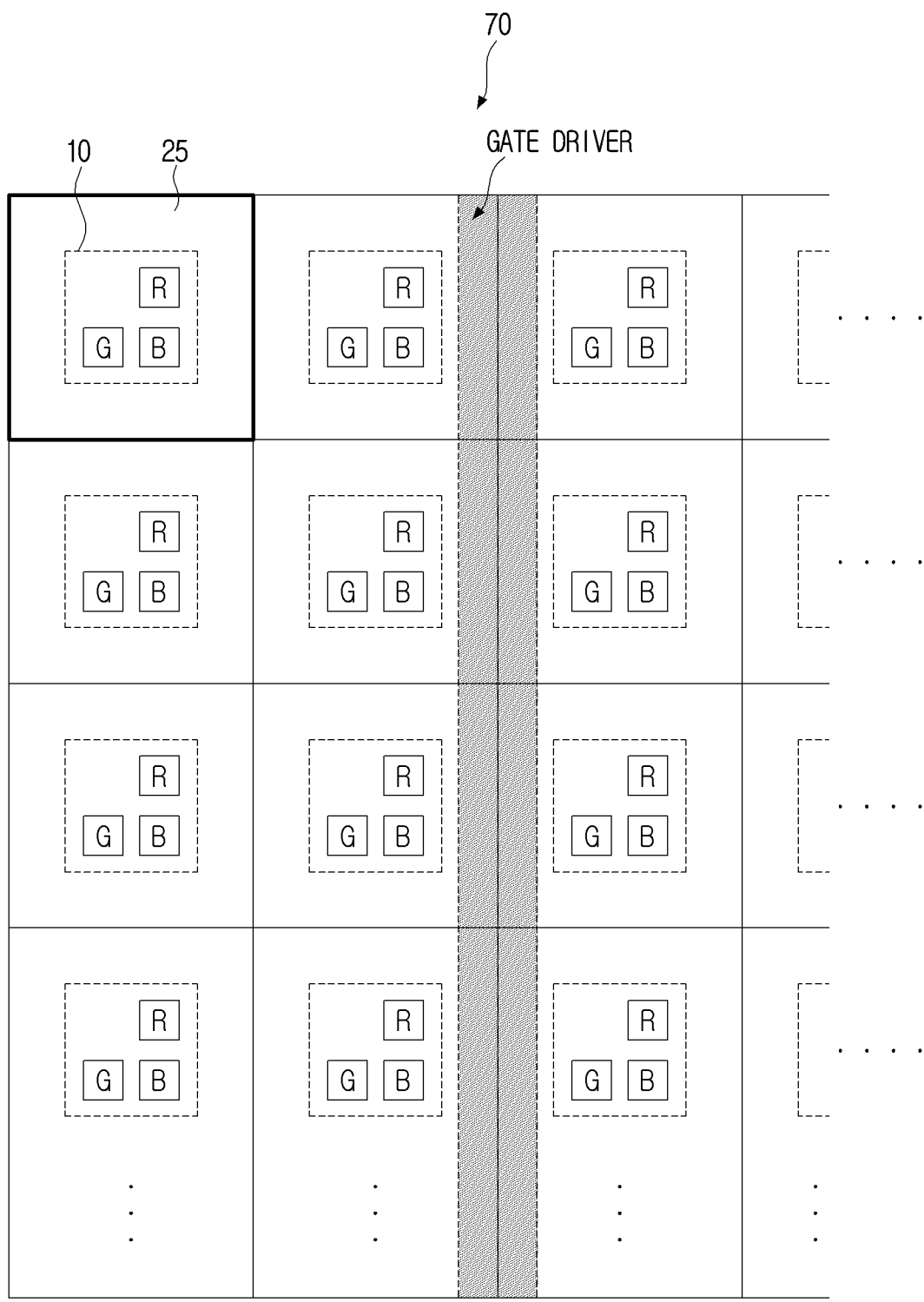
FIG. 22C is a plan view of a thin film transistor (TFT) layer, according to an embodiment of the present disclosure.

In some embodiments, at least some of the various drivers or circuits of the driving unit 500 may be positioned in the TFT layer together with the subpixel circuits positioned in the TFT layer in the display panel 100, and connected with the subpixel circuits. FIG. 22C shows this embodiment.

FIG. 22C is a plan view of the TFT layer 70 according to an embodiment of the present disclosure. Referring to FIG. 22C, the TFT layer 70 may have a rest region 25 in addition to a region occupied by one pixel 10 (and the subpixel circuit 110 corresponding to each of the R, G, and B subpixels included in the pixel 10 exists in this region).

As such, the TFT layer 70 may have the rest region 25, and some of the above-mentioned various drivers or circuits of the driving unit 500 may be positioned in the rest region 25.

FIG. 22C exemplifies that the above-mentioned gate drivers are positioned in the rest region 25 of the TFT layer 70. The above structure in which the gate driver is positioned in the TFT layer 70 may be referred to as a gate-in-panel (GIP) structure, and is not limited by this name. Alternatively or additionally, location of the gate driver positioned in the TFT layer 70 is not limited to that shown in FIG. 22C.

Referring to FIG. 22C is only an example, and a circuit which may be included in the rest region 25 of the TFT layer 70 is not limited to the gate driver. In some embodiments, the TFT layer 70 may be further provided with a DeMUX circuit for selecting each of the R, G, and B subpixels, an electro static discharge (ESD) protection circuit for protecting the subpixel circuit 110 from static electricity, etc.

The above description exemplifies that the glass substrate 80 is the substrate on which the TFT layer 70 is positioned, and the embodiments are not limited thereto. For example, the TFT layer 70 may be positioned on a synthetic resin substrate. In this case, the subpixel circuits 100 of the TFT layer 70 and the driving unit 500 may be connected with each other through a hole passing through the synthetic resin substrate.

The above description exemplifies that the subpixel circuit 110 is implemented in the TFT layer 70. However, the embodiments are not limited thereto. That is, according to another embodiment of the present disclosure, the subpixel circuit 110 may also be implemented in such a manner that a ultra-micro integrated circuit (IC)-type pixel circuit chip is implemented in a subpixel or pixel unit and mounted on a substrate without using the TFT layer 70. Here, the subpixel circuit chip may be mounted, for example, around the corresponding inorganic light-emitting element 120, and is not limited to this position.

The above description exemplifies that the gate drivers are positioned in the TFT layer 70, however, the embodiments are not limited thereto. That is, according to another embodiment of the present disclosure, the gate driver (e.g., scan driver, emission driver or sweep driver) or the gate driver circuit for each row line that configures the gate driver (e.g., scan driver circuit for each row line, emission driver circuits for each row line, or sweep driver circuits for each row line) may be implemented as a ultra-micro IC type gate driver chip or gate driver circuit chip and mounted on the TFT layer 70.

In the above-described various embodiments of the present disclosure, the TFT included in the TFT layer (or TFT panel) is not limited to a specific structure or type. That is, the TFT cited in the various embodiments of the present disclosure may be implemented as a low temperature poly silicon (LTPS) TFT, an oxide TFT, a silicon (poly silicon or a-silicon) TFT, an organic TFT, a graphene TFT, or the like, or may use only the P-type (or N-type) MOSFET manufactured in a silicon (Si) wafer complementary metal-oxide semiconductor (CMOS) process.

According to one or more embodiments of the present disclosure as described above, it may be possible to prevent the wavelength of light emitted from the inorganic light-emitting element from being changed based on its grayscale.

According to one or more embodiments of the present disclosure, it may also be possible to compensate for the spot that may appear in the image due to the deviation in the threshold voltage or mobility of the driving transistors. It may also be possible to correct the color.

According to one or more embodiments of the present disclosure, it may be possible to compensate for the spot and correct the color even when a large-area display panel is configured by combining the module-type display panels with each other or the single large-sized display panel is configured.

According to one or more embodiments of the present disclosure, it may also be possible to reduce the power consumption consumed when the display panel is driven.

According to one or more embodiments of the present disclosure, it may also be possible to compensate for the influence of the different drop in the driving voltage for each position of the display panel on the process of setting the data voltage.

According to one or more embodiments of the present disclosure, it may also be possible to design the more optimized driving circuit, and drive the inorganic light-emitting element stably and efficiently.

According to one or more embodiments of the present disclosure, it may also be possible to prevent and/or reduce the luminance non-uniformity and horizontal crosstalk problems caused by the sweep rod.

According to one or more embodiments of the present disclosure, it may also be possible to reduce the image distortion that may occur at the boundary between the upper and lower display modules when one display panel are configured by combining the plurality of display modules with each other.

Although certain embodiments of the present disclosure have been illustratively described hereinabove, it will be appreciated by those skilled in the art that various modifications and alterations may be made without departing from the essential features of the present disclosure. In addition, the scope of the present disclosure is not limited to the embodiments described hereinabove. Accordingly, the scope of the present disclosure should be interpreted by the following claims, and it should be interpreted that all the spirits equivalent to the following claims fall within the scope of the present disclosure.

What is claimed is:

1. A display apparatus comprising:
 a modular display panel comprising a plurality of display modules, each display module of the plurality of display modules comprising:
  a display panel comprising a pixel array comprising pixels arranged in a plurality of row lines, each of the pixels comprising a plurality of inorganic light-emitting elements and subpixel circuits corresponding to the plurality of inorganic light-emitting elements;

a driving unit configured to, based on control signals, drive the subpixel circuits corresponding to the plurality of inorganic light-emitting elements to successively emit light in a first order of the plurality of row lines or in a second order of the plurality of row lines opposite to the first order; and a processor communicatively configured to:
provide, to a first driving unit of a first display module of the plurality of display modules, first control signals configured to cause the plurality of inorganic light-emitting elements of the first display module to emit light in the first order, and provide, to a second driving unit of a second display module of the plurality of display modules, second control signals configured to cause the plurality of inorganic light-emitting elements of the second display module to emit light in the second order, the second display module being positioned above or below the first display module, wherein when the second display module is positioned above the first display module, the first order is an order from a last row line of the first display module to a first row line of the first display module and the second order is an order from a first row line of the second display module to a last row line of the second display module, and wherein when the second display module is positioned below the first display module, the first order is an order from the first row line of the first display module to the last row line of the first display module and the second order is an order from the last row line of the second display module to the first row line of the second display module.

2. The display apparatus of claim 1, wherein the driving unit comprises:
a scan driver configured to provide a scan signal to the subpixel circuits in a row-line order for an image data voltage to be set to the subpixel circuits in the row-line order; and an emission driver configured to provide an emission signal to the subpixel circuits in the row-line order for the plurality of inorganic light-emitting elements of the pixels to emit light in the row-line order based on the image data voltage set based on the scan signal.

3. The display apparatus of claim 2, wherein the first control signals are provided from the processor to the first driving unit of the first display module through a first wiring, and wherein the second control signals are provided from the processor to the second driving unit of the second display module through a second wiring that is separate from the first wiring.

4. The display apparatus of claim 3, wherein the scan driver comprises a plurality of scan driver circuits having a same circuit structure, and wherein each of the plurality of scan driver circuits is provided for each row line, and is configured to output the scan signal to the subpixel circuits corresponding to each row line.

5. The display apparatus of claim 4, wherein a first scan driver circuit corresponding to one row line of the plurality of scan driver circuits comprises:
a first scan signal input terminal configured to receive a first scan signal output from a second scan driver circuit corresponding to a previous row line of the one row line; and a second scan signal input terminal configured to receive a second scan signal output from a third scan driver circuit corresponding to a next row line of the one row line, and wherein the first scan driver circuit is further configured to output the scan signal to the subpixel circuits corresponding to the one row line based on the first scan signal received through the first scan signal input terminal and the second scan signal received through the second scan signal input terminal.

6. The display apparatus of claim 5, wherein the plurality of scan driver circuits of the first display module is configured to successively provide the scan signal to the subpixel circuits from the first row line to the last row line of the first display module based on the first scan signal input through the first scan signal input terminal selected based on selection signals included in the first control signals, and wherein the plurality of scan driver circuits of the second display module is configured to successively provide the scan signal to the subpixel circuits from the last row line to the first row line of the second display module based on the second scan signal input through the second scan signal input terminal selected based on selection signals included in the second control signals.

7. The display apparatus of claim 5, wherein each of the plurality of scan driver circuits comprises:
a first clock input terminal configured to receive a first clock signal;

a second clock input terminal configured to receive a second clock signal having a second phase that is opposite to a first phase of the first clock signal; and a first selection signal input terminal and a second selection signal input terminal configured to receive selection signals for selecting one scan signal input terminal from the first scan signal input terminal and the second scan signal input terminal, respectively.

8. The display apparatus of claim 7, wherein the first control signals comprise a third clock signal, a fourth clock signal having a fourth phase that is opposite to a third phase of the third clock signal, a first selection signal having a first level, and a second selection signal having a second level that is different from the first level, wherein the second control signals comprise a fifth clock signal having a fifth phase that is opposite to the first phase of the first clock signal, a sixth clock signal having a sixth phase that is opposite to the third phase of the third clock signal, a third selection signal having the second level, and a fourth selection signal having the first level, wherein the third clock signal, the fourth clock signal, the first selection signal, and the second selection signal are respectively input to the first clock input terminal, the second clock input terminal, the first selection signal input terminal, and the second selection signal input terminal of a scan driver circuit for one row line among the plurality of row lines of the first display module, and wherein the fifth clock signal, the sixth clock signal, the third selection signal, and the fourth selection signal are respectively input to the first clock input terminal, the second clock input terminal, the first selection signal input terminal, and the second selection signal input terminal of a scan driver circuit for a row line corresponding to the one row line among the plurality of row lines of the second display module.

9. The display apparatus of claim 3, wherein the emission driver comprises a plurality of emission driver circuits having a same circuit structure, and each of the plurality of emission driver circuits is provided for each row line, and is configured to output the emission signal to the subpixel circuits corresponding to each row line.

10. The display apparatus of claim 9, wherein the emission driver is a first type emission driver, wherein a first emission driver circuit corresponding to one row line among the plurality of emission driver circuits of the first type emission driver comprises:

a first emission signal input terminal configured to receive a first emission signal output from a second emission driver circuit corresponding to a previous row line of the one row line; and a second emission signal input terminal configured to receive a second emission signal output from a third emission driver circuit corresponding to a next row line of the one row line, and wherein the first type emission driver is configured to output the emission signal to the subpixel circuits corresponding to the one row line based on a selected emission signal input through a selected emission signal input terminal selected from the first emission signal input terminal and the second emission signal input terminal.

11. The display apparatus of claim 10, wherein the plurality of emission driver circuits of the first display module is configured to successively provide the selected emission signal to the subpixel circuits for the first row line to the last row line of the first display module based on the first emission signal input through the first emission signal input terminal selected based on selection signals comprised in the first control signals, and wherein the plurality of emission driver circuits of the second display module is configured to successively provide the selected emission signal to the subpixel circuits for the last row line to the first row line of the second display module based on the second emission signal input through the second emission signal input terminal selected based on selection signals included in the second control signals.

12. The display apparatus of claim 10, wherein each of the plurality of emission driver circuits comprised in the first type emission driver comprises:

a first clock input terminal configured to receive clock signals;

a second clock input terminal configured to receive other clock signals having phases opposite to phases of the clock signals; and a first selection signal input terminal and a second selection signal input terminal configured to receive selection signals for selecting one emission signal input terminal from the first emission signal input terminal and the second emission signal input terminal, respectively.

13. The display apparatus of claim 12, wherein the first control signals comprise a first clock signal, a second clock signal having a phase opposite to a phase of the first clock signal, a first selection signal of a first level, and a second selection signal of a second level different from the first level, wherein the second control signals comprise a third clock signal having a phase opposite to the phase of the first clock signal, a fourth clock signal having a phase opposite to a phase of the third clock signal, a third selection signal of the second level, and a fourth selection signal of the first level, wherein the first clock signal, the second clock signal, the first selection signal, and the second selection signal are respectively input to the first clock input terminal, the second clock input terminal, the first selection signal input terminal, and the second selection signal input terminal for one row line among the plurality of row lines of the first display module, and wherein the third clock signal, the fourth clock signal, the third selection signal, and the fourth selection signal are respectively input to the first clock input terminal, the second clock input terminal, the first selection signal input terminal, and the second selection signal input terminal for a row line corresponding to the one row line among the plurality of row lines of the second display module.

14. The display apparatus of claim 9, wherein the emission driver is a second type emission driver configured to output the emission signal based on a carry signal and an input signal, wherein a first emission driver circuit corresponding to one row line among the plurality of emission driver circuits of the second type emission driver comprises:

a first carry signal input terminal configured to receive a first carry signal output from a second emission driver circuit corresponding to a previous row line of the one row line; and a second carry signal input terminal configured to receive a second carry signal output from a third emission driver circuit corresponding to a next row line of the one row line, and wherein the first emission driver circuit is configured to:

output a third carry signal corresponding to the one row line based on the carry signal input through one carry signal input terminal selected from the first and second carry signal input terminals, and select and output the emission signal to be provided to the subpixel circuits corresponding to the one row line from the input signal input to the first emission driver circuit based on the third carry signal.

15. The display apparatus of claim 14, wherein input signals input to the plurality of emission driver circuits are same signals having different phases.

16. A display apparatus comprising:

a modular display panel comprising a plurality of display modules, wherein each of the plurality of display modules comprises:

a display panel comprising a pixel array comprising pixels arranged in a plurality of row lines, each of the pixels comprising a plurality of inorganic light-emitting elements and subpixel circuits corresponding the plurality of inorganic light-emitting elements, and a driving unit configured to drive, based on control signals, the subpixel circuits corresponding to the plurality of inorganic light-emitting elements to successively emit light in a first order of the plurality of row lines or in a second order of the plurality of row lines opposite to the first order, wherein the driving unit comprises:

a scan driver configured to provide a scan signal to the subpixel circuits in a row-line order for an image data voltage to be set to the subpixel circuits in the row-line order; and an emission driver configured to provide an emission signal to the subpixel circuits in the row-line order for the plurality of inorganic light-emitting elements of the pixel array to emit light in the row-line order based on the image data voltage set based on the scan signal; and a processor configured to:
provide, to a first driving unit of a first display module of the plurality of display modules, first control signals configured to cause the plurality of inorganic light-emitting elements of the first display module to emit light in the first order; and provide, to a second driving unit of a second display module of the plurality of display modules, second control signals configured to cause the plurality of inorganic light-emitting elements of the second display module to emit light in the second order, the second display module being adjacent to the first display module, wherein when the second display module is positioned above the first display module, the first order is an order from a last row line of the first display module to a first row line of the first display module and the second order is an order from a first row line of the second display module to a last row line of the second display module, and wherein when the second display module is positioned below the first display module, the first order is an order from the first row line of the first display module to the last row line of the first display module and the second order is an order from the last row line of the second display module to the first row line of the second display module.

17. The display apparatus of claim 16, wherein the first control signals are provided from the processor to the first driving unit of the first display module through a first wiring, wherein the second control signals are provided from the processor to the second driving unit of the second display module through a second wiring, and wherein the second wiring is separate from the first wiring.

18. A display apparatus comprising:
a modular display panel comprising a plurality of display modules, wherein each of the plurality of display modules comprises:
a display panel comprising a pixel array comprising pixels arranged in a plurality of row lines, each pixel of the pixel array comprising a plurality of inorganic light-emitting elements and subpixel circuits corresponding to the plurality of inorganic light-emitting elements, and a driving unit configured to drive, based on control signals, the subpixel circuits corresponding to the plurality of inorganic light-emitting elements to successively emit light in a first order of the plurality of row lines or in a second order of the plurality of row lines opposite to the first order, wherein the driving unit comprises:
a scan driver configured to provide a scan signal to the subpixel circuits in a row-line order for an image data voltage to be set to the subpixel circuits in the row-line order; and an emission driver configured to provide an emission signal to the subpixel circuits in the row-line order for the plurality of inorganic light-emitting elements of the pixel array to emit light in the row-line order based on the image data voltage set based on the scan signal; and a processor configured to:
provide, to a first driving unit of a first display module of the plurality of display modules, with first control signals configured to cause the plurality of inorganic light-emitting elements of the first display module to emit light in the first order; and provide, to a second driving unit of a second display module of the plurality of display modules, with second control signals configured to cause the plurality of inorganic light-emitting elements of the second display module to emit light in the second order, the second display module being adjacent to the first display module, wherein the first control signals are provided from the processor to the first driving unit of the first display module through a first wiring, wherein the second control signals are provided from the processor to the second driving unit of the second display module through a second wiring, wherein the second wiring is separate from the first wiring, wherein when the second display module is positioned above the first display module, the first order is an order from a last row line of the first display module to a first row line of the first display module and the second order is an order from a first row line of the second display module to a last row line of the second display module, and wherein when the second display module is positioned below the first display module, the first order is an order from the first row line of the first display module to the last row line of the first display module and the second order is an order from the last row line of the second display module to the first row line of the second display module.

19. The display apparatus of claim 18, wherein the scan driver comprises a plurality of scan driver circuits having a same circuit structure, and wherein each of the plurality of scan driver circuits is provided for each row line, and is configured to output the scan signal to the subpixel circuits corresponding to each row line.

20. The display apparatus of claim 18, wherein the emission driver comprises a plurality of emission driver circuits having a same circuit structure, and each of the plurality of emission driver circuits is provided for each row line, and is configured to output the emission signal to the subpixel circuits corresponding to each row line.

* * * * *

UNITED STATES PATENT AND TRADEMARK OFFICE
CERTIFICATE OF CORRECTION

| | |
|---|---|
| PATENT NO. | : 12,046,185 B2 |
| APPLICATION NO. | : 18/120267 |
| DATED | : July 23, 2024 |
| INVENTOR(S) | : Jinho Kim et al. |

Page 1 of 1

It is certified that error appears in the above-identified patent and that said Letters Patent is hereby corrected as shown below:

On the Title Page

Item (73), correct the name of the assignees as follows:
(73) Assignees: SAMSUNG ELECTRONICS CO., LTD., Suwon-si (KR); RESEARCH & BUSINESS FOUNDATION SUNGKYUNKWAN UNIVERSITY, Suwon-si (KR)

Signed and Sealed this
Twenty-fourth Day of September, 2024

Katherine Kelly Vidal
*Director of the United States Patent and Trademark Office*